United States Patent
Quilici

(10) Patent No.: US 10,522,279 B2
(45) Date of Patent: Dec. 31, 2019

(54) EMBEDDED HIGH VOLTAGE TRANSFORMER COMPONENTS AND METHODS

(71) Applicant: Radial Electronics, Inc., El Dorado Hills, CA (US)

(72) Inventor: James E. Quilici, El Dorado Hills, CA (US)

(73) Assignee: RADIAL ELECTRONICS, INC., El Dorado Hills, CA (US)

( * ) Notice: Subject to any disclaimer, the term of this patent is extended or adjusted under 35 U.S.C. 154(b) by 0 days.

(21) Appl. No.: 16/503,570

(22) Filed: Jul. 4, 2019

(65) Prior Publication Data

US 2019/0333674 A1    Oct. 31, 2019

Related U.S. Application Data

(60) Continuation-in-part of application No. 16/102,039, filed on Aug. 13, 2018, now Pat. No. 10,347,409, (Continued)

(51) Int. Cl.
  *H01F 5/00*     (2006.01)
  *H01F 17/00*    (2006.01)
  (Continued)

(52) U.S. Cl.
  CPC ........... *H01F 17/0033* (2013.01); *H01F 5/00* (2013.01); *H01F 17/062* (2013.01); *H01F 27/24* (2013.01);
  (Continued)

(58) Field of Classification Search
  CPC ............................ H01F 5/00; H01F 27/00–36
  (Continued)

(56) References Cited

U.S. PATENT DOCUMENTS 3,638,156 A    1/1972  West
5,372,967 A    12/1994 Sundaram et al.
(Continued)

FOREIGN PATENT DOCUMENTS

EP    1122750      8/2001
EP    06815217.2   9/2006
(Continued)

OTHER PUBLICATIONS

PCT/US2009/052512, WO2011014200, publ. Mar. 2, 2011, International Search Report.
(Continued)

*Primary Examiner* — Tuyen T Nguyen
(74) *Attorney, Agent, or Firm* — Jim H. Salter; Inventive Law Inc.

(57) ABSTRACT

Disclosed are apparatus and methods for embedded high voltage transformer components. Industrial applications require transformers that provide high voltage isolation. The laminate materials used for fabricating Printed Circuit Boards (PCB) are very good insulators and PCB transformers can provide higher voltage isolation than traditional wire wound devices. There are a variety of PCB laminate materials with different properties for voltage breakdown. FR-4 laminate is commonly used and has voltage breakdown properties exceeding 10 kV/mm. To produce PCB transformers with breakdown voltages exceeding 5 kV, it is beneficial to use laminate with much higher breakdown voltages. Generally, the materials with high breakdown voltage cost more. High voltage isolation can be achieved at a moderate cost by mixing low cost FR-4 laminate with high voltage dielectric materials.

17 Claims, 50 Drawing Sheets

Related U.S. Application Data which is a continuation of application No. 14/963,619, filed on Dec. 9, 2015, now Pat. No. 10,049,803, which is a continuation-in-part of application No. 12/329,887, filed on Dec. 8, 2008, now Pat. No. 9,355,769, which is a division of application No. 11/233,824, filed on Sep. 22, 2005, now Pat. No. 7,477,128, said application No. 14/963,619 is a continuation-in-part of application No. 14/891,645, filed as application No. PCT/US2009/052512 on Jul. 31, 2009, now Pat. No. 9,754,714, application No. 16/503,570, which is a continuation-in-part of application No. 16/016,576, filed on Jun. 23, 2018, which is a division of application No. 15/168,185, filed on May 30, 2016, now Pat. No. 10,431,367, which is a continuation-in-part of application No. 12/329,887, filed on Dec. 8, 2008, now Pat. No. 9,355,769, which is a division of application No. 11/233,824, filed on Sep. 22, 2005, now Pat. No. 7,477,128.

(51) Int. Cl.

| | | |
|---|---|---|
| *H01F 17/06* | (2006.01) | |
| *H01F 27/28* | (2006.01) | |
| *H01F 27/24* | (2006.01) | |
| *H01F 41/064* | (2016.01) | |
| *H01F 41/04* | (2006.01) | |
| *H01F 41/02* | (2006.01) | |
| *H05K 3/46* | (2006.01) | |
| *H05K 3/04* | (2006.01) | |
| *H05K 1/02* | (2006.01) | |
| *H05K 1/16* | (2006.01) | |
| *H05K 3/00* | (2006.01) | |
| *H01F 27/02* | (2006.01) | |

(52) U.S. Cl.
CPC ..... *H01F 27/2804* (2013.01); *H01F 27/2895* (2013.01); *H01F 41/02* (2013.01); *H01F 41/0206* (2013.01); *H01F 41/041* (2013.01); *H01F 41/042* (2013.01); *H01F 41/064* (2016.01); *H05K 1/0284* (2013.01); *H05K 1/165* (2013.01); *H05K 3/045* (2013.01); *H05K 3/4611* (2013.01); *H01F 27/027* (2013.01); *H01F 2027/2809* (2013.01); *H01F 2027/2814* (2013.01); *H05K 3/0014* (2013.01); *H05K 2201/086* (2013.01); *H05K 2201/09036* (2013.01); *H05K 2201/09045* (2013.01); *H05K 2201/09118* (2013.01); *Y10T 29/4902* (2015.01); *Y10T 29/49073* (2015.01); *Y10T 29/49075* (2015.01); *Y10T 156/10* (2015.01)

(58) Field of Classification Search
USPC .............................. 336/65, 83, 200, 232–234
See application file for complete search history.

(56) References Cited

U.S. PATENT DOCUMENTS

| | | |
|---|---|---|
| 5,787,569 A | 8/1998 | Lotfi et al. |
| 5,942,963 A | 8/1999 | Reznik et al. |
| 5,959,846 A | 9/1999 | Noguchi et al. |
| 6,148,500 A | 11/2000 | Krone et al. |
| 6,181,130 B1 | 1/2001 | Norimitsu |
| 6,362,714 B1 | 3/2002 | Rice |
| 6,417,754 B1 | 7/2002 | Bernhardt |
| 6,535,085 B2 | 3/2003 | Song et al. |
| 6,686,824 B1 | 2/2004 | Yamamoto |
| 6,768,409 B2 | 7/2004 | Inoue et al. |
| 6,940,385 B2 | 9/2005 | Kusano |
| 6,990,729 B2 | 1/2006 | Pleskach et al. |
| 7,196,607 B2 | 3/2007 | Pleskach et al. |
| 7,477,128 B2 | 1/2009 | Quilici |
| 8,591,262 B2 | 11/2013 | Schaffer |
| 8,860,543 B2 | 10/2014 | Schaffer |
| 9,355,769 B2 | 5/2016 | Quilici |
| 9,754,712 B2 | 9/2017 | Quilici |
| 9,754,714 B2 | 9/2017 | Quilici |
| 10,049,803 B2 | 8/2018 | Quilici |
| 10,347,409 B2 | 7/2019 | Quilici |
| 2002/0057173 A1 | 5/2002 | Johnson |
| 2003/0011041 A1 | 1/2003 | Acosta |
| 2003/0011458 A1 | 1/2003 | Nuytkens |
| 2004/0113738 A1 | 6/2004 | Ahn et al. |
| 2004/0135662 A1 | 7/2004 | Harding |
| 2004/0150502 A1 | 8/2004 | Jacobson |
| 2005/0122199 A1 | 6/2005 | Ahn et al. |
| 2006/0152322 A1 | 7/2006 | Whittaker |
| 2007/0063807 A1 | 3/2007 | Quilici |
| 2009/0077791 A1 | 3/2009 | Quilici |
| 2016/0086709 A1 | 3/2016 | Quilici |
| 2016/0093431 A1 | 3/2016 | Quilici |
| 2016/0111199 A1 | 4/2016 | Quilici |
| 2016/0276086 A1 | 9/2016 | Quilici |
| 2018/0366250 A1 | 12/2018 | Quilici |

FOREIGN PATENT DOCUMENTS

| | | |
|---|---|---|
| GB | 2271880 | 4/1994 |
| JP | 01287911 A | 11/1989 |
| WO | WO2007038309 A3 | 5/2007 |
| WO | WO 2011014200 A1 | 3/2011 |

OTHER PUBLICATIONS

PCT/US2009/052512, WO2011014200, publ. Mar. 2, 2011, International Preliminary Report on Patentability.
PCT/US2009/052512, WO2011014200, publ. Mar. 2, 2011, International Written Opinion.
PCT/US2006/037049, WO2007038309, publ. May 4, 2007, International Search Report.
PCT/US2006/037049, WO2007038309, publ. May 4, 2007, International Preliminary Report on Patentability.
PCT/US2006/037049, WO2007038309, publ. May 4, 2007, International Written Opinion.
European Supplemental Search Report, Appl. No. 06815217.2, filed Sep. 22, 2006, priority document PCT/US2006/037049, Report dated Oct. 4, 2015.

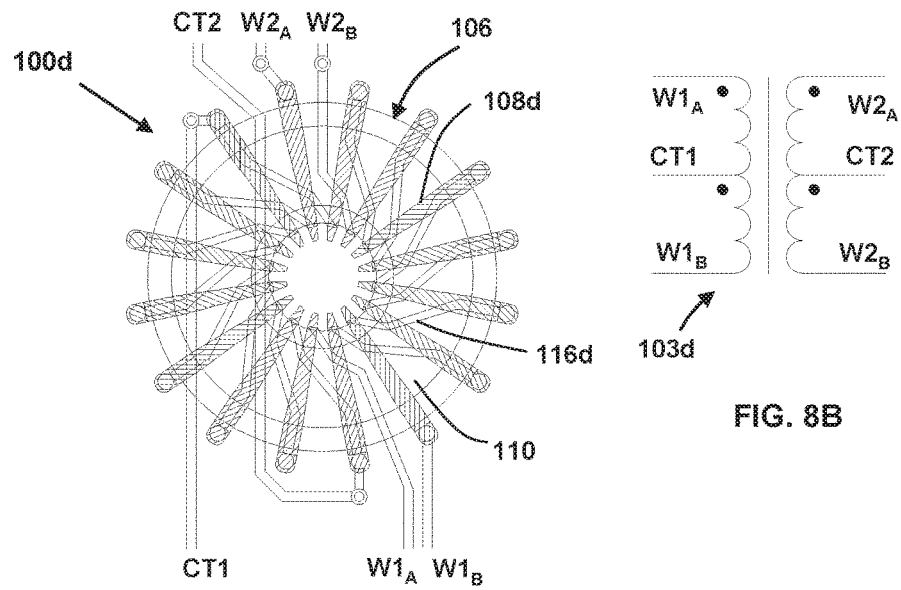
FIG. 8A
FIG. 8B
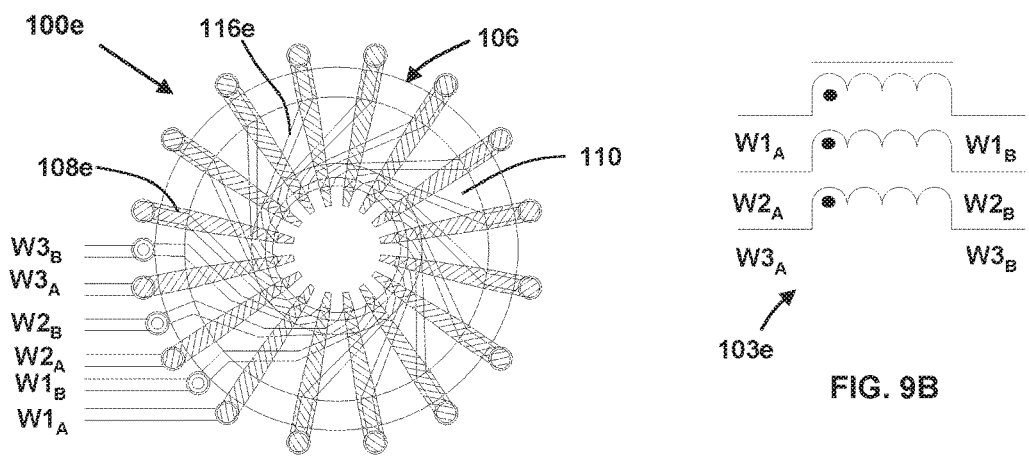
FIG. 9A
FIG. 9B
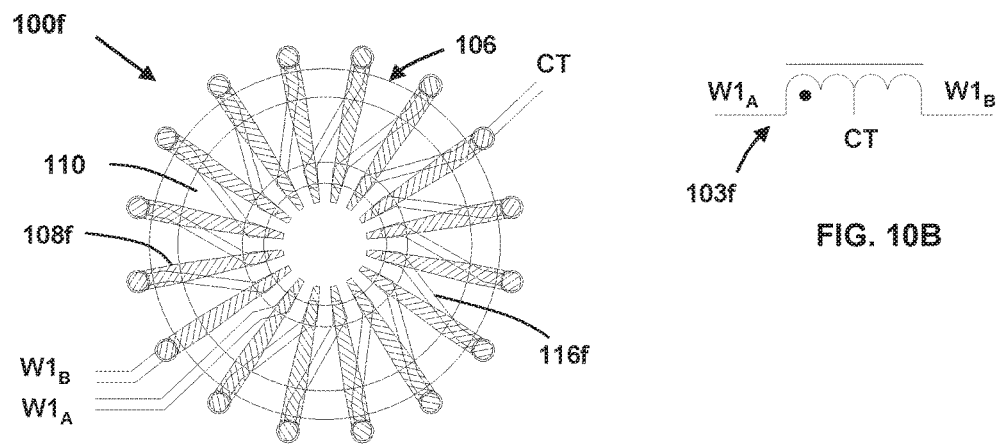
FIG. 10A
FIG. 10B

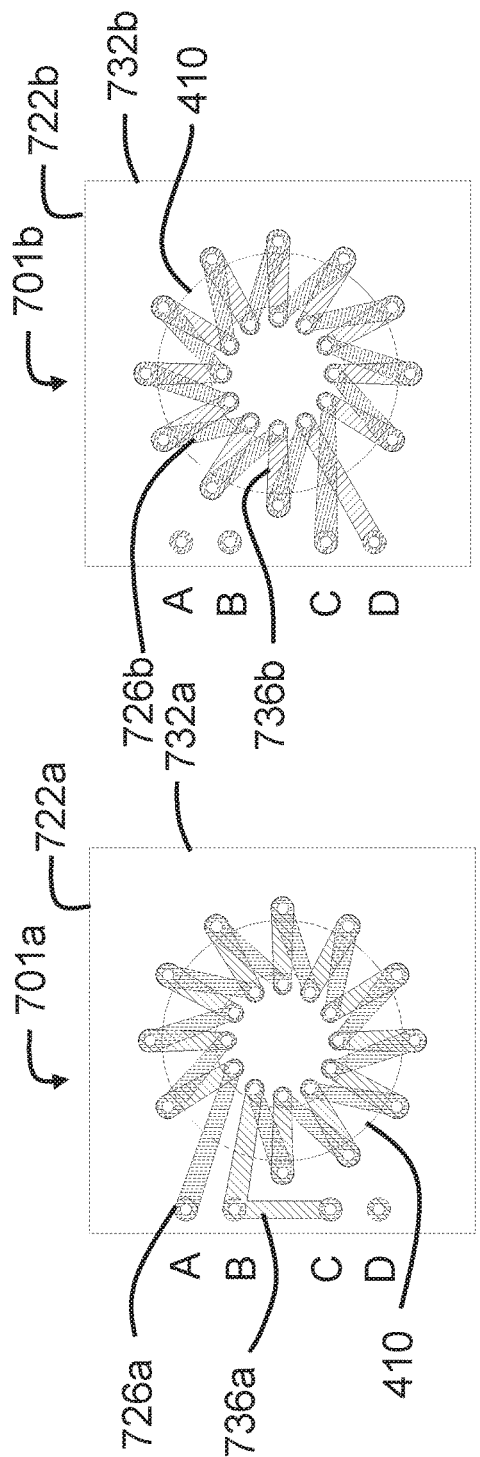
Fig. 33A
Fig. 33B
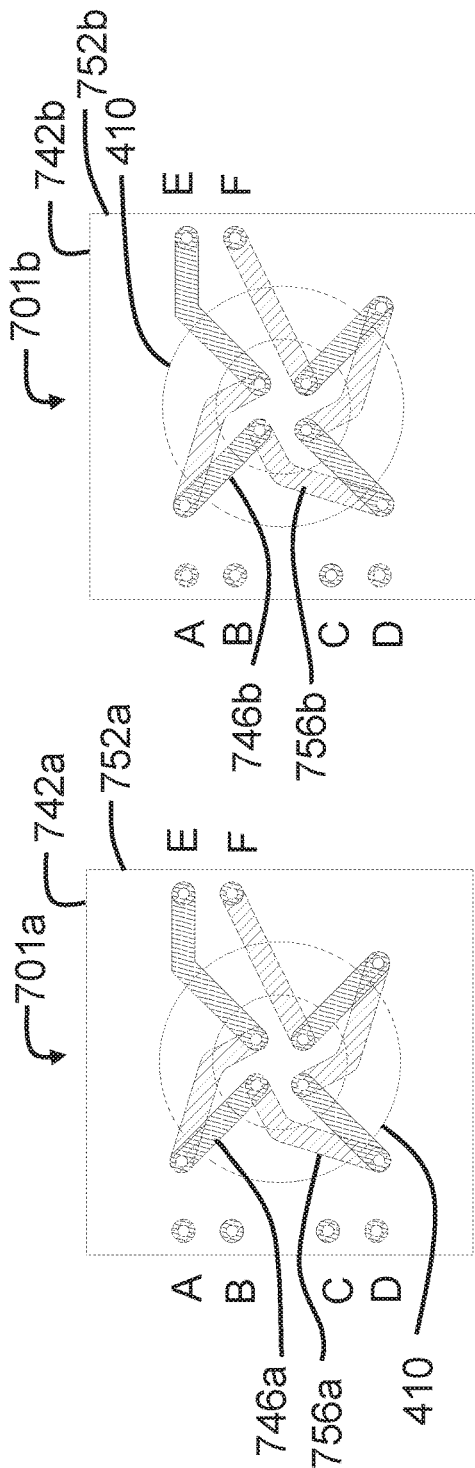
Fig. 33C
Fig. 33D

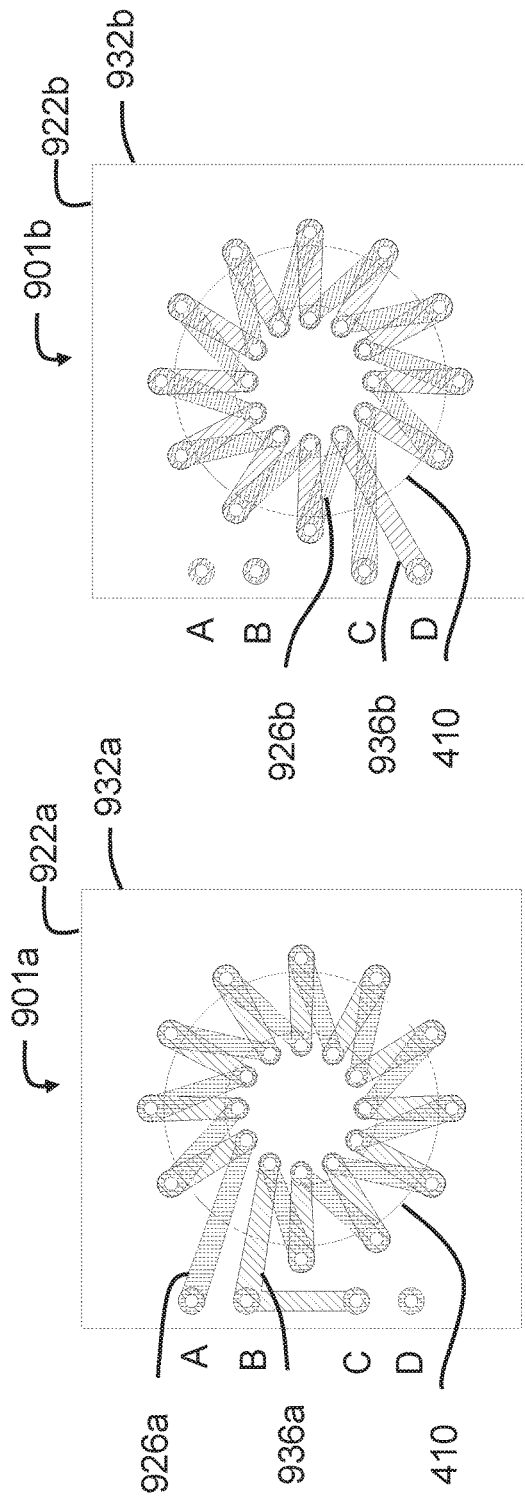
Fig. 37A
Fig. 37B
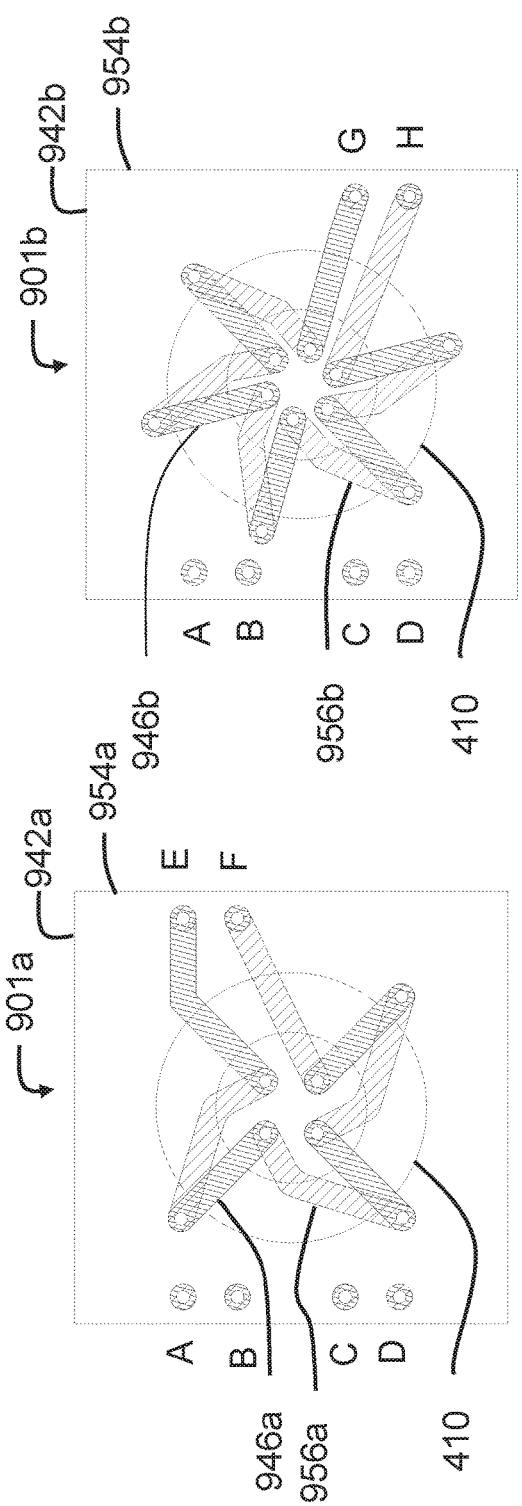
Fig. 37C
Fig. 37D

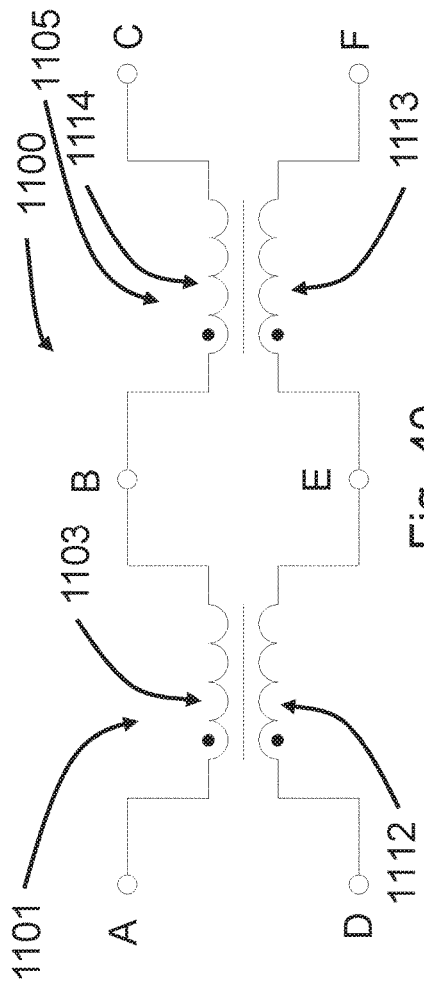
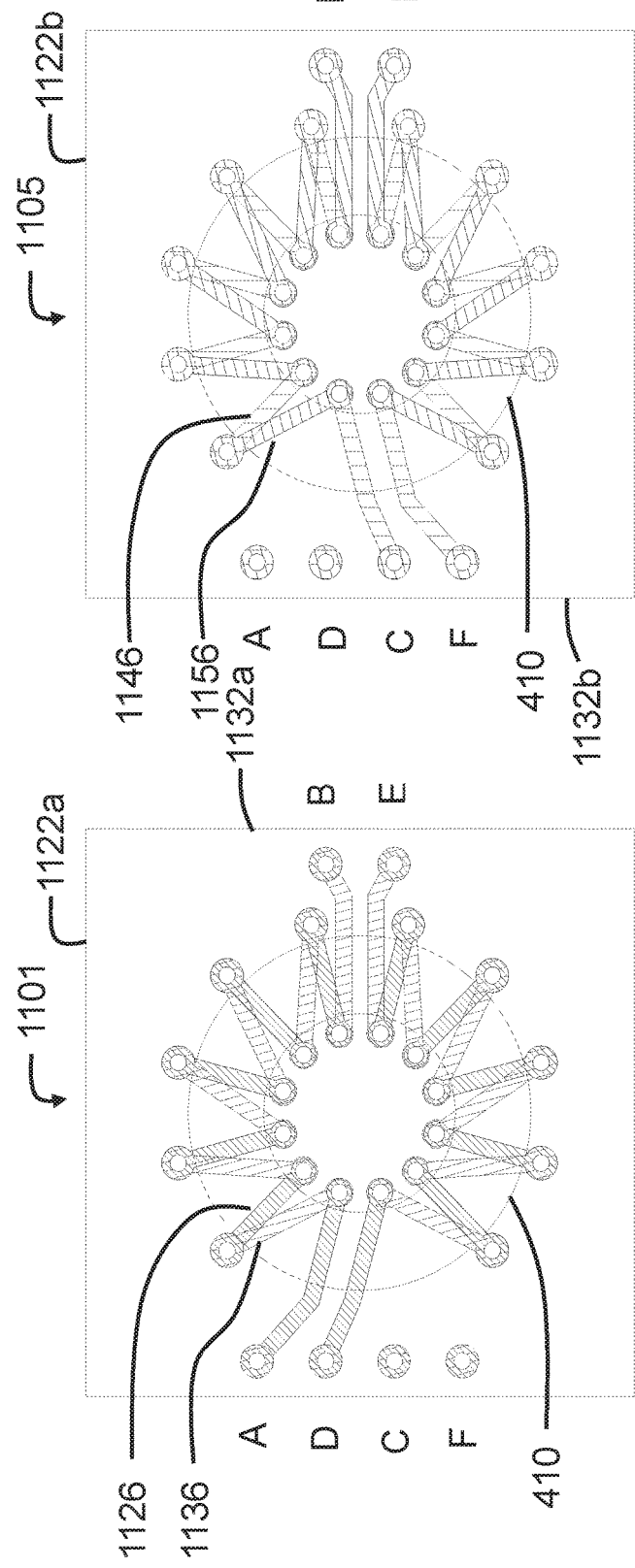
Fig. 40
Fig. 41A
Fig. 41B

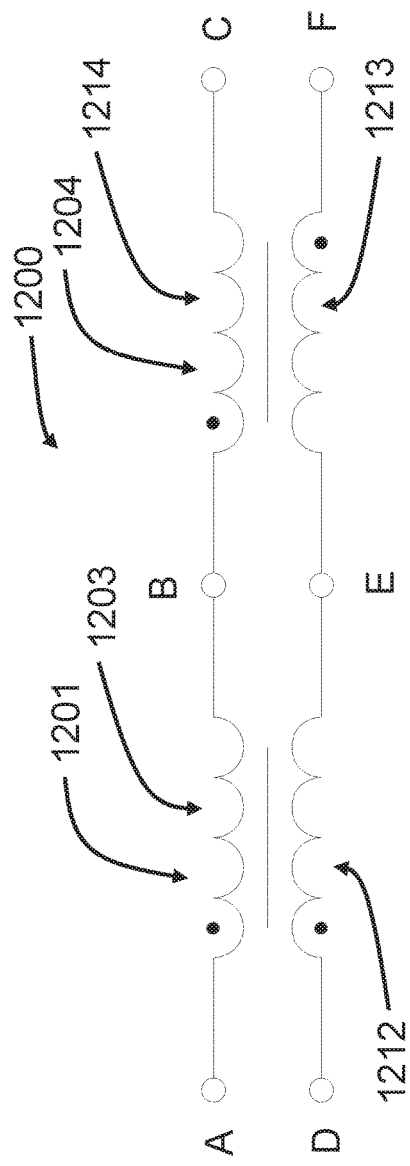
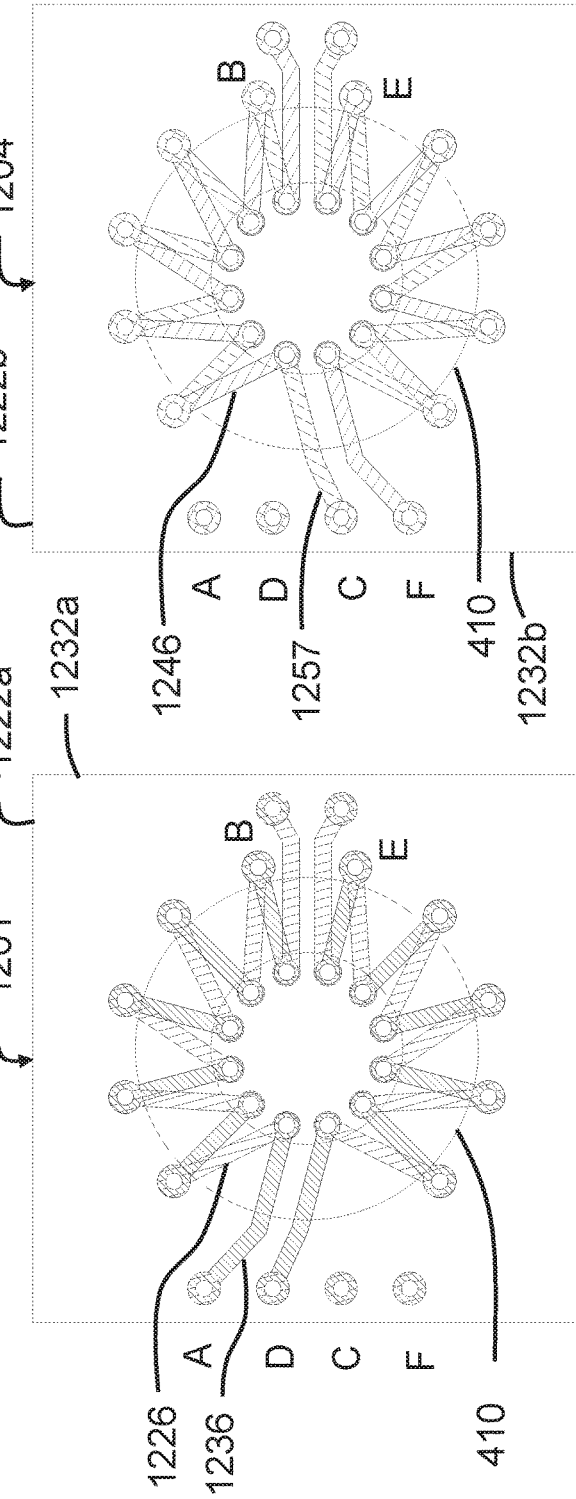
Fig. 42
Fig. 43A
Fig. 43B

Transformer Schematic

EM Transformer, Bifilar Wound

EM Transformer, Sector Wound

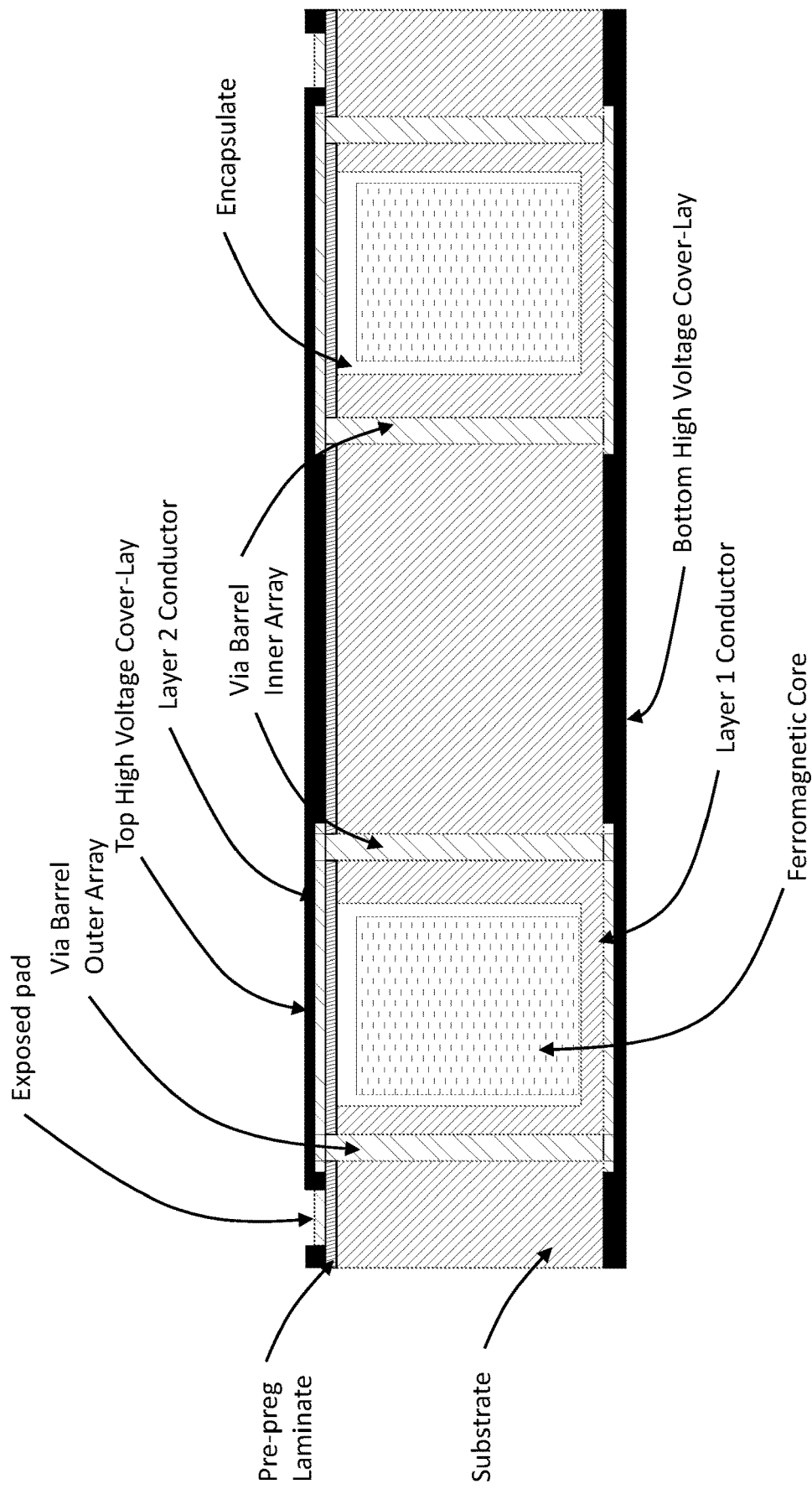
Figure 49, Cross Section View of 2 Layer Embedded EM Transformer

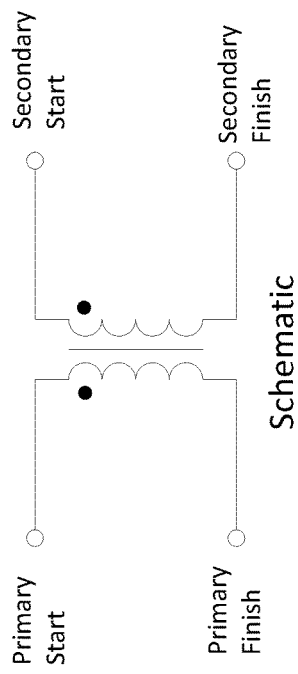
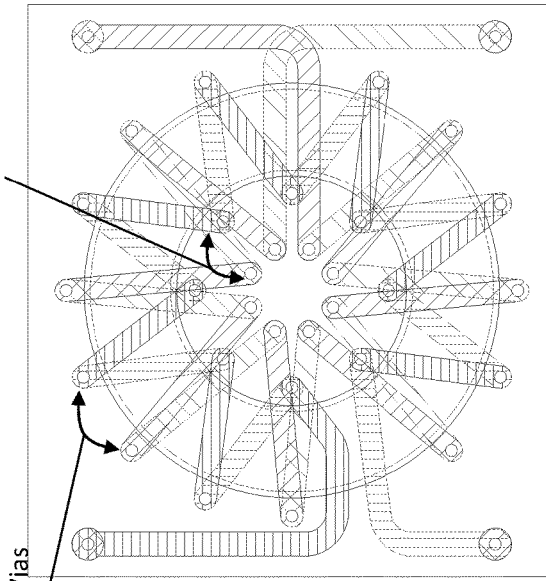
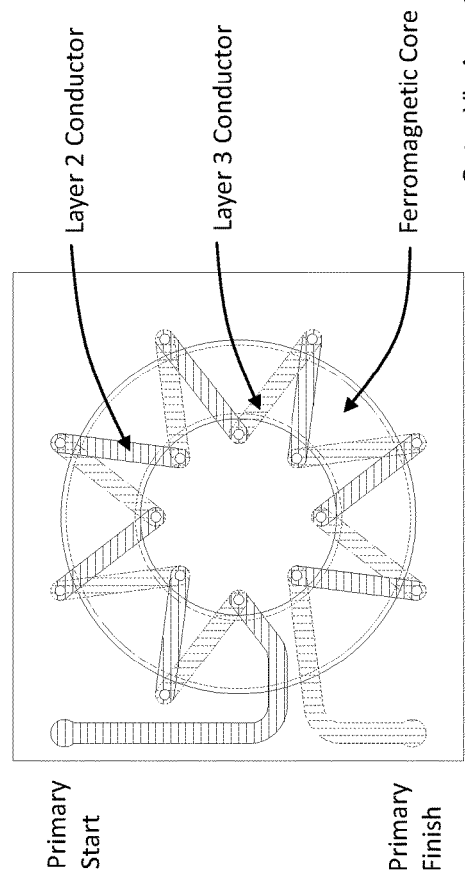
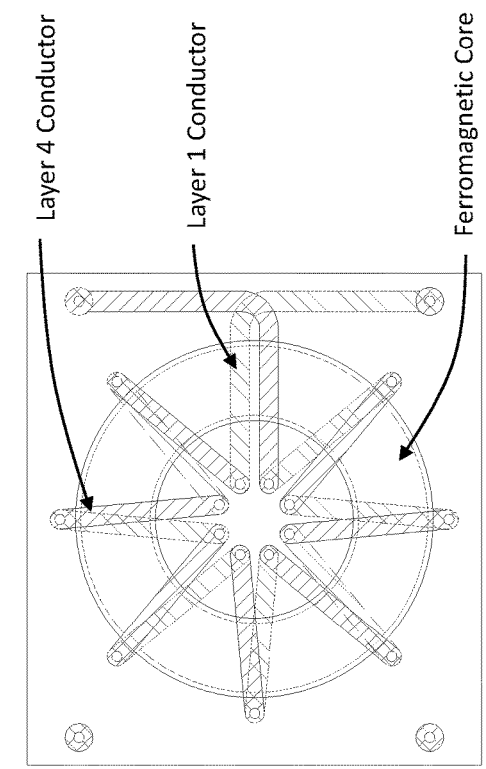
Schematic
Figure 50a
4 Layer EM Transformer
Figure 50d
4 Layer Transformer, Layers 2&3
Figure 50b
4 Layer Transformer, Layers 1&4
Figure 50c

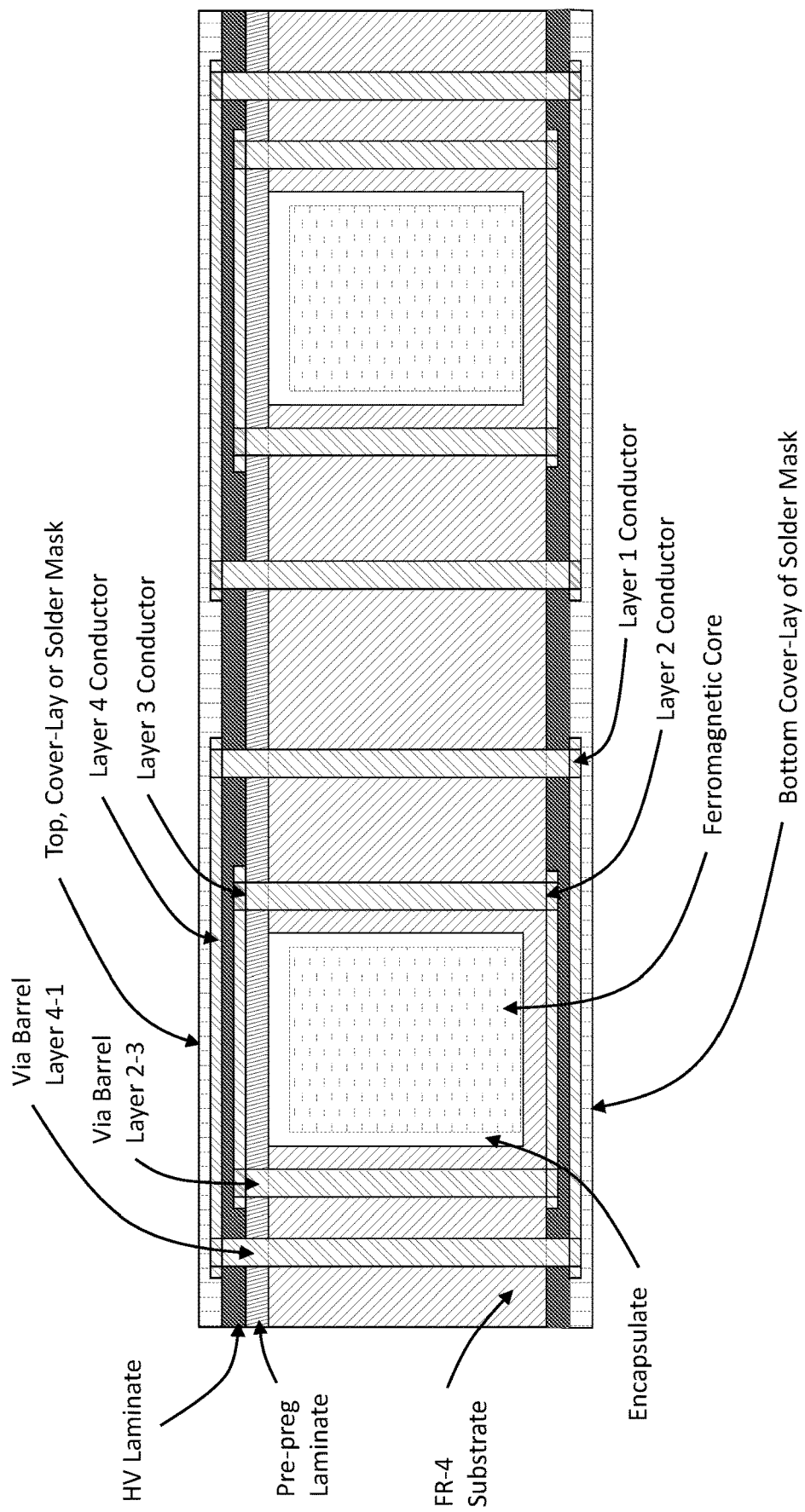
Figure 51, Cross Section View of 4 Layer Embedded EM Transformer

Schematic

Square Binocular Core, Bifilar Wound

Square Binocular Core, Sector Wound

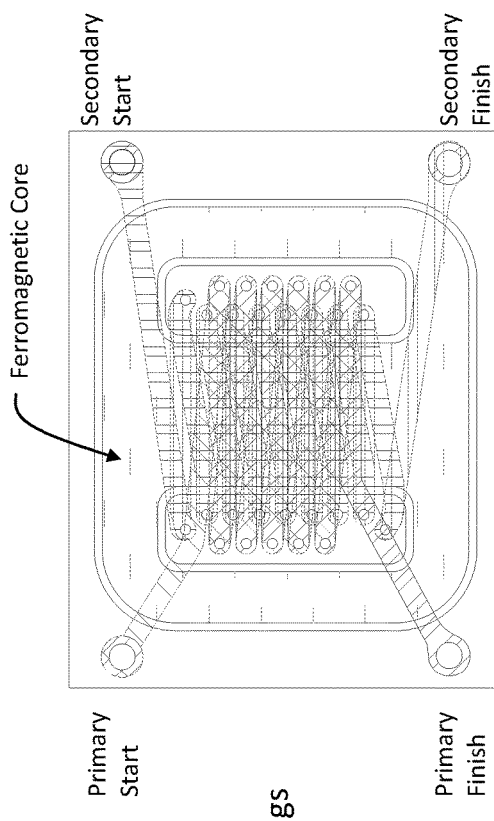
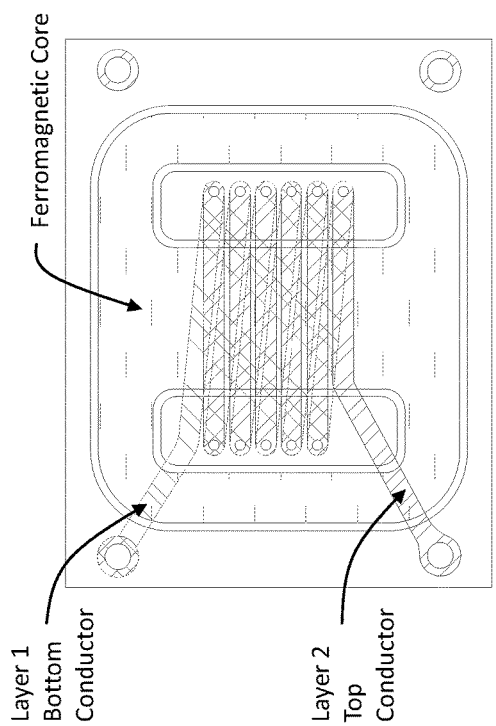
Figure 53a Square Binocular Core, Primary Windings Conductor Layers 1 & 4
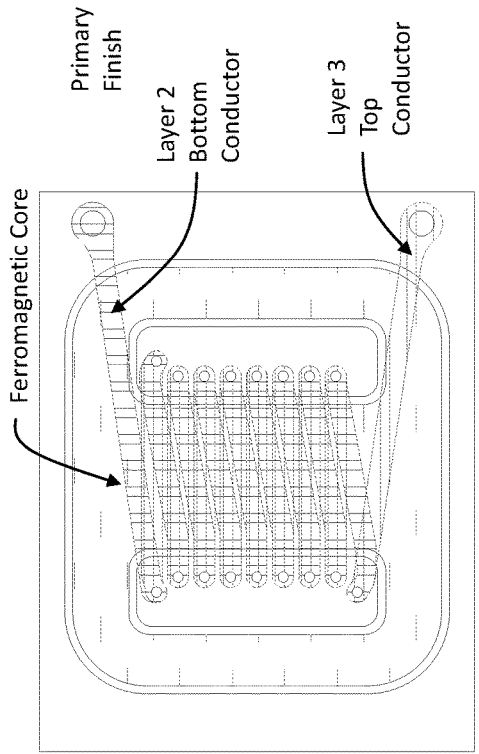
Figure 53b Square Binocular Core, Secondary Windings Conductor Layers 2 & 3
Figure 53c Square Binocular Core, 4 layer

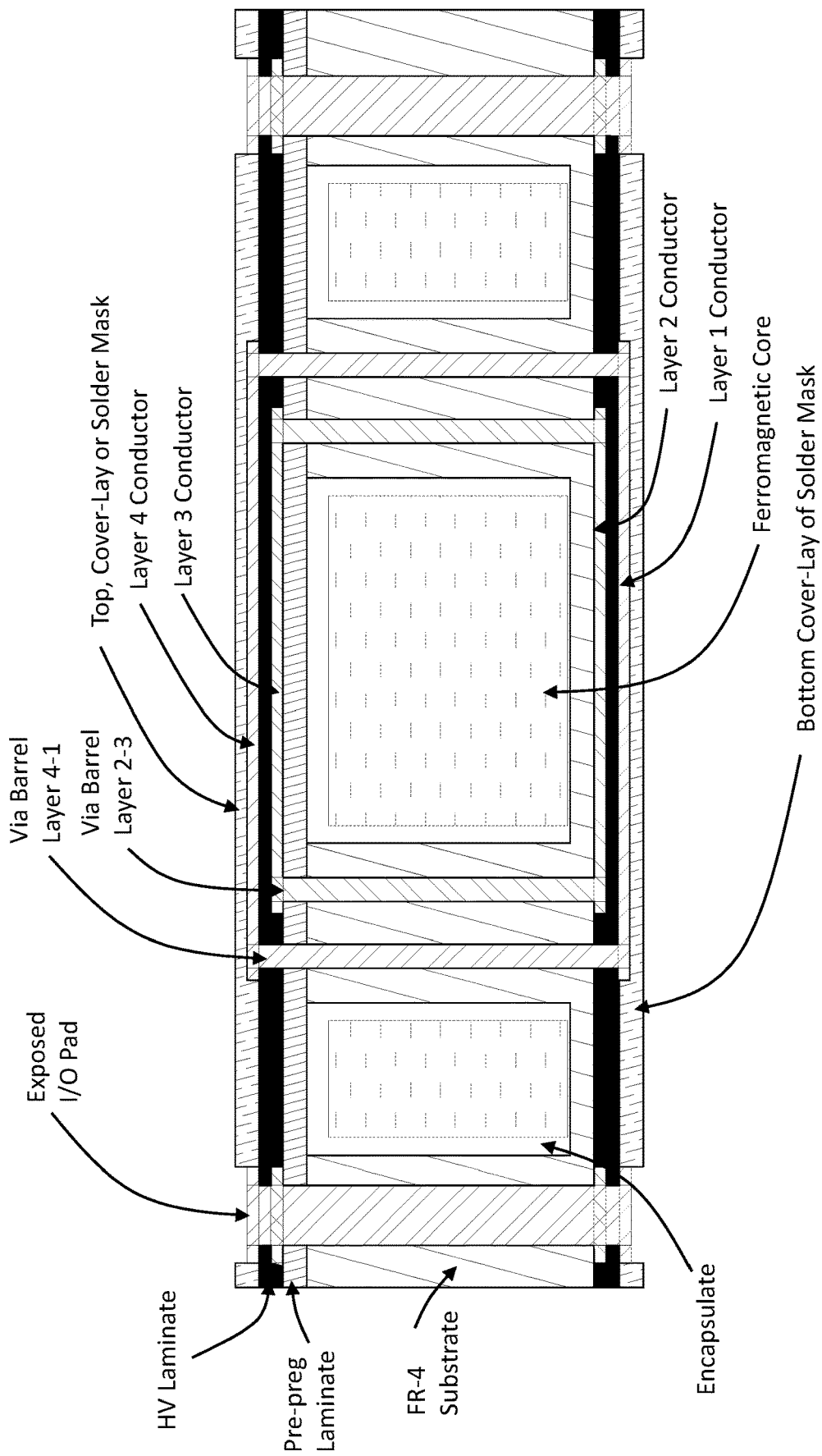
Figure 54. Square Binocular 4 Layer Cross Section

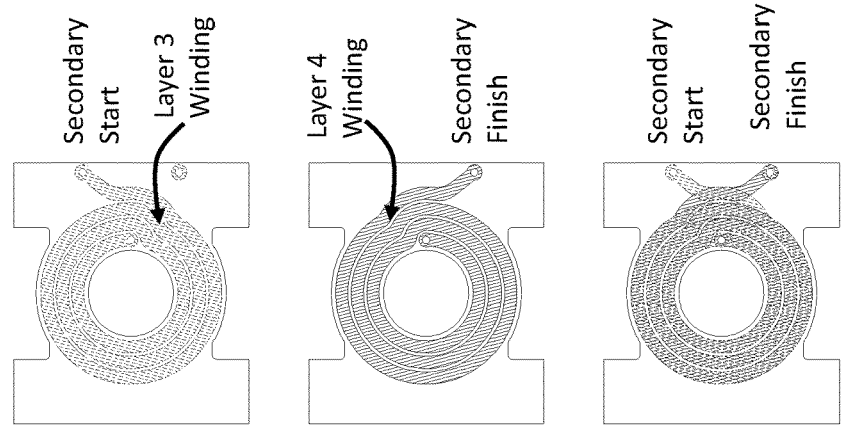
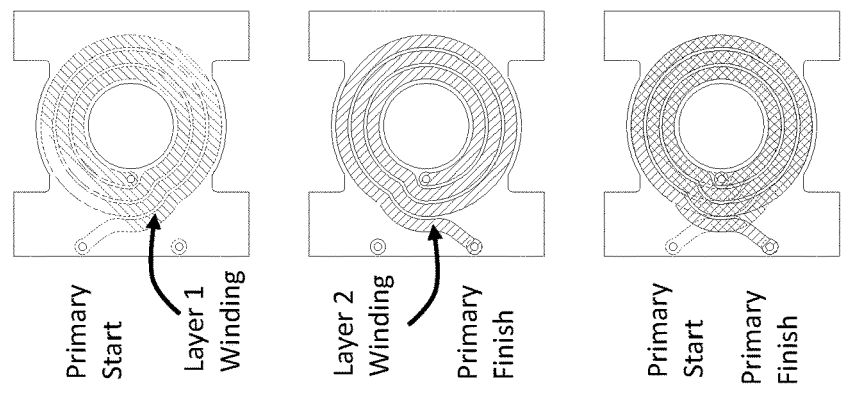
Figure 55c
Primary and Secondary Windings
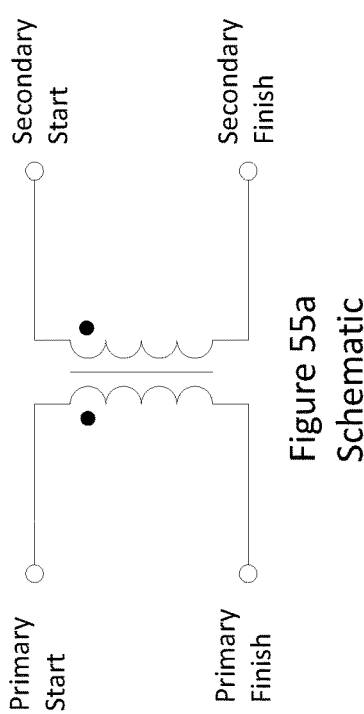
Figure 55a
Schematic
Figure 55b
Exploded View of Planar Magnetic Transformer

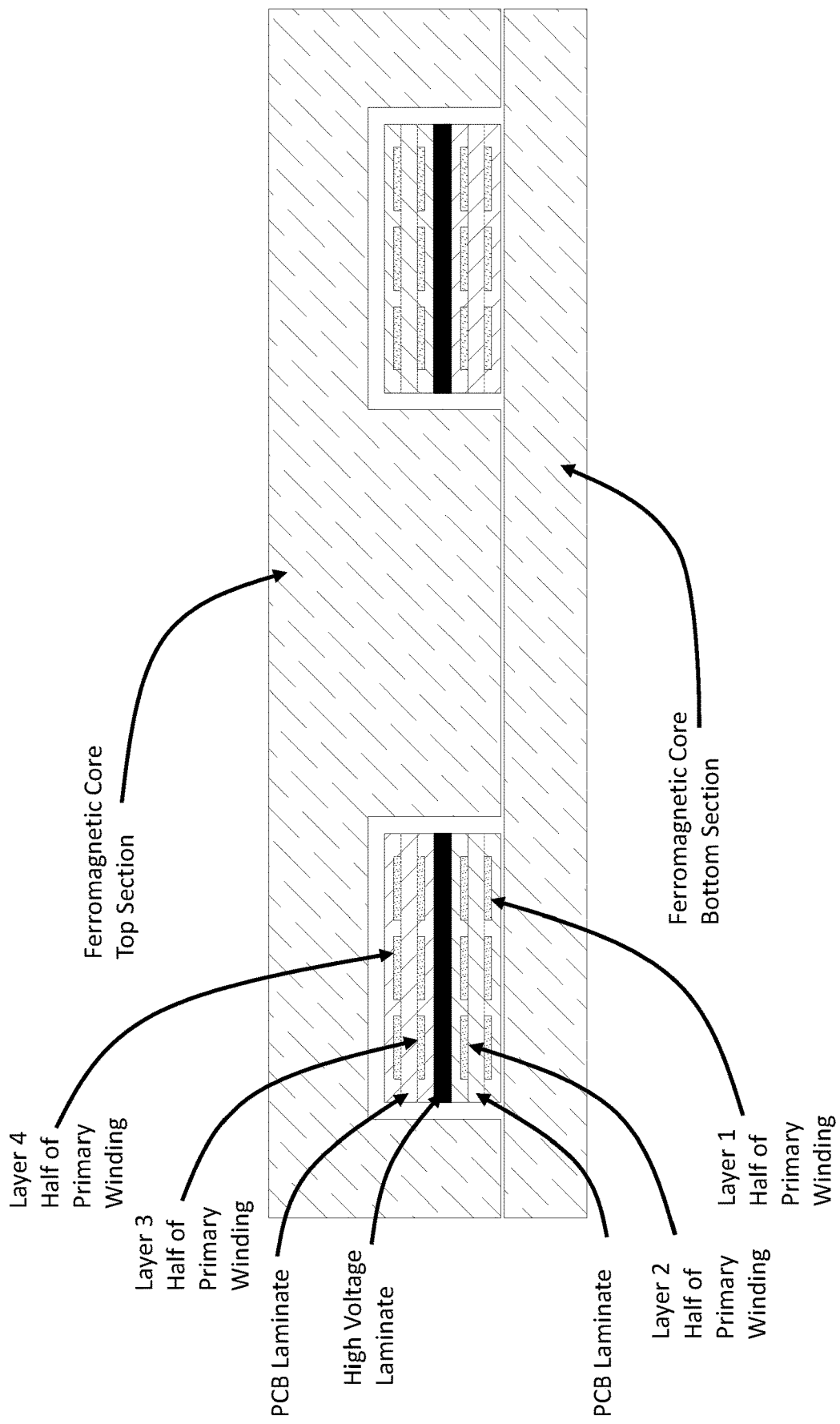
Figure 56. Planar Magnetic Transformer Cross Section View

EMBEDDED HIGH VOLTAGE TRANSFORMER COMPONENTS AND METHODS

PRIORITY APPLICATIONS

This is a continuation-in-part (CIP) application of and claiming priority to U.S. non-provisional patent application Ser. No. 16/102,039, filed on Aug. 13, 2018; which is a continuation application of and claiming priority to U.S. non-provisional patent application Ser. No. 14/963,619, filed on Dec. 9, 2015, now U.S. Pat. No. 10,049,803; which is a continuation-in-part application of and claiming priority to U.S. non-provisional patent application Ser. No. 12/329,887, filed on Dec. 8, 2008, now U.S. Pat. No. 9,355,769; which is a divisional application of U.S. non-provisional patent application Ser. No. 11/233,824, filed on Sep. 22, 2005, now U.S. Pat. No. 7,477,128; U.S. non-provisional patent application Ser. No. 14/963,619 is also a continuation-in-part application of and claiming priority to U.S. non-provisional patent application Ser. No. 14/891,645, filed on Nov. 16, 2015, now U.S. Pat. No. 9,754,714, which is a U.S. national phase application of PCT/US2009/052512, filed on Jul. 31, 2009.

This is also a continuation-in-part (CIP) application of and claiming priority to U.S. patent application Ser. No. 16/016,576, filed on Jun. 23, 2018; which is a divisional application of and claiming priority to U.S. patent application Ser. No. 15/168,185, filed on May 30, 2016; which is a continuation-in-part patent application claiming priority to U.S. patent application Ser. No. 12/329,887, filed on Dec. 8, 2008, now U.S. Pat. No. 9,355,769; which is a divisional application claiming priority to U.S. non-provisional patent application Ser. No. 11/233,824, filed on Sep. 22, 2005, now U.S. Pat. No. 7,477,128.

The entire disclosure of the referenced patent applications is considered part of the disclosure of the present application and is hereby incorporated by reference herein in its entirety.

FIELD

The disclosure generally relates to magnetic devices and magnetic components having winding-type electrical circuits.

BACKGROUND

A wide range of electronic devices may have various magnetic components. Magnetic components may be capable of providing various functions. For example, magnetic components in electronic devices may function as transformers, inductors, filters, and so forth.

Commonly, in order to have magnetic properties, magnetic components may comprise an assembly of one or more wires wound around a material having permeability properties such as ferromagnetic material having a toroidal type shape, a rod type shape, etc. When a current is applied to the one or more wires, the component may produce a magnetic field, which may be utilized to address a wide range of electrical needs associated with electronic devices.

Higher power applications require a larger volume of ferromagnetic material to transfer electromagnetic energy between the device windings. For high power applications, the winding thickness can limit the amount of current that the device can deliver. Apparatus and methods for magnetic components are needed to overcome these limits and provide higher inductance and power capability.

High voltage applications rely on the insulation properties of materials that surround the conductive windings. An electrical short between primary and secondary windings can occur when the applied voltage exceeds the dielectric breakdown properties of the insulating material. Separation between the windings is also determinate factor when designing for a specific breakdown voltage.

SUMMARY

Described embodiments are directed to apparatus and methods for embedded magnetic components having winding-type electrical circuits and arrayed embedded magnetic components.

Embodiments of a magnetic component comprise a first magnetic device including a first winding pattern implemented as a first second substrate conductive pattern, a first third substrate conductive pattern and first plated through holes that are electrically interconnected with the first second substrate conductive pattern and the first third substrate conductive pattern. The first winding pattern surrounds a first core. The first core defines a toroidal shape and the first winding pattern defines a complementary toroidal shape. The first winding pattern defines one or more electric circuits that surround the first core thereby forming a winding-type relationship so as to induce a magnetic flux within the first core when the one or more electric circuits are energized by a time varying voltage potential.

In other embodiments, the magnetic component further comprises a second magnetic device including a second winding pattern implemented as a second second substrate conductive pattern, a second third substrate conductive pattern, and second plated through holes electrically interconnected with the second second substrate conductive pattern and the second third substrate conductive pattern surrounding a second core. The second core defines a toroidal shape and the second winding pattern defines a complementary toroidal shape. The second winding pattern defines one or more electric circuits that surround the second core thereby forming a winding-type relationship so as to induce a magnetic flux within the second core when the one or more electric circuits are energized by a time varying voltage potential. The first magnetic device and the second magnetic device are electrically interconnected.

In other embodiments, arrayed embedded magnetic components include two or more magnetic devices electrically connected in parallel or series or combinations thereof, and positioned side-by-side in a horizontal integration defining a horizontal array, positioned coaxially in a vertical integration defining a vertical array, or combinations thereof.

BRIEF DESCRIPTION OF THE DRAWINGS

Embodiments are illustrated by way of example and not by way of limitation in the figures of the accompanying drawings, in which like references may indicate similar elements and in which:

FIG. 8A is a circuit illustration as a superimposed image of a magnetic device in accordance with another embodiment;

FIG. 8B is an isolation transformer schematic representative of the functionality of the embodiment of FIG. 8A;

FIG. 9A is a circuit illustration as a superimposed image of an embedded magnetic device in accordance with another embodiment;

FIG. 9B is a three-wire common mode choke schematic representative of the functionality of the embodiment of FIG. 9A;

FIG. 10A is a circuit illustration as a superimposed image of an embedded magnetic device in accordance with another embodiment;

FIG. 10B is a center-tapped inductor schematic representative of the functionality of the embodiment of FIG. 10A;

FIG. 33A illustrates printed circuit board artwork of a first layer first primary winding superimposed on a second layer first primary winding of the first magnetic device, such as shown for first magnetic device of FIG. 31;

FIG. 33B illustrates printed circuit board artwork of a first layer second primary winding superimposed on a second layer second primary winding of the second magnetic device, such as shown for second magnetic device of FIG. 31;

FIG. 33C illustrates printed circuit board artwork of a third layer first secondary winding superimposed on a fourth layer first secondary winding of the first embedded magnetic device, such as shown for first magnetic device of FIG. 31;

FIG. 33D illustrates printed circuit board artwork of a third layer second secondary winding superimposed on a fourth layer second secondary winding of the second embedded magnetic device, such as shown for second magnetic device;

FIG. 37A illustrates printed circuit board artwork of a first layer first primary winding superimposed on a second layer first primary winding of the first magnetic device, such as shown for first magnetic device of FIG. 31, for a stacked configuration of the schematic of FIG. 36;

FIG. 37B illustrates printed circuit board artwork of a first layer second primary winding superimposed on a second layer second primary winding of the second magnetic device, such as shown for second magnetic device of FIG. 31;

FIG. 37C illustrates printed circuit board artwork of a third layer first secondary winding superimposed on a fourth layer first secondary winding of the first embedded magnetic device, such as shown for first magnetic device of FIG. 31;

FIG. 37D illustrates printed circuit board artwork of a third layer second secondary winding superimposed on a fourth layer second secondary winding of the second embedded magnetic device, such as shown for second magnetic device;

FIG. 40 depicts a schematic diagram of a two-choke magnetic component, in the form of a series connection of a first common mode inductor and a second common mode inductor, in accordance with an embodiment;

FIG. 41A illustrates printed circuit board artwork of a first layer first primary winding superimposed on a second layer first primary winding of the first common mode inductor, in accordance with the schematic of FIG. 40, in accordance with an embodiment;

FIG. 41B illustrates printed circuit board artwork of a first layer second primary winding superimposed on a second layer second primary winding of the common mode inductor, in accordance with an embodiment;

FIG. 42 depicts a schematic diagram of a 2-wire common mode inductor in series with a 2-wire differential mode inductor, in accordance with an embodiment;

FIG. 43A illustrates printed circuit board artwork of a first layer first primary winding superimposed on a second layer first primary winding of the 2-wire common mode inductor, in accordance with the schematic of FIG. 42, in accordance with an embodiment;

FIG. 43B illustrates printed circuit board artwork of a first layer second primary winding superimposed on a second layer second primary winding of the 2-wire differential mode inductor, in accordance with an embodiment;

FIG. 49 is a cross section view of an EM transformer that has 2 conductive layers and a high voltage cover-lay material on the top and bottom surfaces;

FIG. 50a is a schematic diagram of a transformer with a primary and secondary winding;

FIG. 50b is an EM transformer with 4 conductive layers, showing just layers 2 and 3, which are the primary windings;

FIG. 50c is an EM transformer with 4 conductive layers, showing just layers 1 and 4, which form the secondary windings;

FIG. 50d is an EM transformer with 4 conductive layers;

FIG. 51 is a cross section view of an EM Transformer that has 4 conductive layers and a high voltage laminate material separating the primary and secondary winding layers;

FIG. 53a is an EM transformer that has 4 conductive layers and a square binocular shaped core, showing layers 1 and 4, which form the primary winding;

FIG. 53b is an EM transformer that has 4 conductive layers and a square binocular shaped core, showing layers 2 and 3, which form the secondary winding;

FIG. 53c is an EM transformer that has 4 conductive layers and a square binocular shaped core;

FIG. 54 is a cross section view of an EM transformer with high voltage laminate between the primary and secondary windings;

FIG. 55a is a schematic diagram of a transformer with a primary and secondary winding;

FIG. 55b is an exploded view of a planar magnetic transformer;

FIG. 55c is an EM transformer that has 4 conductive layers, separately showing the windings of each layer; and FIG. 56 is a cross section view of a 4 layer PM transformer and a high voltage laminate applied between the primary and secondary windings

DETAILED DESCRIPTION

Figure 1A:
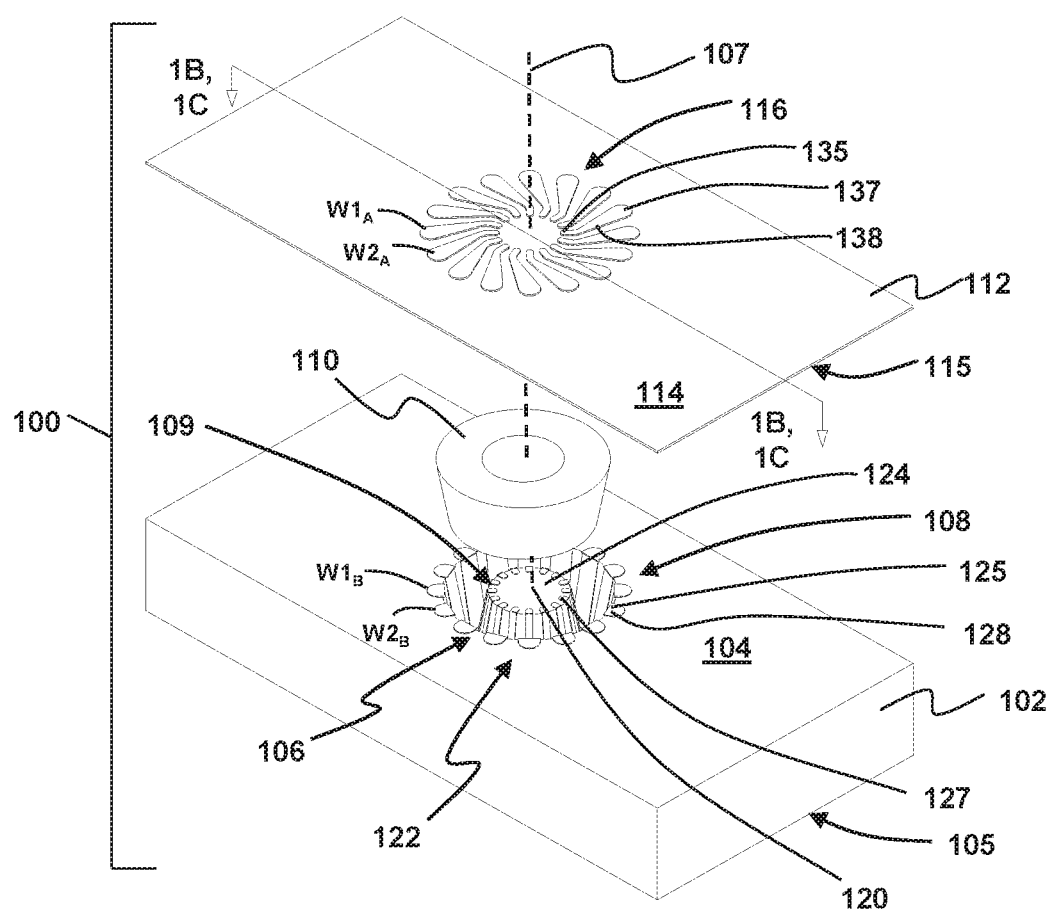
FIG. 1A is a perspective exploded view and FIG. 1B is a cross-sectional exploded view about line 1B-1B of an embedded magnetic device in accordance with an embodiment.

In the following description, embodiments are disclosed for an apparatus and method for arrayed embedded magnetic components that include magnetic devices that have a core that is embedded between two or more substrates and a winding pattern surrounding the core that is implemented on and through the two or more substrates. For purposes of explanation, specific numbers, materials, and/or configurations are set forth in order to provide a thorough understanding of the embodiments. However, it will also be apparent to those skilled in the art that the embodiments may be practiced without one or more of the specific details, or with other processes, materials, components, etc. In other instances, well-known structures, materials, and/or operations are not shown and/or described in detail to avoid obscuring the embodiments. Accordingly, in some instances, features are omitted and/or simplified in order to not obscure the disclosed embodiments. Furthermore, it is understood that the embodiments shown in the figures are illustrative representations and are not necessarily drawn to scale.

References throughout this specification to "one embodiment" or "an embodiment" means that a particular feature, structure, material, and/or characteristic described in connection with the embodiment is included in at least one embodiment. Thus, the appearances of the phrases "in one embodiment" and/or "in an embodiment" in various places throughout this specification are not necessarily all referring to the same embodiment. Furthermore, the particular features, structures, materials, and/or characteristics may be combined in any suitable manner in one or more embodiments.

For the purposes of the subject matter disclosed herein, the term "substrate" refers to an element from which the embodiments of magnetic devices and components are made. A substrate has generally a rectangular shape having a thickness that is substantially less than the width and length. Substrates may comprise a wide range of materials such as, but not limited to, plastic material, including, but not limited to polymer and fiberglass, semiconductor material, and so forth. Accordingly, it should appreciated by those skilled in the art that the substrate material may be chosen based at least in part on its application. However, for the purposes of describing the subject matter, references may be made to a particular substrate material along with some examples, but the subject matter is not limited to the examples provided. It is understood that the substrate provides a means to electrically insulate the conductive pattern, and therefore, a substrate comprising insulative material is known to be used in the art for electronic components. It is understood that an insulative layer may be used between the conductive pattern and the substrate wherein the underlying substrate may include an electrically conductive material. In embodiments presented herein, it is provided that the substrate is relatively electrically insulative for purposes of illustrating the subject matter, yet may include conductive traces, ferromagnetic elements, and other electrically conductive materials.

For the purposes of the subject matter disclosed herein, reference to the terms "conductive pattern", "conductive trace", "circuit pattern" and "circuit trace", used interchangeably herein, refer to an electrically conductive material that defines at least a portion of an electric circuit pattern or winding pattern. Electric circuit patterns are well known, for example, in the printed circuit board arts.

For the purposes of the subject matter disclosed herein, reference to the terms "windings", "winding-type electric circuits", and "winding patterns", used interchangeably herein, refer to an electrically conductive material that defines an electric circuit pattern substantially analogous in function to a circuit comprising a wire that is wrapped around a mandrel. A winding pattern may comprise one or more conductive patterns and conductive traces that are electrically interconnected.

For the purposes of the subject matter disclosed herein, reference to the term "permeability material" refers to a material making up a core of a magnetic component. Cores are known in the art. For example, but not limited thereto, permeability material includes air, a hollow device made from non-ferromagnetic material having a permeability approaching 1, and ferromagnetic material. A core may comprise a permeability material that is a solid, semisolid, or gas.

Additionally, for the purposes of describing various embodiments, references may be made to "magnetic devices" and "magnetic components". However, it should be appreciated by those skilled in the relevant art that magnetic components may include magnetic devices having one or more of a wide variety of magnetic functionality such as, but not limited to, transformer devices, inductor devices, filter devices, and so forth, and accordingly, the claimed subject matter is not limited in scope in these respects.

For the purposes of the subject matter disclosed herein, reference to a "magnetic device" refers to a core surrounded by one or more conductive patterns operable to facilitate magnetic properties of the core when the one or more conductive patterns are electrically energized. Reference to "magnetic component" refers to two or more magnetic devices that are electrically interconnected. Further, embodiments of methods of making magnetic devices and magnetic components are presented herein.

For the purposes of the subject matter disclosed herein, reference to an "array" refers to a spatial relationship between two or more magnetic devices. Examples of particular spatial relationships include, but not limited to, side-by-side in a horizontal integration, also referred to as a horizontal array, and top-to-bottom or coaxial alignment in a vertical integration, also referred to as a vertical array, and combinations thereof.

For the purposes of the subject matter disclosed herein, reference to "embedded device" or "embedded component" refers to a magnetic device or magnetic component where the core is contained within or enclosed by one or more substrates.

For the purposes of the subject matter disclosed herein, "inductor" may be used in a broad sense to refer to an individual inductor device, two or more inductors electrically connected in a differential mode configuration, and two or more inductors electrically connected in a common mode choke configuration, among other configurations.

Embodiments of a magnetic device comprise a wound component, implemented by embedding a core defining a toroidal shape into a substrate and disposing conductive windings defining a complementary toroidal shape around the core. A toroidal shape refers to a ring or donut shape. Windings may be implemented, by way of example but not limited to, printed circuit layers, plated vias, and combinations thereof. Embodiments of methods of making magnetic devices provide a means for producing inductors, transformers and other wound electrical and magnetic devices with an automated batch process. Some of the benefits include one or more of low cost construction, high frequency performance, consistent performance, and a low profile form. In accordance with an embodiment, the magnetic device is a printed circuit board (PCB) upon which other passive and active components may be placed. In accordance with other embodiments, other magnetic devices may be vertically integrated with a magnetic device which may reduce the size of the system implementation.

Embodiments of a magnetic device comprise a wound component, implemented by embedding a core defining a binocular shape into a substrate and disposing conductive windings defining a complementary binocular shape around the core. A binocular shape refers to a rectangle or oval with two apertures or windows.

Embodiments of a magnetic device comprise conductive windings disposed around a core. The windings may be disposed using printed circuit techniques, in accordance with embodiments. For high volume production, specific design rules are followed regarding the conductor widths, spacings, and the aspect ratio (length/diameter) of plated vias that may be used to interconnect winding layers. There are limits to the number of windings that can be applied to a given structure of the core. The printed circuit fabrication equipment imposes limitations on the substrate thickness, which constrains the height of the core. The thickness and volume of the core determines, at least in part, the power capability of the magnetic device.

Higher power applications require a larger volume of permeability material to transfer electromagnetic energy between the windings of the magnetic device. For high power applications, circuit plating thickness can limit the amount of current that the magnetic device can deliver. To overcome these limits and provide higher inductance and power capability, methods and apparatus are provided that provide multiple magnetic devices arranged and interconnected in an array.

Inductance may be increased when windings are connected in series. When connected in parallel, the inductance is reduced. Winding resistance and AC impedance is also reduced when inductors are connected in parallel, which is, for example, beneficial for power applications. In power applications, heat is generated within the windings and the core material, by way of example. Spreading the heat between multiple windings and cores is beneficial for dissipating heat and managing the temperature of the circuit. Also, loss parameters such as, but not limited to, leakage inductance and core loss are proportional to the number of windings on the core, the core size and volume. In power applications, these parameters impact the system efficiency and energy loss. In accordance with embodiments, system efficiency and energy loss may be reduced by implementing the inductor or transformer device using multiple smaller cores, rather than one large core.

Figure 1B:
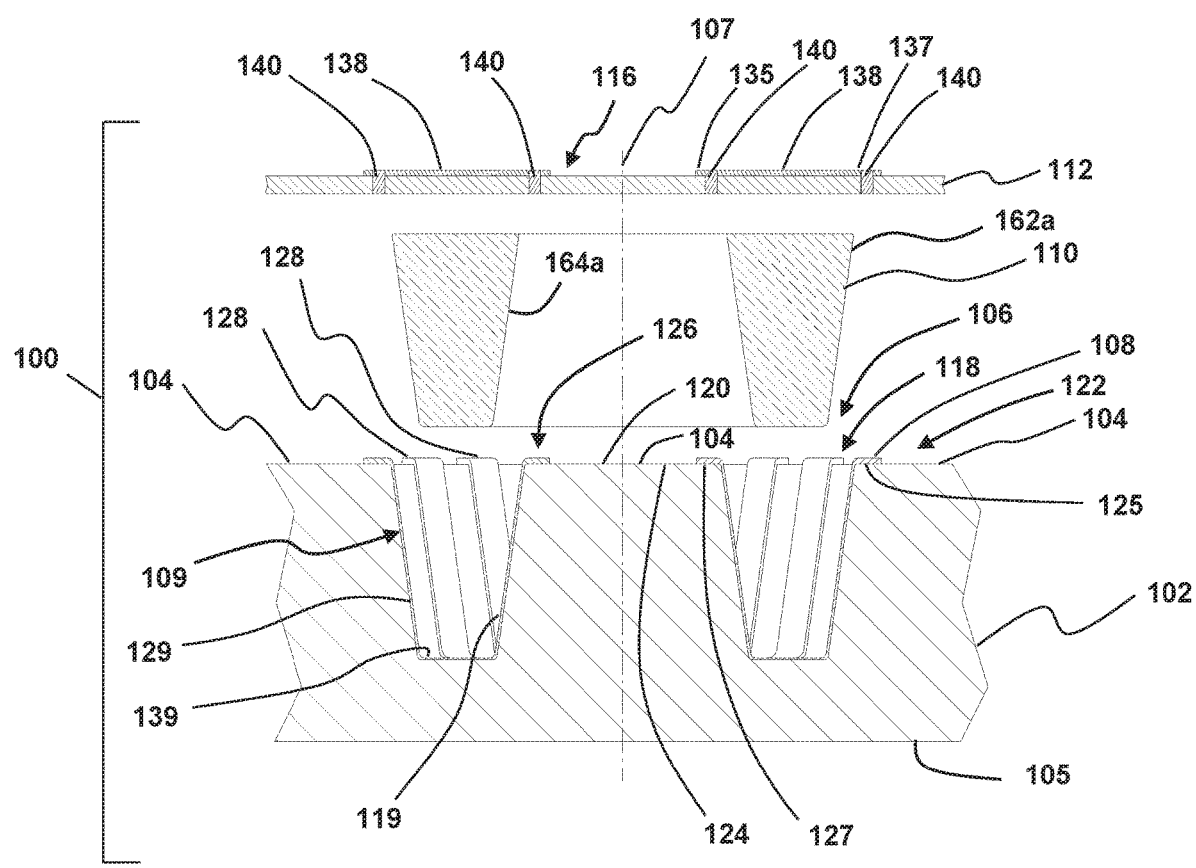

FIG. 1A is a perspective exploded view and FIG. 1B is a cross-sectional exploded view about line 1B-1B of an embedded magnetic device 100 in accordance with an embodiment. The embedded magnetic device 100 comprises a base substrate 102, a first conductive pattern 108, core 110, a second substrate 112, a second conductive pattern 116, and means for electrically coupling the first conductive pattern 108 and second conductive pattern 116, such as, but not limited to various types of vias or interconnects 140 and electrically conductive traces.

The base substrate 102 defines a base substrate first surface 104 and a base substrate second surface 105 opposite the base substrate first surface 104, and a feature 106. The first conductive pattern 108 is disposed on and about the feature 106. The core 110 is disposed within the feature 106. The second substrate 112 comprises a second substrate first surface 115 and a second substrate second surface 114. The second substrate first surface 115 is disposed on and coupled to the base substrate first surface 104, over the feature 106, and over the core 110. The second conductive pattern 116 is disposed on the second substrate second surface 114 in complementary alignment with the first conductive pattern 108. The first conductive pattern 108 and the second conductive pattern 116 comprise an electrically conductive material. As will be further described below, the first conductive pattern 108 and the second conductive pattern 116 are electrically interconnected so as to electrically cooperate to be operable for facilitating magnetic properties of the core 110 when electrically energized, in accordance with various embodiments.

It should be appreciated that FIGS. 1A and 1B illustrate an exploded view to describe an embodiment of the claimed subject matter, and accordingly, as will be described in further detail, the embedded magnetic device 100 may have core 110 substantially enclosed within the feature 106, with the second substrate 112 substantially covering the core 110. The electrically interconnected first conductive pattern 106 and second conductive pattern 116 surround the core 110, thereby forming a winding pattern, that is, a winding-type relationship such as associated with a winding-type electric circuit that cooperates in electrical communication when coupled to a time varying voltage potential. Such winding-type relationship is similar in function to known electrical devices in the art that comprise a wire-wrapped core configuration.

Continuing to refer to FIGS. 1A and 1B, the base substrate 102 is shown having a substantially rectangular shape. However, it should be appreciated that the base substrate 102 may have any shape such as, but not limited to, substantially circular, substantially oval, substantially square, or any other polygonal shape.

Additionally, the base substrate 102 may comprise many types of material suitable for use as a substrate, such as, but not limited to, material suitable for printed circuit boards (PCBs), various plastic materials, material suitable for injection molding, ceramic materials, and so forth.

For example, in an embodiment, the base substrate 102 may comprise a thermoplastic material, such as, but not limited to, polyimide resin and polyetherimide (PEI) material. In another embodiment, the base substrate 102 may comprise a plastic resin material that may be suitable for injection molding or compression molding, such as, but not limited to, liquid crystal polymer material. It should be appreciated by those skilled in the relevant art that the shape and materials described are merely examples, and the claimed subject matter is not limited in scope in these respects.

In the embodiment of FIGS. 1A and 1B, the feature 106 extends below a plane defined by the base substrate first surface 104. The feature 106 defines a toroidal shape depression, also referred herein as a groove of revolution about an axis 107, depending from the base substrate first surface 104 into the base substrate 102. The axis 107 is perpendicular to a plane defined by the base substrate first surface 104. The feature 106 defines a hub 120 having a hub top surface 124 that extends to the plane defined by the base substrate first surface 104. The feature 106 further defines a bottom wall 139 and a feature inner wall 119 and a feature outer wall 129 contiguous with the bottom wall 139 defining a feature wall surface 109. It is appreciated that in other embodiments, the feature inner wall 119 and feature outer wall 129 may be contiguous with no bottom wall 139 as dictated by design preference.

It should be appreciated by those skilled in the relevant art that the feature 106 may define a wide range of shapes such as, but not limited to, a rod, oval, oblong, and so forth, and accordingly, the claimed subject matter is not limited in scope in these respects. Some of these other feature shapes are presented below by way of example, and not limited thereto.

A variety of processes may be utilized in order to facilitate formation of the feature 106 in the base substrate 102. For example, in an embodiment, the feature 106 is formed by utilizing a lithography process, such as, but not limited to photolithography. Photolithography is well known in the art in which selected regions of a material are removed so as to reveal underlying elements or produce three-dimensional structures in a substrate.

In other embodiments, the feature 106 may be formed by utilizing a machining process such as, but not limited to, a micromachining process, wherein material is selectively removed with a mechanical process. Various processes may be utilized to facilitate formation of a feature, and accordingly, the claimed subject matter is not limited to a particular process.

As shown in FIGS. 1A and 1B, the feature 106 defines a feature periphery surface portion 122 on the base substrate first surface 104. The hub top surface 124 defines a hub periphery surface portion 126. The feature periphery surface portion 122 and the hub periphery surface portion 126 are those portions where a portion of the first conductive pattern 108 is disposed on the respective surfaces. The first conductive pattern 108 is disposed on a portion of the feature 106 and on a portion of the feature periphery surface portion 122 and the hub periphery surface portion 126. In the illustrated embodiment, the first conductive pattern 108 is disposed in a manner whereby the first conductive pattern 108 covers portions of the feature wall surface 109, the feature periphery surface portion 122 and the hub periphery surface portion 126.

A variety of methods may be utilized in order to dispose the first conductive pattern 108 on the respective surfaces. In an embodiment, the first conductive pattern 108 is disposed on the respective surfaces by utilizing a stamping process, such as, but not limited to, stamping a conductive pattern from sheet material, forming the conductive pattern to conform to the shape characteristics of the feature 106, and coupling the conductive pattern to the feature 106 such as, but not limited to, using adhesive or a molding process.

In another embodiment, the first conductive pattern 108 is disposed on the respective surfaces by utilizing a plating process, such as, but not limited to, chemical and/or electroplating a conductive pattern on a substrate. In another embodiment, the first conductive pattern 108 is disposed on the respective surfaces by utilizing a lithography process, such as, but not limited to, photolithography. The photolithography process may be used to first plate or cover the substrate with conductive material, dispose a photo-resist onto the conductive material and use photolithography and chemical etching or laser ablation and the like to produce the circuit pattern from the conductive material. In yet another embodiment, a structuring process, such as, but not limited to, laser structuring process may be utilized to dispose the first conductive pattern 108 on the respective surfaces, such as wherein a laser is used to prepare the surface for plating with a conductive material. Various other processes may be utilized to dispose a conductive pattern on the respective surfaces, and accordingly, the claimed subject matter is not limited to a particular process.

Referring again to FIGS. 1A and 1B, the feature inner wall 119 and feature outer wall 129 taper inward towards each other as they extend towards the bottom wall 139. Among other things, the taper of the feature inner wall 119 and feature outer wall 129 ensures that the feature inner wall 119 and feature outer wall 129 are viewable by those conductive material deposition processes that require line-of-sight surface exposure.

For example, but not limited thereto, imaging techniques may be utilized to dispose the conductive pattern on the respective surfaces. An example of an imaging technique known in the art includes, but is not limited to, photolithography, which is a method for disposing two-dimensional circuit traces on a printed circuit board, for example. In conventional photolithography of a planar substrate, the surface to be treated must be viewable by an imaging device that projects imaging onto the substrate surface. Likewise, imaging techniques used to dispose the conductive pattern on the feature inner wall 119 and feature outer wall 129 requires the same to be viewable by the imaging device. To facilitate such imaging, in accordance with an embodiment as shown in FIGS. 1A and 1B, the feature inner wall 119 and feature outer wall 129 depend into the base substrate first surface 104 at an obtuse angle defining an inward-sloping configuration of the feature inner wall 119 and feature outer wall 129 which presents an imaging device a broader viewable area as compared with a more vertical orientation of the feature inner wall 119 and feature outer wall 129.

The first conductive pattern 108 and second conductive pattern 116 may comprise a wide variety of electrically conductive materials such as, but not limited to, copper, tin, aluminum, gold, silver, and other various types of conductive tracing materials. Accordingly, the claimed subject matter is not limited in scope in these respects.

In accordance with an embodiment, after the first conductive pattern 108 is disposed on the feature 106, the portion of the first conductive pattern 108 on the feature wall surface 109 may be covered with an electrically insulative layer, such as, but not limited to, encapsulate material. The electrically insulative layer is operable, among other things, to prevent electrical shorting between the core 110 and the first conductive pattern 108.

Continuing to refer to FIGS. 1A and 1B, the core 110 is shown as having a shape defined at least in part by the shape of the feature 106. That is, in the embodiment of FIGS. 1A and 1B, the core 110 comprises a substantially toroidal shape about the axis 107 that substantially fits within and corresponds to the toroidal shape of the feature 106. In the embodiment of FIGS. 1A and 1B, the core 110 is shown as a separate solid object, where the solid object may be placed within the feature 106 by various methods such as, but not limited to, utilizing a pick and place machine. However, in another embodiment, the core 110 may be of a liquid form whereby the liquid may be poured into the feature 106 and subsequently cured to a solid mass. In another embodiment, the core 110 may be in the form of a powder whereby the powder may be disposed into the feature 106. In yet another embodiment, the core 110 may comprise of material that may be utilized with a vibration-based process to facilitate placement of the core substantially within the feature 106. That is, a method by which a vibration machine may be utilized to settle or align the core 110 within the feature 106. Accordingly, the claimed subject matter is not limited in scope in these respects.

The core 110 may comprise a wide variety of permeability materials such as, but not limited to, ferromagnetic materials that may include ferrite materials, iron materials, metal materials, metal alloy materials, and so forth. Additionally, the core 110 may comprise permeability materials based at least in part on the particular utilization of a magnetic device. For example, a magnetic device to be utilized as an isolation transformer may include a core having a high relative permeability. In another example, a magnetic device to be utilized as a common mode filter may include a core having a moderate relative permeability. Further, as previously alluded to, the size and shape of the core 110 may be based at least in part on the utilization of the magnetic device. It is understood that other design parameters may be considered in the material type and method of forming the core 110, such as, but not limited to, the coefficient of thermal expansion mismatch with the substrate that may be a factor in device production and use. Also, it is understood that an air core, that is, a core 110 having a relative permeability of 1, such as implemented by a solid or hollow core that is non-ferromagnetic as well as an empty feature, may be used in certain embodiments. Accordingly, the claimed subject matter is not limited in scope in these respects.

Figure 1C:
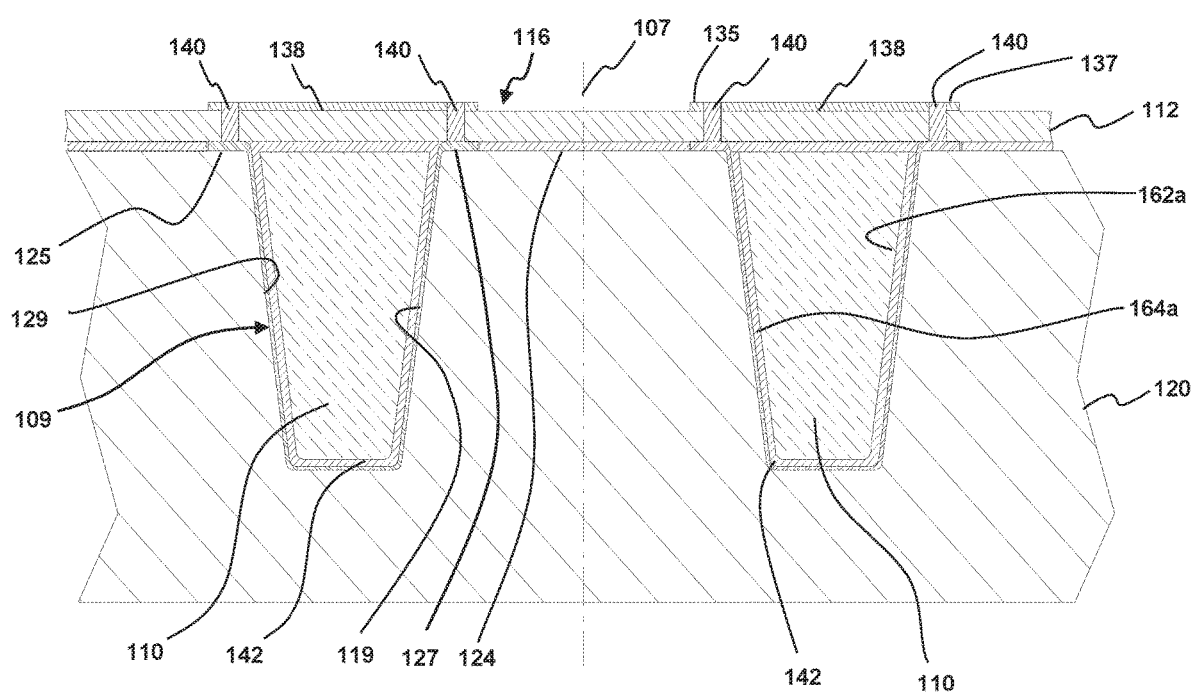
FIG. 1C is a cross-sectional view about cut line 1C-1C of the magnetic device of the embodiment of FIG. 1A.

FIG. 1C is a cross-sectional view about cut line 1C-1C of the magnetic device 100 of the embodiment of FIG. 1A. In accordance with embodiments, wherein the core 110 is a solid element, after the core 110 is disposed within the feature 106, a gap 142 may be defined between the core 110 and the feature 106. This gap 142 may be filled with an encapsulate material that is gap filling; that is, a material that is able to fill the gap 142. The encapsulate material may be operable for, among other things, adhering the core 110 within the feature 106 and to prevent shifting therein, and electrically insulating the core 110 from the first conductive pattern 108.

In FIGS. 1A-1C, for the purposes of describing the embodiment, the second substrate 112 may be shown as a relatively thin layer as compared to the base substrate 102. However, the second substrate 112 may be representative of one or more layers, such as, but not limited to, printed circuit layers disposed on the base substrate first surface 104 of the base substrate 102 and does not necessarily denote a single piece of substrate, but it also could be a single piece of substrate. The second substrate 112 may also be in a form of a sheet. Additionally, the second substrate 112 does not necessarily need to comprise the same material as the base substrate 102 and may comprise a different material. For example, in one embodiment, the second substrate 112 may include various lamination layers that facilitate buildup of circuit layers. In another embodiment, a liquid material may be disposed on the base substrate 102 such as, but not limited to, a liquid dielectric material that is subsequently cured to at least a substantially rigid form. For example, a liquid dielectric material, such as a polyimide epoxy, may be disposed by utilizing at least one of a spray, roller, and/or a squeegee process. A subsequent conductive foil layer may be laminated to the liquid dielectric material. It should be appreciated by those skilled in the relevant art that the second substrate 112 may be disposed on and coupled to the base substrate first surface 104 of the base substrate 102 by a wide variety of processes. Accordingly, the claimed subject matter is not limited to any one particular process.

In the embodiment illustrated in FIGS. 1A-1C, the second conductive pattern 116 is shown on the second substrate second surface 114 of the second substrate 112. As previously described, the second conductive pattern 116 may be disposed on the second substrate 112 utilizing a variety of processes, such as, but not limited to, a lamination process, lithography process, etching process, a screen printing process, a laser structuring process, and so forth. That is, the second conductive pattern 116 may be disposed as part of the process of providing the second substrate 112, and accordingly, the claimed subject matter is not limited in these respects.

In an embodiment, the second conductive pattern 116 is disposed by utilizing a stamping process, such as, but not limited to, stamping a conductive pattern from sheet material and coupling the conductive pattern to the second substrate 112, such as, but not limited to, using adhesive or embedding or over-molding the conductive pattern into the second substrate second surface 114 during a molding process.

In the embodiment of FIGS. 1A-1C, the second conductive pattern 116 comprises a pattern that is complimentary to the first conductive pattern 108 so as to cooperate electrically to facilitate electrical "wrapping" of the core 110 between the first conductive pattern 108 and the second conductive pattern 116. Additionally, the first conductive pattern 108 and the second conductive pattern 116 are electrically interconnected, such as by one or more vias and/or interconnects 140, as will be described in detail. Further, the first conductive pattern 108 and the second conductive pattern 116 are electrically coupled together to define one or more electrical circuits each having a positive terminal W1A, W2A and a negative terminal W1B, W2B, corresponding to the two electrical circuit embodiment of FIGS. 6A and 6B, suitable for coupling to a voltage source and/or other external components.

Together, the first conductive pattern 108 and the second conductive pattern 116 electrically cooperate to be capable of facilitating magnetic properties of the core 110 when coupled to a time varying voltage potential and/or other external components. For example, the first conductive pattern 108 and the second conductive pattern 116 cooperate to be capable of inducing a magnetic field upon the core 110 when the first conductive pattern 108 and second conductive pattern 116 are electrically coupled to a time varying voltage potential.

Figure 2A:
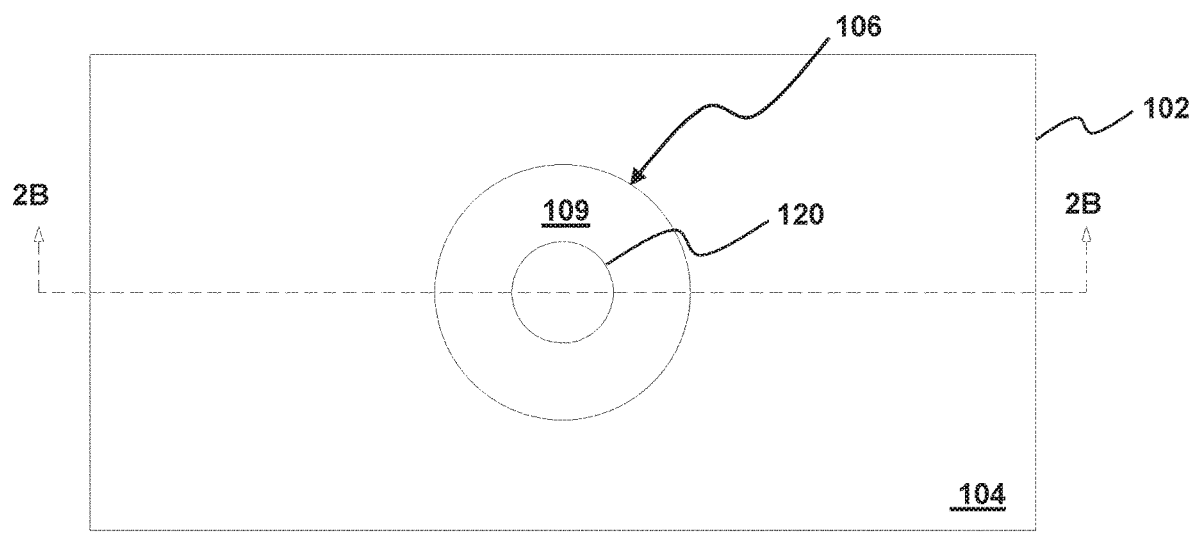
FIGS. 2A and 2B are top and cross-sectional views about line 2B-2B, respectively, of the base substrate 102 in accordance with the embodiment of FIGS. 1A and 1B.
Figure 2B:
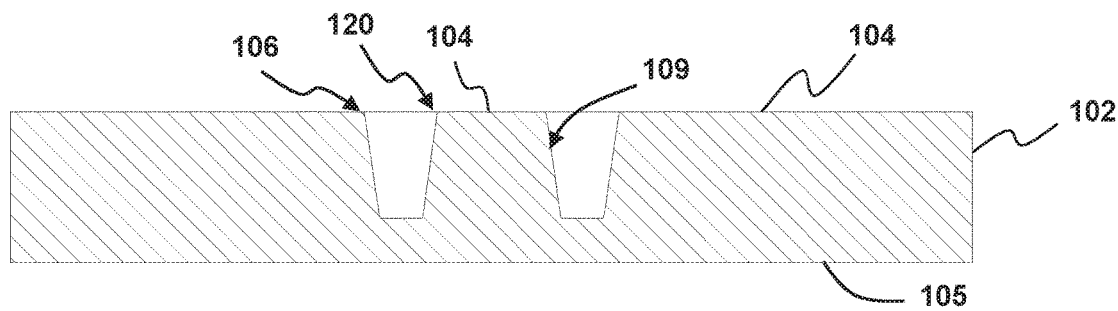

FIGS. 2A and 2B are top and cross-sectional views about line 2B-2B, respectively, of the base substrate 102 in accordance with the embodiment of FIGS. 1A and 1B. In FIG. 2A, the base substrate 102 comprises the base substrate first surface 104 and the feature 106. As shown in FIG. 2B, the feature 106 depends from the base substrate first surface 104 into the base substrate 102. In this embodiment, the feature 106 defines a substantially toroidal shape formed as a depression into the base substrate 102 and defining the hub 120.

Figure 3:
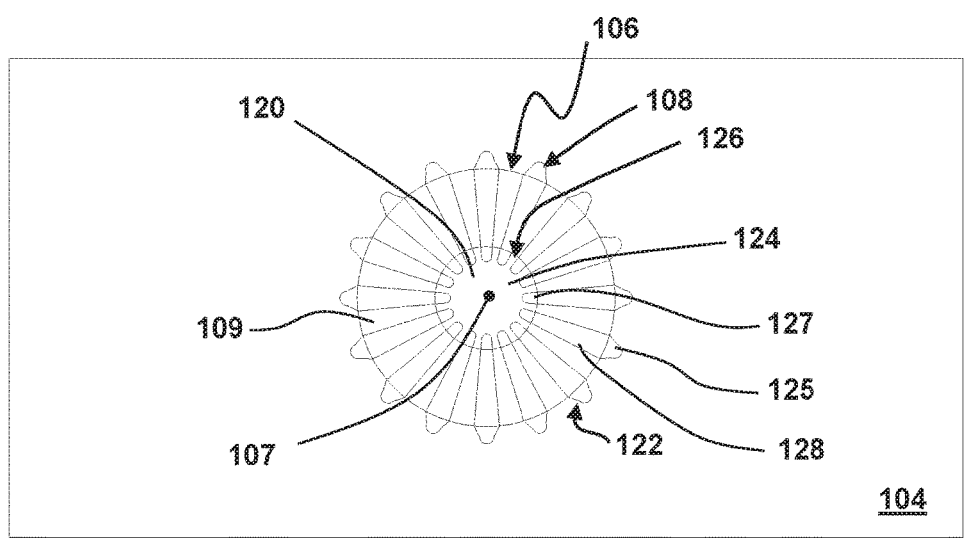
FIG. 3 is a top view of the base substrate and the first conductive pattern in accordance with the embodiment of FIGS. 1A and 1B.

FIG. 3 is a top view of the base substrate 102 and the first conductive pattern 108 in accordance with the embodiment of FIGS. 1A and 1B. The base substrate 102 comprises the base substrate first surface 104 and the feature 106. The first conductive pattern 108 is disposed within the feature 106 and on the feature periphery surface portion 122 and on the hub periphery surface portion 126. The first conductive pattern 108 comprises a plurality of first conductive traces 128 that are discontinuous and radiate from about an axis 107. The use of the term "discontinuous" in describing traces, such as conductive traces 128, means that the traces are not electrically interconnected at this point of the construct.

The first conductive traces 128 are disposed from the hub periphery surface portion 126 to the feature periphery surface portion 122 along the feature wall surface 109 there between, also as shown in FIGS. 2A and 2B. Each of the first conductive traces 128 comprise a trace hub end 127 that is associated with the hub periphery surface portion 126 and a trace feature end 125 that is associated with the feature periphery surface portion 122.

Referring again to FIG. 1A, the second conductive pattern 116 comprises a plurality of second conductive traces 138 that are discontinuous and radiate from about the axis 107. Second conductive traces 138 comprise a second conductive trace first end 135 positioned closest to the axis 107 and a second conductive trace second trace end 137, opposite the second conductive trace first end 135. The number of second conductive traces 138 is determined by the number of first conductive traces 128 and for a particular purpose. In accordance with embodiments, including that shown in FIG. 1A, the number of second conductive traces 138 are equal to the number of first conductive traces 128. In the embodiment of FIG. 1A, the first conductive traces 128 and the second conductive traces 138 define a complimentary pattern such that the second conductive traces 138 radiate from about the axis 107 such that a second conductive trace first end 135 is aligned above a trace hub end 127 of a first conductive trace 128, and a second conductive trace second trace end 137 is aligned above a trace feature end 125 of an adjacent first conductive trace 128 when the second conductive pattern 116 and the second substrate 112 are coupled to the base substrate 102.

Interconnects 140, as shown in FIG. 1B, are located between the respective second conductive trace first end 135 and the trace hub end 127 and the second conductive trace second trace end 137 and the trace feature end 125 affecting an electrical coupling there between. Interconnects 140 may also be referred to as vias, which are known in the art. The interconnection of the first conductive pattern 108 and the second conductive pattern 116 define a winding-type electric circuit around the core 110. In accordance with an embodiment, the magnetic device 100 provides wherein the first conductive pattern 108 and second conductive pattern 116 are electrically coupled so as to define at least one continuous winding beginning at a first electrical tap W1 and terminating at a second electrical tap W2, such as shown in FIG. 1A, which are operable to be coupled to a time varying voltage potential.

Figure 4:
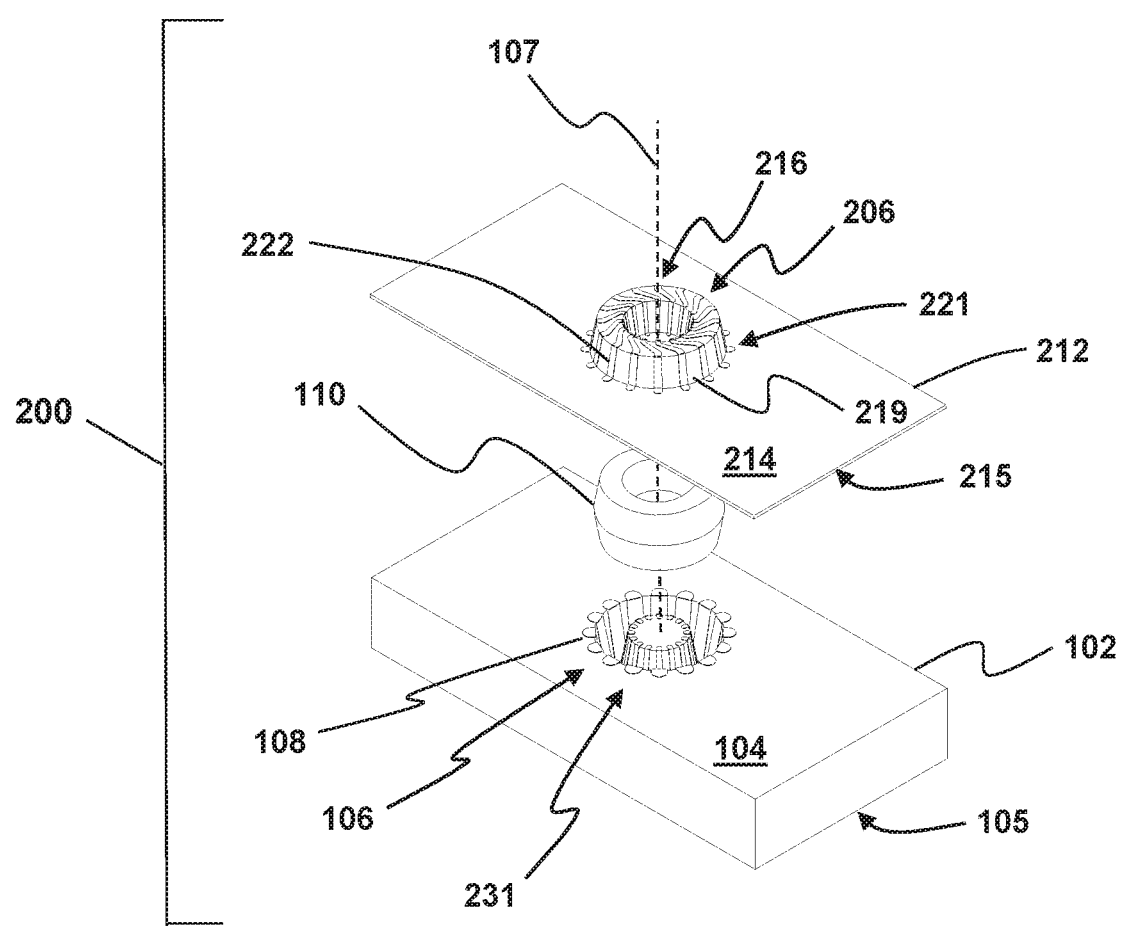
FIG. 4 is a perspective exploded view of an embedded magnetic device in accordance with another embodiment.

FIG. 4 illustrates a perspective exploded view of an embedded magnetic device 200 in accordance with another embodiment. In FIG. 4, similar to the embedded magnetic device 100, shown in FIGS. 1A and 1B, the embedded magnetic device 200 includes a base substrate 102, a base substrate first surface 104 defining a feature 106 which defines in part a cavity 231, a first conductive pattern 108 on the base substrate first surface 104 and the feature 106, a second substrate 212 including a second substrate second surface 214, a second substrate first surface 215 opposite the a second substrate second surface 214, and a second conductive pattern 216 on the second substrate second surface 214. However, in this embodiment, the core 110 is relatively large based at least in part on its application. Accordingly, a second feature 206 which defines in part the cavity 231 depends from the second substrate second surface 214 to facilitate accommodation of a portion of the core 110 that extends above the base substrate first surface 104 when disposed in the cavity 231.

The second feature 206 defines a second groove of revolution 222 about an axis 107 perpendicular to the second substrate second surface 214, shown in FIG. 4 in relief as the second substrate 212 is shown as an example of a relatively thin structure. The second feature 206 defines a depression (not shown) in the surface of the second substrate 212 opposite the second substrate second surface 214. The second groove of revolution 222 defines a second feature outer surface 219 surrounding a second groove hub (mostly hidden from view) including a second groove periphery 221 of the second substrate second surface 214. The second substrate 212 further includes the second conductive pattern 216 disposed on the second feature 206. The base substrate 102 and second substrate 212 are placed in cooperative engagement so as to define the cavity 231 defined by the feature 106 defining a groove of revolution and the second groove of revolution 222.

As shown, the second conductive pattern 216 is disposed to at least partially cover a second feature outer surface 219 of the second feature 206 and about a second groove periphery 221 of the second substrate second surface 214 so as to substantially correspond to complementary elements on the base substrate 102. As previously described, the second conductive pattern 216 and the first conductive pattern 108 are electrically interconnected suitable for a particular purpose substantially as described above.

Embodiments of embedded magnetic devices are provided below by way of example only, and the embodiments in accordance with the disclosed subject matter are not limited thereto. By way of example, but not limited thereto, in the embodiment of FIG. 4, the second conductive pattern 216 may be disposed on the surface of the second substrate 212 that is opposite the second substrate second surface 214 and within the depression (not shown) discussed above.

Figure 5A:
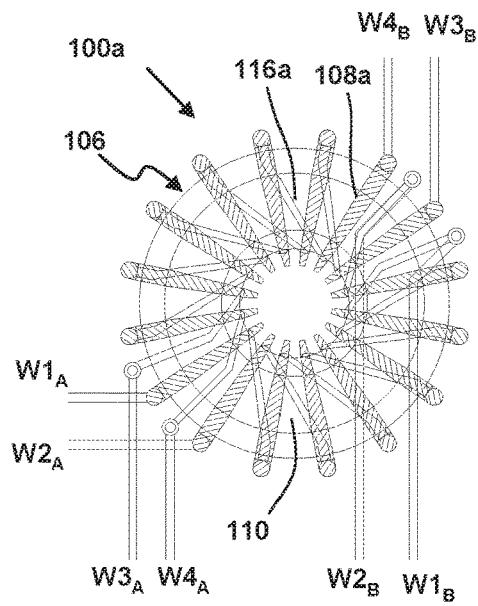
FIG. 5A is a circuit illustration as a superimposed image of an embodiment of an embedded magnetic device including a base substrate having a feature, a first conductive pattern, core, a second substrate, and a second conductive pattern.
Figure 5B:
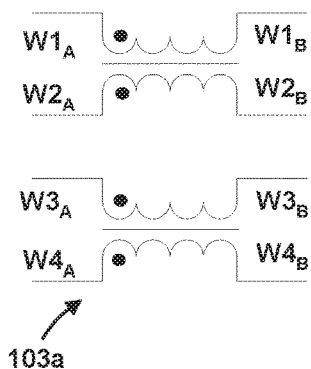
FIG. 5B is a dual common mode filter schematic representative of the functionality of the embodiment of FIG. 5A.

FIG. 5A is a circuit illustration as a superimposed image of an embodiment of an embedded magnetic device 100a including a base substrate (not shown) having a feature 106, a first conductive pattern 108a, core 110, a second substrate (not shown), and a second conductive pattern 116a. The first conductive pattern 108a and the second conductive pattern 116a are electrically interconnected so as to define four interleaved electrical paths capable of facilitating a dual common mode filter functionality. FIG. 5B is a dual common mode filter schematic 103a representative of the functionality of the embodiment of FIG. 5A. It should be appreciated that the substrate is not shown and the core is shown as clear so as to not obstruct in order to better illustrate the embodiment, and in particular, the interrelationship between the first conductive pattern 108a and the second conductive pattern 116a.

The first conductive pattern 108a and second conductive pattern 116a define four circuits. A first circuit terminates at electrical taps W1A and W1B suitable for coupling with a voltage source. A second circuit terminates at electrical taps W2A and W2B suitable for coupling with a voltage source. A third circuit terminates at electrical taps W3A and W3B suitable for coupling with a voltage source. A fourth circuit terminates at electrical taps W4A and W4B suitable for coupling with a voltage source. The dots shown in FIG. 5B indicate that, in this embodiment, both W1A and W1B have the same polarity, that is, the same winding orientation. The interaction of the first and second circuits with the core 110 and the interaction of the third and fourth circuits with the core 110, and in combination, are represented schematically in FIG. 5B.

Figure 6A:
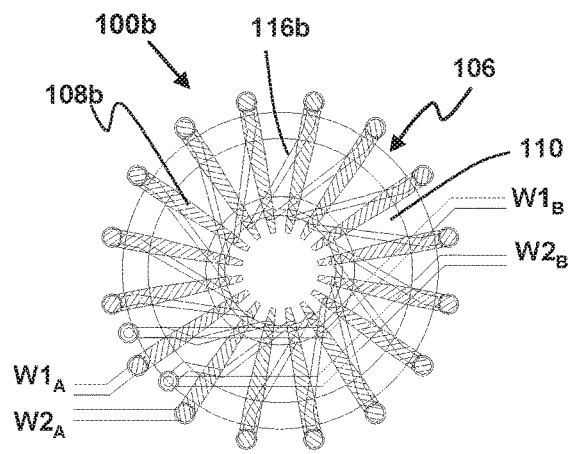
FIG. 6A is a circuit illustration as a superimposed image of an embedded magnetic device in accordance with another embodiment.
Figure 6B:
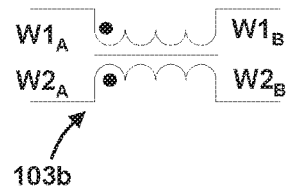
FIG. 6B is a single common mode filter schematic representative of the functionality of the embodiment of FIG. 6A.

FIG. 6A is a circuit illustration as a superimposed image of an embedded magnetic device 100b in accordance with another embodiment. In FIG. 6A, the embedded magnetic device 100b includes a base substrate (not shown) having a feature 106, a first conductive pattern 108b, a core 110, a second substrate (not shown), and a second conductive pattern 116b. The first conductive pattern 108b and the second conductive pattern 116b are electrically interconnected so as to define two interleaved electrical paths capable of facilitating single common mode filter functionality. FIG. 6B is a single common mode filter schematic 103b representative of the functionality of the embodiment of FIG. 6A. It should be appreciated that the substrate is not shown and the core is shown as clear so as to not obstruct in order to better illustrate the embodiment, and in particular, the interrelationship between the first conductive pattern 108b and the second conductive pattern 116b.

The first conductive pattern 108b and second conductive pattern 116b define two circuits. A first circuit terminates at electrical taps W1A and W1B suitable for coupling with a voltage source. A second circuit terminates at electrical taps W2A and W2B suitable for coupling with a voltage source. The interaction of the first and second circuits with the core 110, and in combination, are represented schematically in FIG. 6B.

Figure 7A:
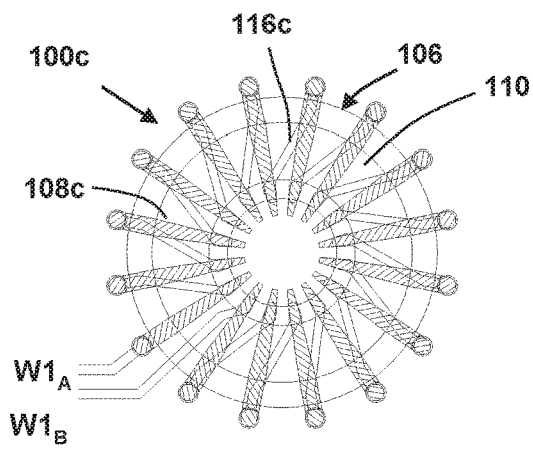
FIG. 7A is a circuit illustration as a superimposed image of an embedded magnetic device in accordance with another embodiment.
Figure 7B:
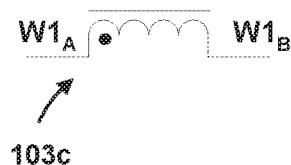
FIG. 7B is a single inductor schematic representative of the functionality of the embodiment of FIG. 7A.

FIG. 7A is a circuit illustration as a superimposed image of an embedded magnetic device 100c in accordance with another embodiment. In FIG. 7A, the embedded magnetic device 100c includes a base substrate (not shown) having a feature 106, a first conductive pattern 108c, a core 110, a second substrate (not shown), and a second conductive pattern 116c. The first conductive pattern 108c and the second conductive pattern 116c are electrically interconnected so as to define one electrical path capable of facilitating a single inductor functionality. FIG. 7B is a single inductor schematic 103c representative of the functionality of the embodiment of FIG. 7A. The first conductive pattern 108c and the second conductive pattern 116c define one circuit. The circuit terminates at electrical taps W1A and W1B suitable for coupling with a voltage source. It should be appreciated that the substrate is not shown and the core is shown as clear so as to not obstruct in order to better illustrate the embodiment, and in particular, the interrelationship between the first conductive pattern 108c and the second conductive pattern 116c. The interaction of the circuit with the core 110 is represented schematically in FIG. 7B.

FIG. 8A is a circuit illustration as a superimposed image of a magnetic device 100d in accordance with another embodiment. In FIG. 8A, the magnetic device 100d includes a base substrate (not shown) having a feature 106, a first conductive pattern 108d, a core 110, a second substrate (not shown), and a second conductive pattern 116d. The first conductive pattern 108d and the second conductive pattern 116d are electrically interconnected so as to define two interleaved electrical paths capable of facilitating a transformer functionality. FIG. 8B is an isolation transformer schematic 103d representative of the functionality of the embodiment of FIG. 8A. It should be appreciated that the substrate is not shown and the core is shown as clear so as to not obstruct in order to better illustrate the embodiment, and in particular, the interrelationship between the first conductive pattern 108a and the second conductive pattern 116d.

The first conductive pattern 108a and second conductive pattern 116d define two circuits, each having a center electrical tap CT1, CT2. A first circuit terminates at electrical taps W1A and W1B suitable for coupling with a voltage source, with a center electrical tap CT1 substantially there between. A second circuit terminates at electrical taps W2A and W2B suitable for coupling with a voltage source, with a center electrical tap CT2 substantially there between. The interaction of the first and second circuits with the core 110, and in combination, are represented schematically in FIG. 8B.

FIG. 9A is a circuit illustration as a superimposed image of an embedded magnetic device 100e in accordance with another embodiment. In FIG. 9A, the embedded magnetic device 100e includes a base substrate (not shown) having a feature 106, a first conductive pattern 108e, a core 110, a second substrate (not shown), and a second conductive pattern 116e. The first conductive pattern 108e and the second conductive pattern 116e electrically cooperate so as to be capable of facilitating magnetic properties of the core 110, and in this particular embodiment, magnetic device 100e may be capable of being utilized as three-wire common mode choke (i.e., a three-wire common mode choke functionality). FIG. 9B is a three-wire common mode choke schematic 103e representative of the functionality of the embodiment of FIG. 9A. It should be appreciated that the substrate is not shown and the core is shown as clear so as to not obstruct in order to better illustrate the embodiment, and in particular, the interrelationship between the first conductive pattern 108e and the second conductive pattern 116e.

The first conductive pattern 108e and second conductive pattern 116e define three circuits. A first circuit terminates at electrical taps W1A and W1B suitable for coupling with a voltage source. A second circuit terminates at electrical taps W2A and W2B suitable for coupling with a voltage source. A third circuit terminates at electrical taps W3A and W3B suitable for coupling with a voltage source. The interaction of the first, second and third circuits with the core 110, and in combination, are represented schematically in FIG. 9B.

The three-wire common choke is particularly useful for Ethernet applications. While the embodiment of FIG. 9A illustrates a three-wire choke, it is appreciated that a similar winding configuration may be utilized to make a 4-wire choke, 5-wire choke, on up to n-wire choke. Multi-winding chokes may be useful in applications for particular purposes.

FIG. 10A is a circuit illustration as a superimposed image of an embedded magnetic device 100f in accordance with another embodiment. In FIG. 10A, the embedded magnetic device 100f includes a base substrate (not shown) having a feature 106, a first conductive pattern 108f, a core 110, a second substrate (not shown), and a second conductive pattern 116f. The first conductive pattern 108f and the second conductive pattern 116f electrically cooperate so as to be capable of facilitating magnetic properties of the core 110, and in this particular embodiment, magnetic device 100f may be capable of being utilized as a center-tapped inductor (i.e., a center-tapped inductor functionality). FIG. 10B is a center-tapped inductor schematic 103f representative of the functionality of the embodiment of FIG. 10A. It should be appreciated that the substrate is not shown and the core is shown as clear so as to not obstruct in order to better illustrate the embodiment, and in particular, the interrelationship between the first conductive pattern 108f and the second conductive pattern 116f.

The first conductive pattern 108f and second conductive pattern 116f define one circuit having a center electrical tap.

The circuit terminates at electrical taps W1A and W1B suitable for coupling with a voltage source, with a center electrical tap CT substantially there between. The interaction of the first conductive pattern 108*f*, second conductive pattern 116*f*, and the center electrical tap with the core 110 is represented schematically in FIG. 10B.

The above embodiments are simply examples of various modes of electrical interconnection of the first and second conductive patterns and are not limited thereto. It is appreciated that a similar winding configuration may be utilized to make an inductor with 2, 3 or N-number of electrical taps.

In various embodiments, one or more embedded magnetic devices may be formed on a single substrate. Additionally, because the magnetic properties of an embedded magnetic device may be based at least in part on its conductive pattern, its feature size, permeability material utilized, and/or so forth, more than a single type of embedded magnetic device may be formed from a single base substrate, and accordingly, the claimed subject matter is not limited in these respects.

Figure 11:
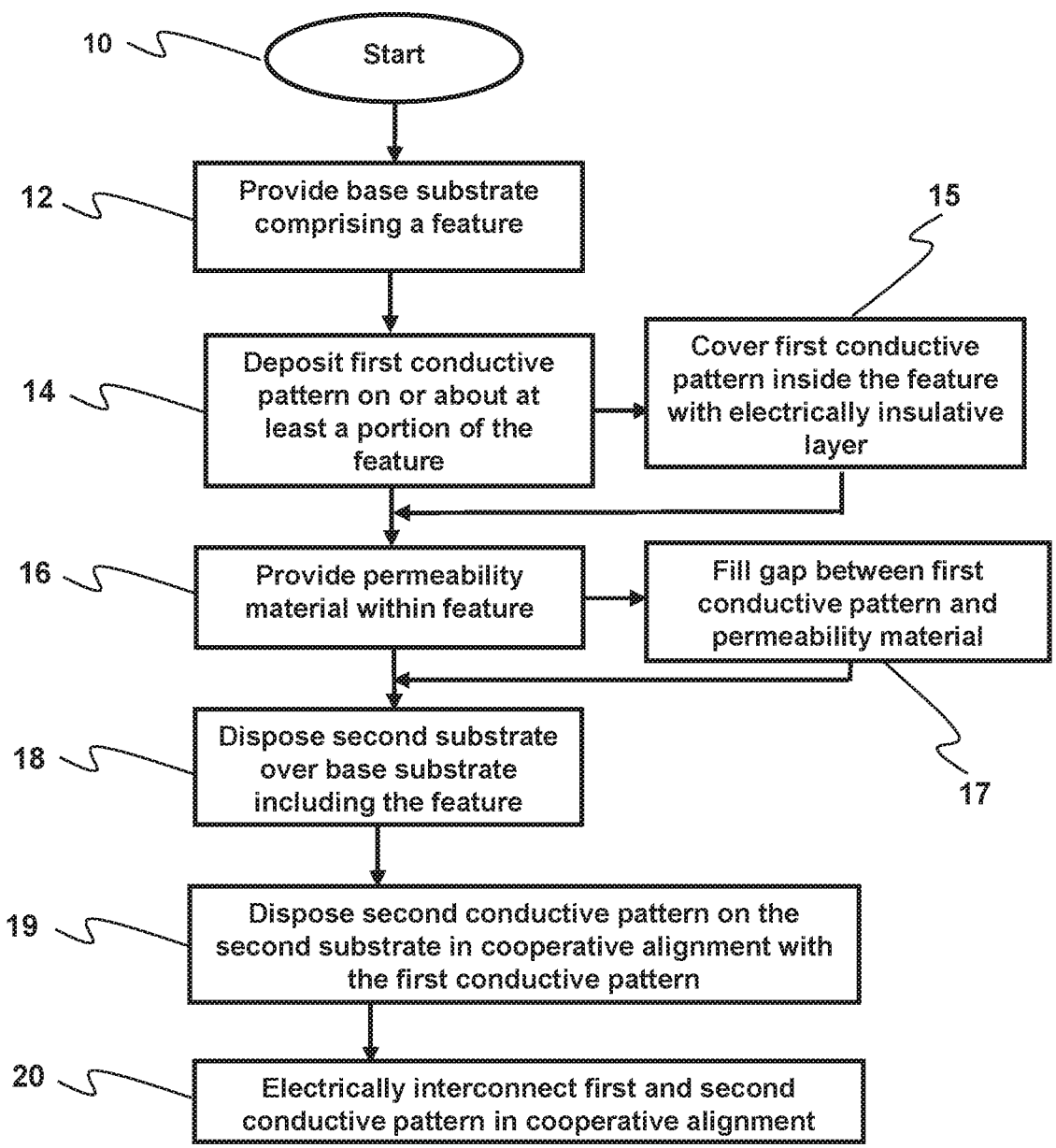
FIG. 11 is a flow diagram of an embodiment of a process for producing a magnetic device.

FIG. 11 is a flow diagram of an embodiment of a process 10 for producing a magnetic device. The process 10 comprises providing a base substrate including a feature 12. As previously described, the base substrate may comprise a wide variety of materials that may be utilized for PCBs. The base substrate includes the feature formed on the base substrate utilizing a wide variety of processes as previously described. A first conductive pattern is disposed on and about at least a portion of the feature and the base substrate 14. A core 110 is disposed within the feature 16. A second substrate is disposed over the core and the base substrate 18. A second conductive pattern is disposed on the second substrate 19 and electrically coupled to the first conductive pattern, thereby facilitating a one or more winding electric circuits of the conductive patterns around the core 20.

In accordance with another embodiment of the process 10, after the conductive pattern is disposed over the feature and the base substrate 14, the conductive pattern is covered with an electrically insulative layer 15. The electrically insulative layer is operable, among other things, to prevent electrical shorting between the core and the first conductive pattern.

In accordance with another embodiment of the process 10, after the core is disposed within the feature 16, a gap defined between the core and the feature is filled with an encapsulate material that is electrically insulative 17. The encapsulate material may be operable for, among other things, coupling the core within the feature and to prevent shifting thereof.

In some of the above embodiments the feature has tapered sidewalls so as to allow for line-of-sight-dependent conductive material deposition processes. Further embodiments are presented below wherein magnetic devices need not have features having tapered sidewalls.

Figure 12:
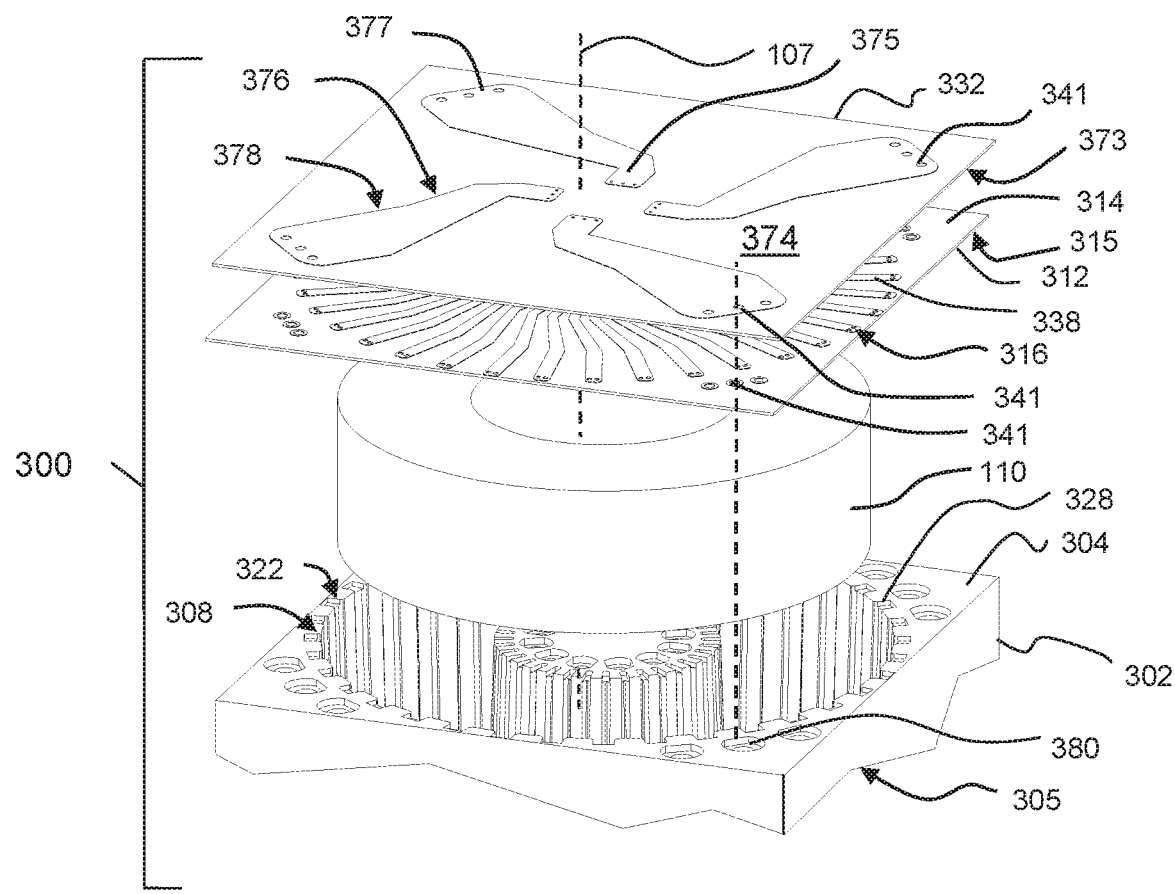
FIG. 12 is an exploded perspective view of an embodiment of an embedded magnetic device.

FIG. 12 is an exploded perspective view of an embodiment of an embedded magnetic device 300. The embedded magnetic device 300 comprises a base substrate 302, a first conductive pattern 308, a core 110, a second substrate 312, a second conductive pattern 316, a top substrate 332, a top conductive pattern 376 and a secondary conductive pattern hidden from view. As will be described in detail below, conductive patterns formed on the base substrate 302, the second substrate 312, and top substrate 332 define one or more winding electrical circuits surrounding the core 110 so as to impart magnetic properties to the core 110 when the one or more electrical circuits are energized by a voltage source.

The embodiment of FIG. 12 illustrates the modularity of the methods and apparatus of embedded magnetic devices in accordance with embodiments of the disclosed subject matter. This modularity provides the flexibility of producing embedded magnetic devices having predetermined functionality. By way of example, providing the top substrate 332 as shown in FIG. 12, is useful, by way of example but not limited thereto, for providing power transformer functionality to the embedded magnetic device, where there is defined a primary and secondary winding. By way of another example, only the base substrate 302 and second substrate 312 may be used, by way of example but not limited thereto, for providing inductor functionality to the embedded magnetic device, where only a primary or single winding is defined.

The second substrate 312 and top substrate 332 are substantially similar to the second substrate 112 of the embodiment of FIG. 1A. Similarly, as previously described, the second conductive pattern 316 and top conductive pattern 376 may be disposed on the second substrate 312 and top substrate 332, respectively, utilizing a variety of processes such as, but not limited to, a lamination process, lithography process, etching process, a screen printing process, a laser structuring process, molding process, and so forth. That is, the second conductive pattern 316 and top conductive pattern 376 may be disposed as part of the process of providing the second substrate 312 and top substrate 332, respectively, and accordingly, the claimed subject matter is not limited in these respects.

The base substrate 302 of the embodiment of FIG. 12 is suitable for an embedded magnetic device having a primary and secondary winding electric circuit. FIGS. 13A-D are top perspective, top, bottom perspective, and bottom views, respectively, of the base substrate 302 of the embodiment of FIG. 12. The base substrate 302 defines a first base surface 304 and a second base surface 305 opposite the first base surface 304. Depending from the first base surface 304 is a feature defining a winding cup 306. The winding cup 306 may be disposed into the first base surface 304 by any suitable method including, but not limited to, machining and molding processes as previously described.

The winding cup 306 defines a groove of revolution about an axis 107 perpendicular to the first base surface 304. The winding cup 306 defines a winding cup surface 309 surrounding a hub 320. The winding cup surface 309 defines a winding cup bottom 345, a cup inner wall 319 and a cup outer wall 329 contiguous with the winding cup bottom 345. It is appreciated that in other embodiments, the cup inner wall 319 and cup outer wall 329 may be contiguous with each other and with no winding cup bottom as dictated by design preference. The hub 320 extends from the first base surface 304 to the winding cup bottom 345 of the winding cup 306. The hub 320 defines a hub top surface 324 that is substantially coplanar with the first base surface 304.

Figure 13A:
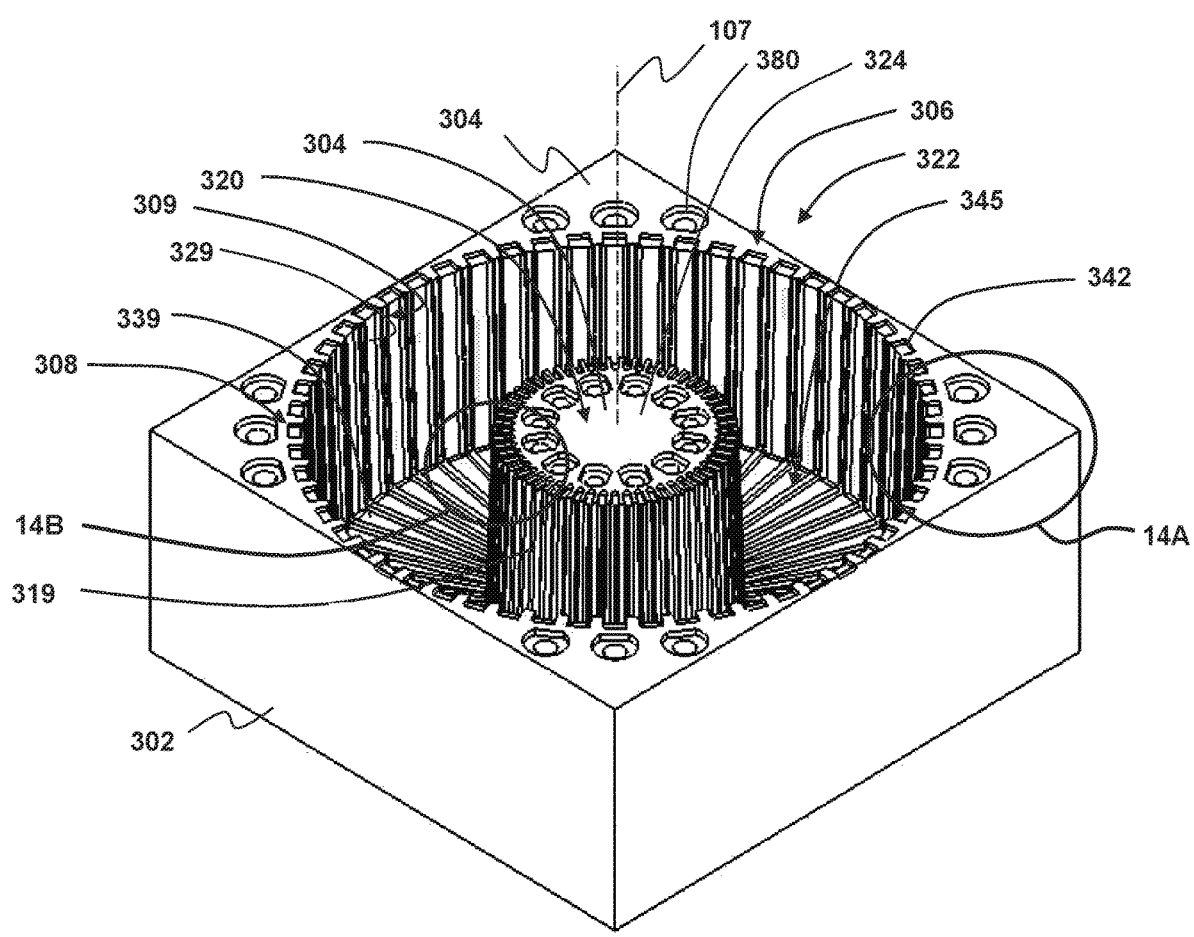
FIGS. 13A-D are top perspective, top, bottom perspective, and bottom views, respectively, of the base substrate of the embodiment of FIG. 12.
Figure 13B:
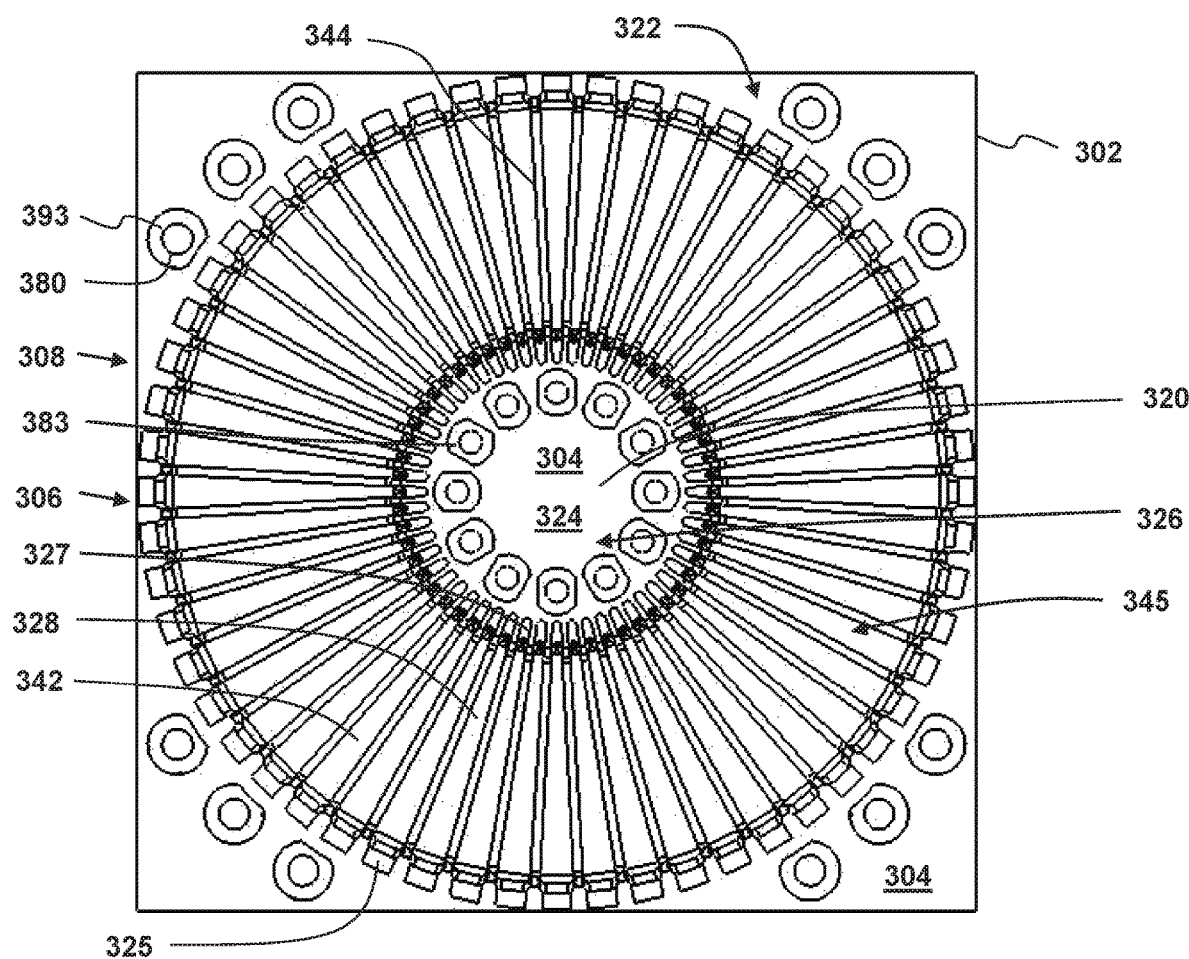

As shown in FIG. 13B, the winding cup 306 defines a winding cup periphery surface portion 322 on the first base surface 304. The hub top surface 324 defines a hub periphery surface portion 326. The winding cup periphery surface portion 322 and the hub periphery surface portion 326 are those portions where a portion of the first conductive pattern 308 is disposed on the respective surfaces.

Figure 14A:
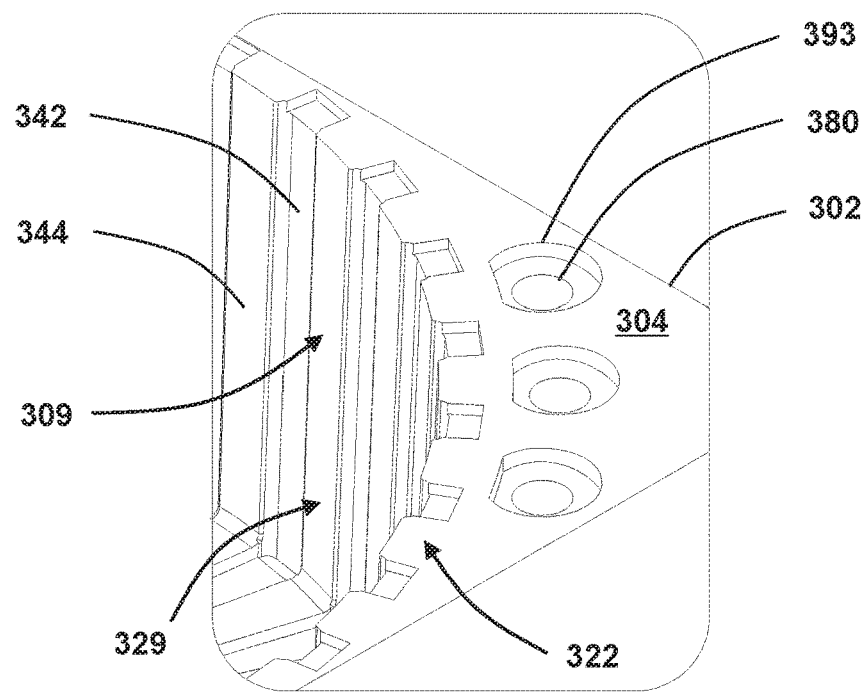
FIGS. 14A and 14B are close-up detailed perspective views of the winding cup periphery surface portion and the hub periphery surface portion, respectively, in accordance with the embodiment of FIG. 13A.
Figure 14B:
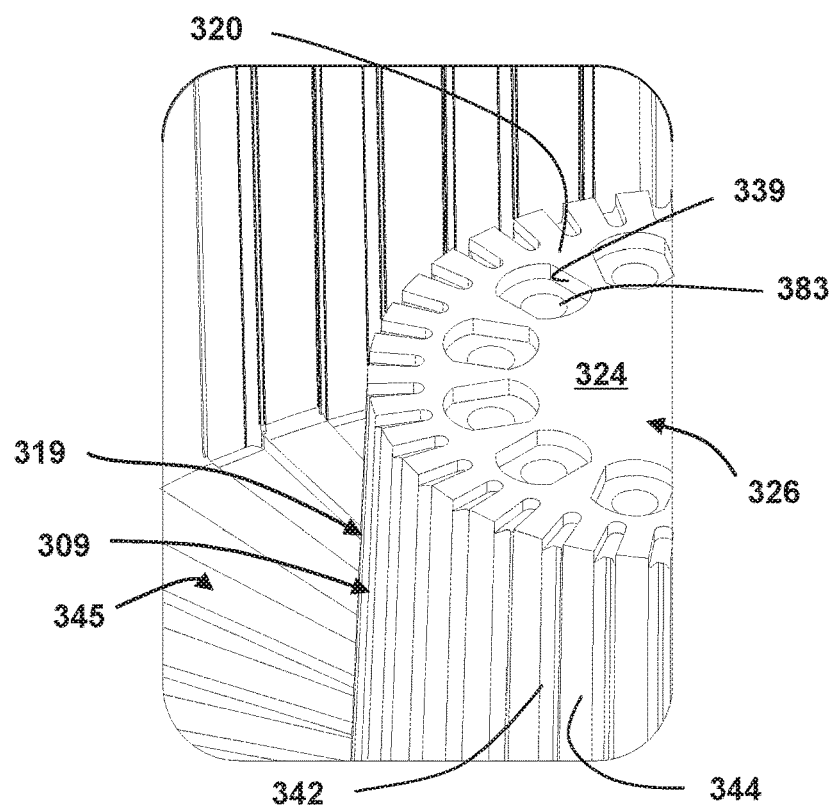

The winding cup surface 309 defines a plurality of winding cup channels 342 depending from the winding cup surface 309 and winding cup lands 344, best shown in FIGS. 14A and 14B, each of which are continuous from the winding cup periphery surface portion 322 to the hub periphery surface portion 326 of the hub top surface 324. As will be discussed below, each of the winding cup channels 342 will have conductive material disposed within so as to define a portion of an electrical circuit.

The winding cup channels 342 may be produced in the winding cup 306 by any suitable method such as, but not limited to, machining and molding processes. For example, a machining process may be used wherein the winding cup 306 is provided in the base substrate 302 by a process separate from the process of forming the winding cup channels 342. In another example, a molding process may be used wherein the winding cup 306 and winding cup channels 342 are provided in the base substrate 302 by the same process. A mold may be provided with features so as to simultaneously create the winding cup 306 and winding cup channels 342.

FIGS. 14A and 14B are close-up detailed perspective views of the winding cup periphery surface portion 322 and the hub periphery surface portion 326, respectively, in accordance with the embodiment of FIG. 13A. The winding cup channels 342 provide a surface upon which conductive material may be disposed so as to define a conductive pattern, as will be described below. The winding cup lands 344 provide an electrically insulative separation between each winding cup channel 342. The resulting first conductive pattern 308, shown in FIG. 13B, is also referred herein as a "half winding".

Referring again to FIGS. 13A and 13B, in accordance with an embodiment of a method to dispose conductive material into the winding cup channels 342, an electrically conductive material is deposited onto the winding cup surface 309, including the winding cup lands 344. The deposition process may be any of a plurality of processes, such as, but not limited to, plating and vapor deposition. The electrically conductive material may be any suitable material for the particular purpose, such as, but not limited to, copper, gold and silver. It is appreciated that selected regions of the base substrate 302 may be covered with the conductive material or substantially the entire base substrate 302 may be covered with the conductive material. The electrically conductive material substantially coats the winding cup surface 309 but does not necessarily have to substantially "fill-in" the winding cup channels 342. Etch resist material, such as, but not limited to, that known in PCB and semiconductor processing arts, is disposed over the conductive material. Many known techniques may be utilized to dispose the etch resist material, such as, but not limited to, sprayed, dip coated, vacuum laminated, electro-deposited, sputtering and thermal deposition processes.

Figure 15A:
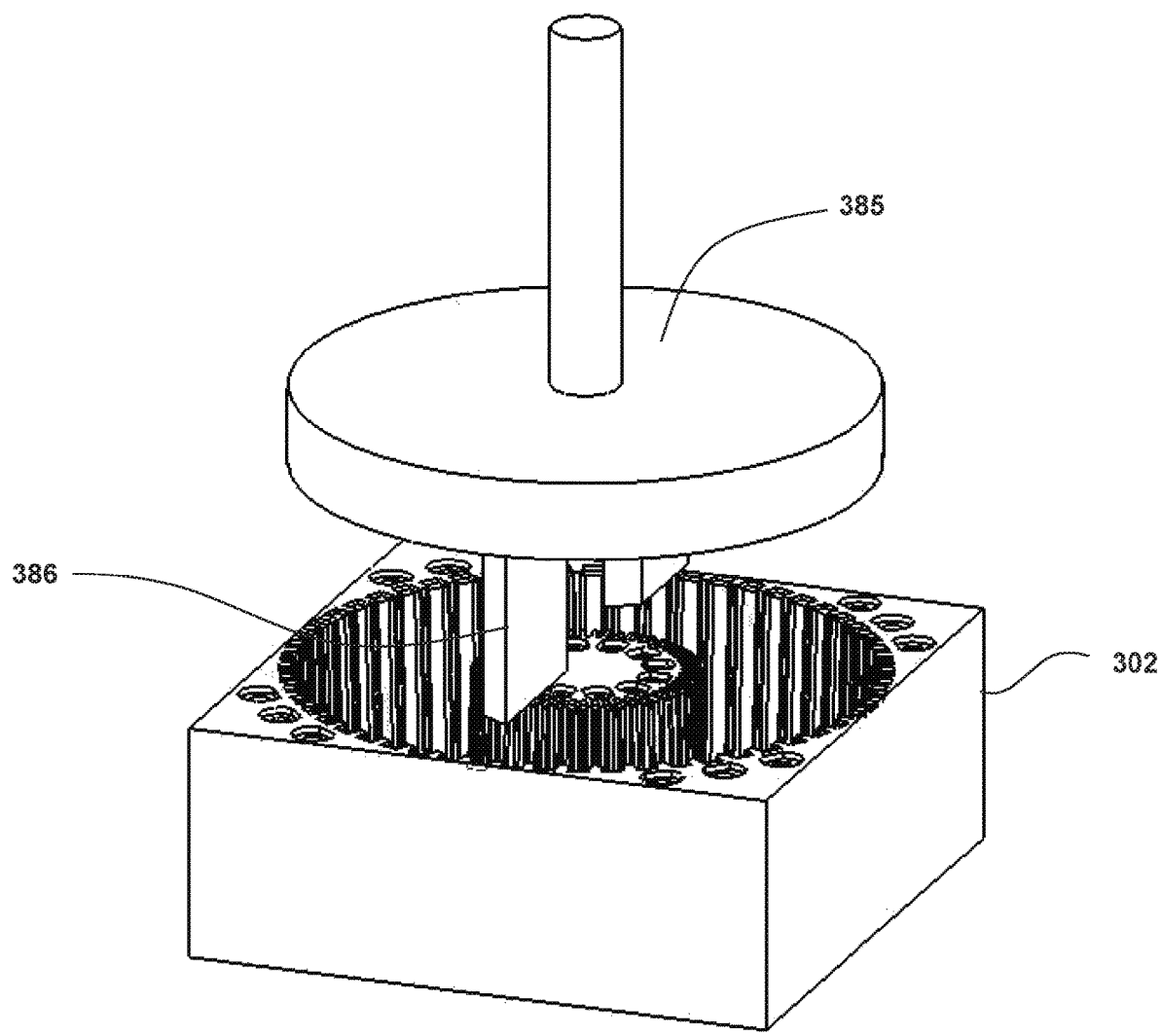
FIGS. 15A and 15B are perspective and cross-sectional views, respectively, of a milling tool in accordance with an embodiment.
Figure 15B:
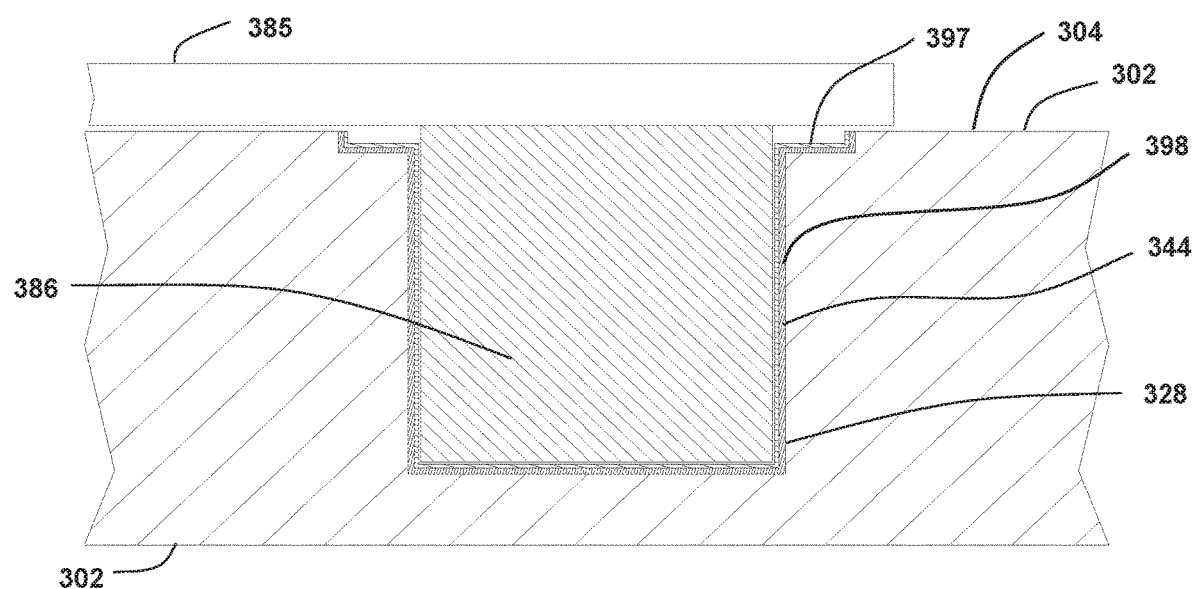

FIGS. 15A and B are perspective and cross-sectional views, respectively, of a milling tool 385 in accordance with an embodiment. The milling tool 385 may be used to preferentially remove etch resist material 397 from the winding cup lands 344, shown in FIG. 14A, so as to expose the conductive material 398 thereon. The milling tool 385 may be any suitable tool suitable for the particular purpose, such as, but not limited to a conventional end-mill cutter. In the embodiment of FIGS. 15A-B, the milling tool 385 has one or more blades 386 that conform to the winding cup surface 309 so as to remove the etch resist material 397 and/or the conductive material 398 deposited on the winding cup lands 344. It is understood that the blades 386 may facilitate a cutting or grinding action so as to remove the etch resist material and/or the conductive material 398 deposited on the winding cup lands 344.

It is understood that etch resist material and/or conductive material may be removed from a substrate using any suitable process, such as but not limited to, mechanical and chemical processes. Mechanical processes include, but not limited to, tools to affect grinding, cutting, abrading, milling and/or other mechanical removal process used to physically remove the target material. Chemical processes include, but not limited to, solvent, acid and aqueous solutions used to dissolve the target material.

Wherein only the etch resist material 397 is removed from the winding cup lands 344, the base substrate 302 is subsequently exposed to a process to remove the exposed conductive material 398 from the winding cup lands 344 so as to expose the base substrate material thereon. Thus is provided an insulative feature between each of the plurality of winding cup channels 342, each having conductive material 398 contained therein defining a first conductive trace 328. Wherein the conductive material 398 does not substantially fill in the winding cup channel 342, leaving the etch resist material 397 on the conductive material 398 in the winding cup channels 342 may serve as an electrical insulator which may be useful for electrically isolating the conductive material 398 from the core.

A subsequent process, such as, but not limited to a mechanical or chemical process, to remove the remaining etch resist material 397 from the base substrate 302 may be performed so as to expose the conductive material 398 in the winding cup channels 342.

Figure 14C:
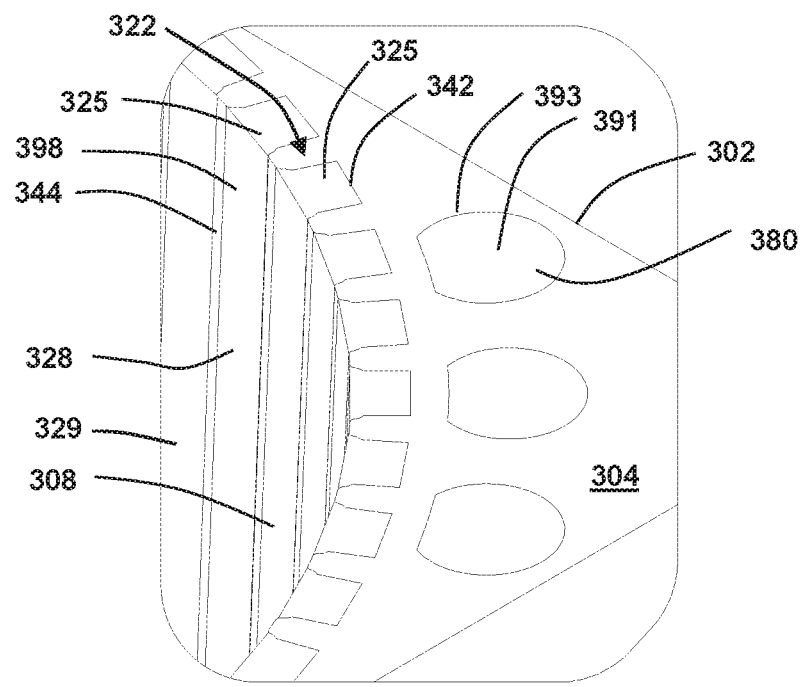
FIGS. 14C and 14D are close-up detailed perspective views of the winding cup periphery surface portion and the hub periphery surface portion, respectively, in accordance with the embodiment of FIG. 12.
Figure 14D:
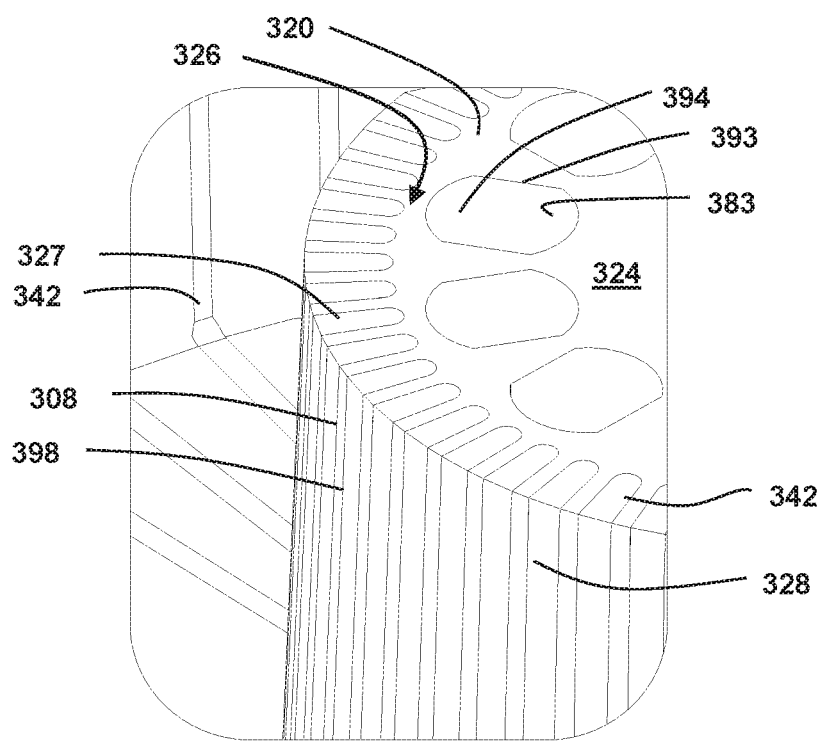

FIGS. 14C and 14D are close-up detailed perspective views of the winding cup periphery surface portion 322 and the hub periphery surface portion 326, respectively, in accordance with the embodiment of FIG. 12. In the embodiments of FIGS. 14C and 14D, the winding cup channels 342 are filled-in with either conductive material 398 or etch resist with an underlying layer of conductive material.

By way of example, wherein the winding cup 306, as shown in FIG. 13A, defines an oval or other geometric shape, an end-mill tool, for example, may be utilized to remove the etch resist material 397 from the winding cup lands 344.

Figure 16:
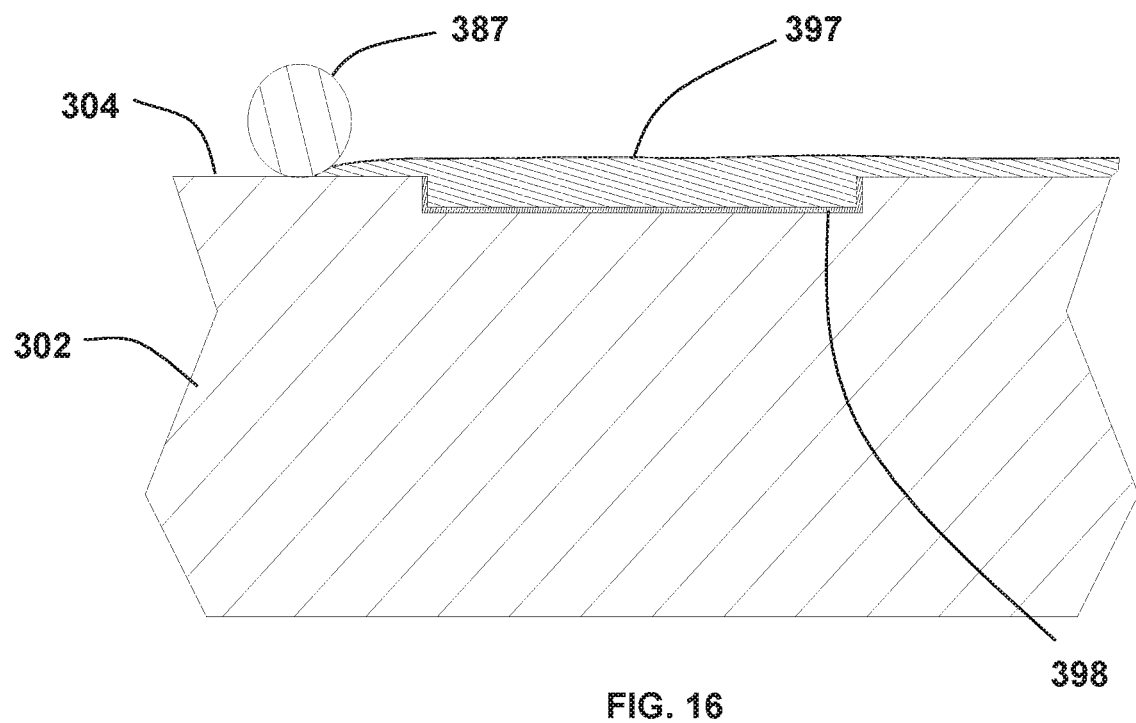
FIG. 16 is a cross-sectional view of an abrasive tool and work piece, in accordance with an embodiment.

FIG. 16 is a cross-sectional view of an abrasive tool 387 and work piece, in accordance with an embodiment. Wherein the first base surface 304 is substantially planar, an abrasive tool 387 may be used to remove the etch resist material 397 from those features thereon. Such an abrasive tool 387 may be, such as, but not limited to, a roller sander, orbital sander, disc sander, wire brush and other abrasive tool useful for the removal of the etch resist material 397.

Referring also to FIG. 13B, in accordance with an embodiment, after the removal of the etch resist material 397 from the winding cup lands 344, the method further comprises removing the conductive material 398 that is exposed on the winding cup lands 344 by use of a suitable method, such as, but not limited to those methods associated with etching. After the exposed conductive material 398 is substantially removed from the winding cup lands 344, a first conductive pattern 308 that is three-dimensional and electrically conductive comprises a plurality of first conductive traces 328 that are discontinuous and radiate from about the axis 107 is defined. The first conductive traces 328 are disposed from the hub periphery surface portion 326 to the winding cup periphery surface portion 322 along the winding cup channels 342 there between. Each of the first conductive traces 328 comprise a trace hub end 327 that is associated with the winding cup periphery surface portion 322 and a trace winding cup periphery end 325 that is associated with the hub periphery surface portion 326, also shown in FIGS. 14C and 14D. In accordance with an embodiment, the first conductive pattern 308 is a "half winding" of an inductive device. As will be explained below, the resulting half winding will be associated with a complementary conductive pattern so as to produce a complete winding-type electric circuit structure.

Figure 13C:
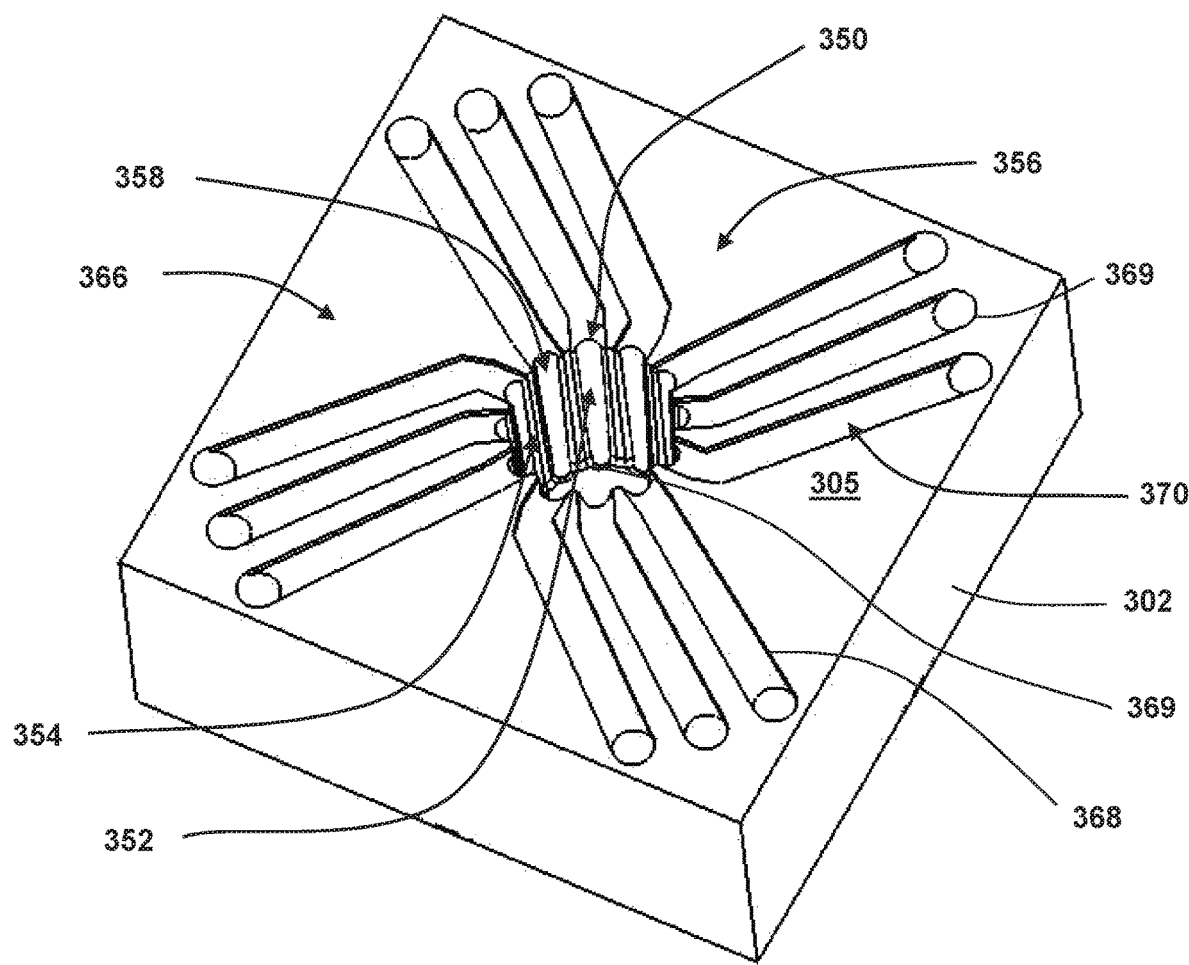
Figure 13D:
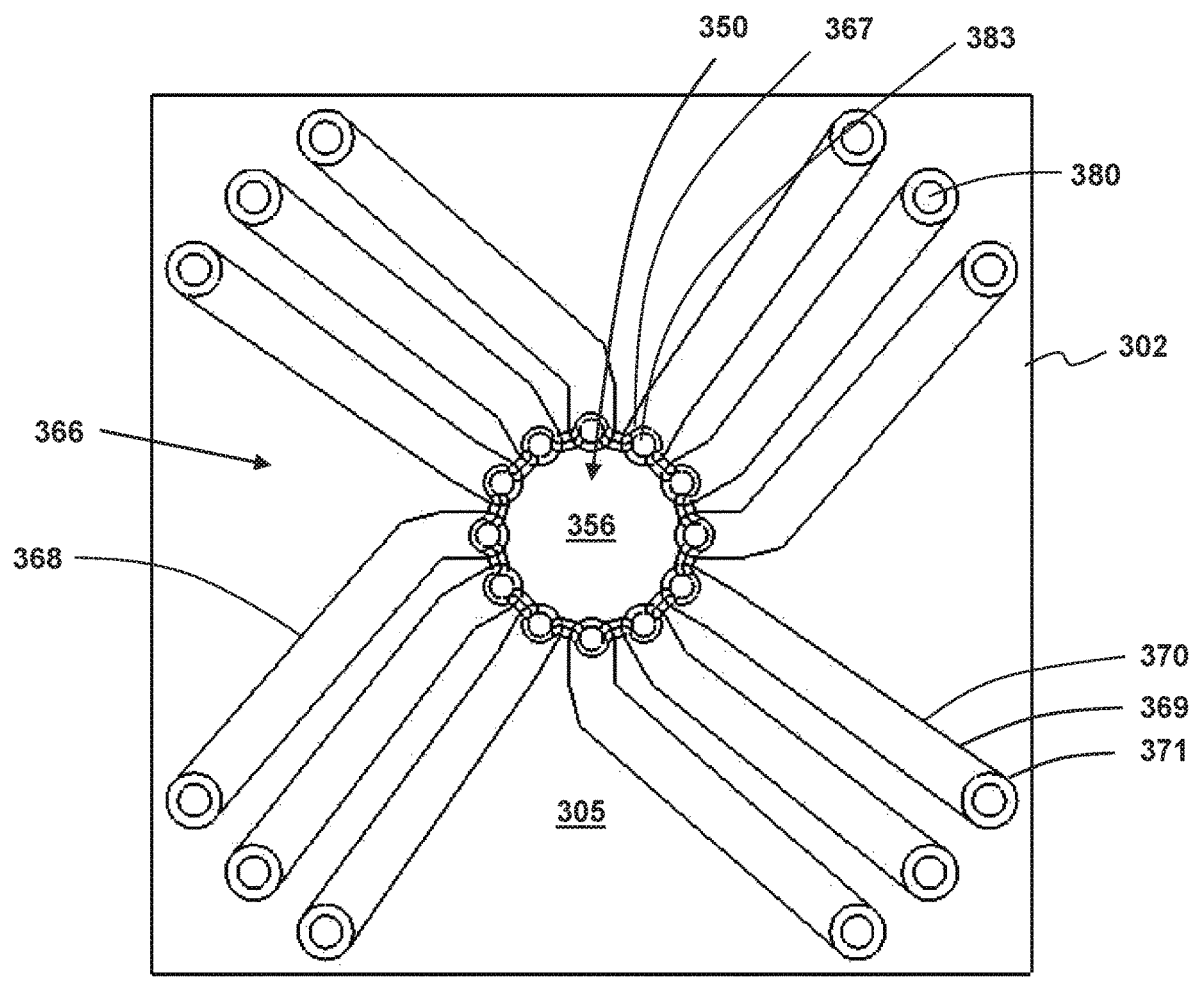

FIGS. 13C and 13D are bottom and bottom perspective views of the base substrate 302, in accordance with the embodiment of FIG. 12. In this embodiment, the hub 320, as shown in FIG. 13A, is hollow; that is, a hub recess 350 depends from the second base surface 305 having an axis substantially coaxial with that of the hub 320 defining a hub recess surface 358 and a hub recess bottom surface 356. The hub recess surface 358 is provided with hub recess channels 352 substantially similar to those of the winding cup surface 309 of FIG. 13A, that extend from the hub recess bottom surface 356 to the second base surface 305. The hub recess surface 358 defines the plurality of hub recess channels 352 depending from the hub recess surface 358 defining hub recess lands 354. Radiating from each of the hub recess channels 352 is a second base surface channel 370 that terminates at a second base surface second channel end 371.

An electrically conductive material 398 is disposed in the hub recess channels 352 and the second base surface channels 370 so as to define a plurality of secondary conductive traces 368 of a secondary winding pattern 366 terminating at a secondary conductive trace first end 367 and a secondary conductive trace second end 369. The deposition of the electrically conductive material 398 is substantially similar to the process for depositing the conductive material 398 disposed in the winding cup channels 342 of FIG. 13A. The hub recess lands 354 are void of conductive material 398 so as to provide an electrically insulating function between the hub recess channels 352. The resulting secondary winding pattern 366 defines a portion of a secondary winding.

The second conductive traces 338 of the secondary winding pattern 366 are electrically interconnected on the first base surface 304 of FIG. 13A with complementary conductive traces or circuitry by electrical interconnects, referred to herein as vias, that transcend through the base substrate 302. Referring to FIGS. 13B, 14A and 14C, second end vias 380 are provided that extend from the first base surface 304 adjacent the winding cup 306 through to the second base surface 305 intersecting the second base surface second channel end 371 and therefore the second conductive trace second end 339, as shown in FIG. 13D. As shown in FIGS. 14A and 14C, a winding cup periphery pad 391 may be formed within a pad depression 393 into which conductive material may be disposed. At the first base surface 304, the second end via 380 terminates at a winding cup periphery pad 391. The winding cup periphery pad 391 may provide a greater surface area to affect electrical interconnection with complementary conductive traces. The second end via 380 may be disposed in the base substrate 302 by any known method. By way of example, a method known in the art involves drilling a bore from one surface to another and coating the inside of the bore or filling the bore with electrically conductive material providing an electrical conduit there between.

Similarly, electrical interconnects are provided on the hub 320. Referring to FIGS. 13B, 13D, 14B and 14D, hub vias 383 are provided as electrical interconnects that extend from the hub top surface 324 through to the hub recess bottom surface 356 intersecting the secondary conductive trace first end 367, as shown in FIGS. 13C and 3D. At the hub top surface 324, the hub vias 383 terminates at a hub pad 394. The hub pad 394 may provide a greater surface area to affect electrical interconnection with complementary conductive traces. The hub vias 383 may be disposed in the base substrate 302 by any known method as described above.

As shown in FIGS. 14B and 14D, the hub pad 394 may be formed within a pad depression 393 into which conductive material may be disposed. It is understood that the configuration of the end of the hub vias 383 may be modified suitable for a particular purpose. The end of the hub vias 383 may be flush with the respective surface or may be recessed. Similarly, if a hub pad 394 is provided, the hub pad 394 may be flush with the respective surface or may be recessed suitable for a particular purpose.

Figure 17:
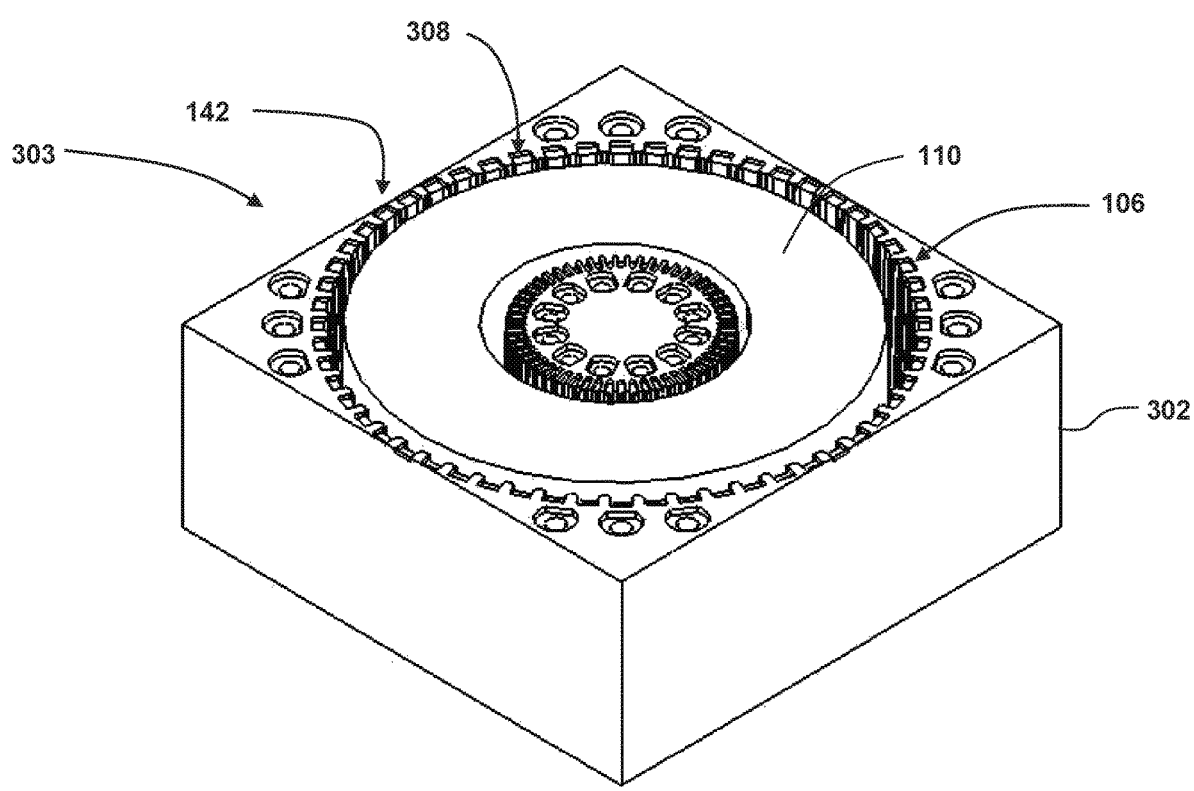
FIG. 17 is a top perspective view of an assembly comprising the base substrate and a core disposed within the winding cup of the embodiment of FIG. 12.

FIG. 17 is a top perspective view of an assembly 303 comprising the base substrate 302 and a core 110 disposed within the winding cup 306 of the embodiment of FIG. 12. In the embodiment of FIG. 17, the core 110 has a toroidal shape that corresponds to the shape of the winding cup 306. It is understood that other core shapes, including, but not limited to, square and oval, may be used is a complementary-shaped winding cup.

Although the core 110 and the winding cup 306 may, in some embodiments, have a complimentary close fit, a gap 142 may be defined there between. In accordance with further embodiments, an encapsulate material that is electrically insulative is disposed within the gap 142 between the core 110 and the winding cup 306. Suitable encapsulate materials are known in the art and include, but not limited to, certain types of epoxy fill material. Filling the gap 142 may provide a number of benefits, such as, but not limited to, centering the core 110 within the winding cup 306, electrically insulating the core 110 from the first conductive patterns 308, and fixing the position of the core 110 to prevent movement thereof.

Figure 18:
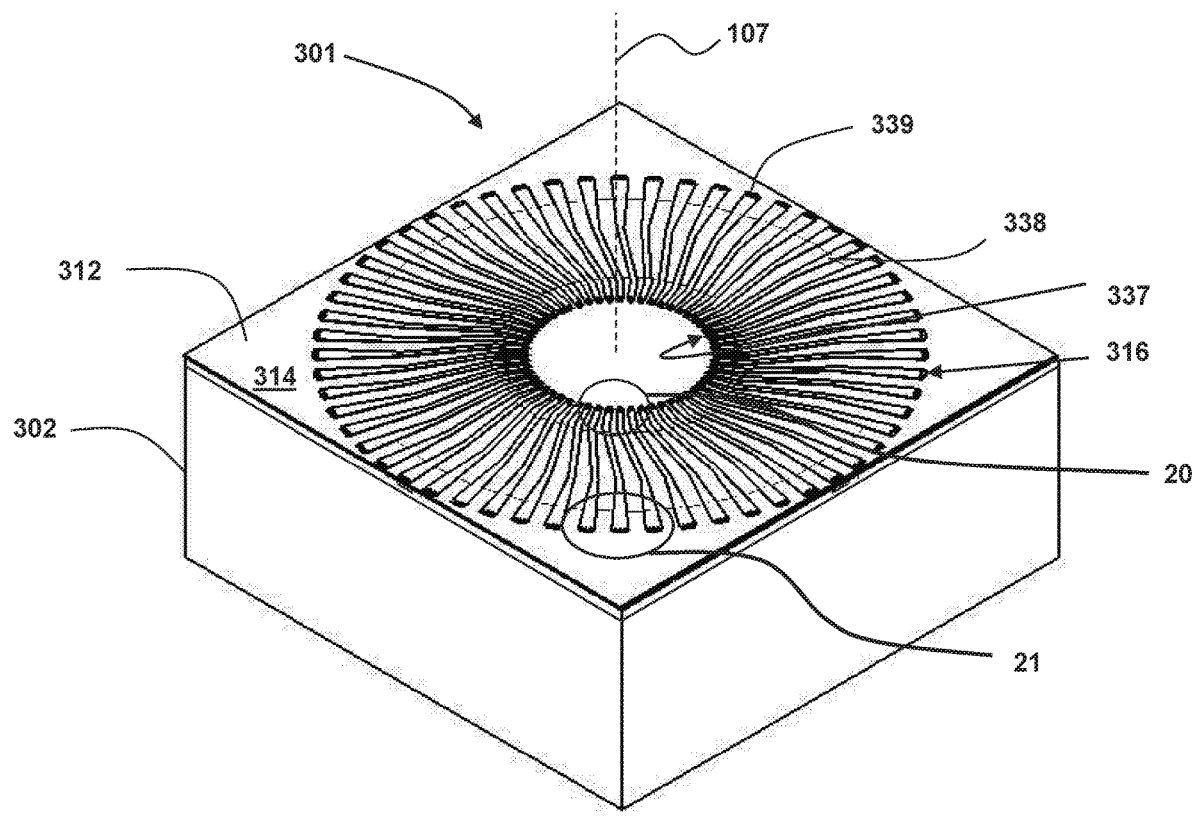
FIG. 18 is a top perspective view of a magnetic device comprising the base substrate and the second substrate, in accordance with an embodiment.

FIG. 18 is a top perspective view of a magnetic device 301 comprising the base substrate 302 and the second substrate 312, in accordance with an embodiment. Also referring to FIGS. 12, 13A and 13B, after the core 110 is disposed within the winding cup 306, unless an air-core is used, the second substrate 312 is coupled to the first base surface 304 of the base substrate 302 and in complementary alignment with the first conductive pattern 308. The first conductive pattern 308 on the first base surface 304 and the second conductive pattern 316 on the second substrate second surface 314 are caused to become into electrical communication with each other so as to define a primary winding, as will be described below. In accordance with embodiments, vias are provided within the second substrate 312 that extend from the second conductive pattern 316 on the second substrate 312 to the second substrate first surface 315 to the first conductive pattern 308 on the winding cup 306. The vias comprise an electrically conducting material so as to form electrical interconnects between the first conductive pattern 308 and the second conductive pattern 316.

Vias are known in the art as an element that transcends one or more insulative layers or substrates (such as circuit boards) so as to interconnect electrical elements thereon. In accordance to embodiments, vias are produced by any method suitable, such as, but not limited to, drilling, and then plating or filling the resulting bore with an electrically conductive material. The electrically conductive material provides an electrical interconnect between the respective conductive patterns. It is understood that the configuration of the end of the via may be modified suitable for a particular purpose. The end of the via may be flush with the respective surface or may be recessed. Similarly, if a pad is provided, the pad may be flush with the respective surface or may be recesses suitable for a particular purpose.

The second conductive pattern 316 is operable to be associated with the first conductive pattern 308 on the hub periphery surface portion 326 and the winding cup periphery surface portion 322 shown in FIG. 13B. In accordance with embodiments, trace hub end 327 is electrically coupled to the second conductive trace first end 337 and the trace winding cup periphery end 325 is electrically coupled to the second conductive trace second end 339.

The second conductive pattern 316 comprises a plurality of second conductive traces 338 that are discontinuous and radiate from about the axis 107. The second conductive traces 338 comprise a second conductive trace first end 337 positioned closest to the axis 107 and a second conductive trace second end 339, opposite the second conductive trace first end 337. The number of second conductive traces 338 is determined by the number of first conductive traces 328 and for a particular purpose. In accordance with embodiments, including that shown in FIG. 12, the number of second conductive traces 338 is equal to the number of first conductive traces 328. In the embodiment of FIG. 12, the second conductive traces 338 radiate from about the axis 107 such that a second conductive trace first end 337 is aligned above a trace hub end 327, shown in FIG. 14D, of a first conductive trace 328, and a second conductive trace second end 339 is aligned above a trace winding cup periphery end 325 of an adjacent first conductive trace 328, shown in FIG. 14C, when the second conductive pattern 316 and the second substrate 312 are coupled to the base substrate 302.

It is appreciated that the second substrate 312 including the second conductive pattern 316 may be provided by any of a number of methods. For example, in the previous embodiment the second substrate 312 may be provided as a unitary element in the form of a printed circuit board that may be coupled to the first base surface 304 of the base substrate 302 using a laminating process. In other embodiments, the second substrate 312 and the secondary winding pattern 366 may be coupled to the base substrate 302 in separate processes. For example, the second substrate 312 may be an electrically insulative layer that is molded, sprayed or printed onto the first base surface 304 of the base substrate 302 and over any encapsulate material and the core 110. The second conductive pattern 316 may subsequently be molded, sprayed or screen printed onto the second substrate 312, for example.

In accordance with embodiments, the second substrate 312 is a printed circuit board (PCB) having a second conductive pattern 316 that is complementary to the first conductive pattern 308 of the winding cup 306. As with the base substrate 302, similar processes may be used to provide the second conductive pattern 316. For example, but not limited thereto, the second conductive pattern 316 may be produced using a plating technique or a layering technique, wherein a plated metallic surface or a thin layer of conductive material may be applied in a subsequent plating step. In another example, not limited thereto, the conductive material may be provided as a plating layer that is photo-imaged and etched using conventional printed circuit assembly techniques.

Multiple substrate and conductive layers may be added, as warranted by the design.

Figure 19:
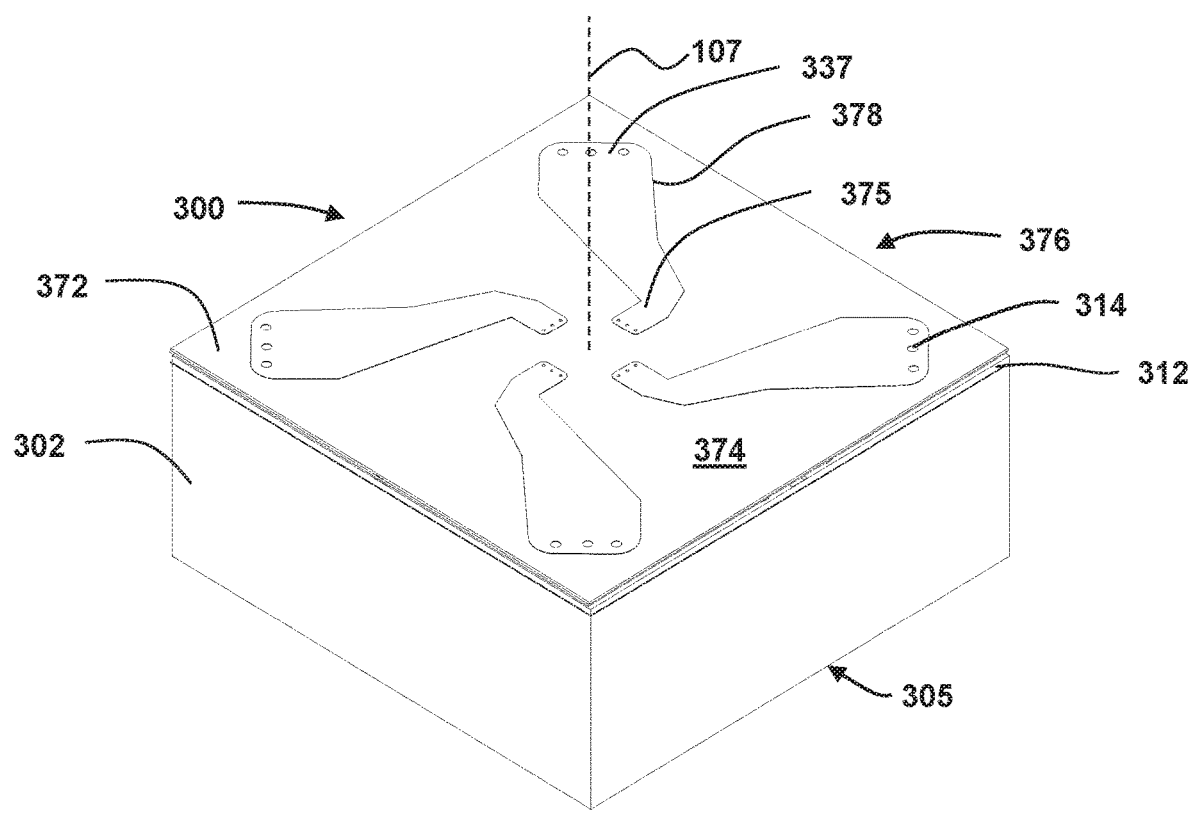
FIG. 19 is a top perspective view of a magnetic device of the embodiment of FIG. 12, comprising the base substrate, the second substrate, and the top substrate.

FIG. 19 is a top perspective view of a magnetic device 300 of the embodiment of FIG. 12, comprising the base substrate 302, the second substrate 312, and the top substrate 372. The secondary conductive traces 368 of the secondary winding pattern 366, shown on FIG. 13D, are electrically interconnected on the first base surface 304 with the top conductive traces 378 of the top conductive pattern 376 disposed on the top substrate second surface 374 which is opposite from the top substrate first surface 373. Substantially as described previously for the electrical interconnection of the secondary conductive traces 368 with the second conductive traces 338, vias are provided so as to electrically interconnect the top conductive traces 378 with the secondary conductive traces 368. Vias are provided to interconnect the top conductive trace first end 375 with the hub pad 394, shown in FIG. 14D, and to interconnect the top conductive trace second end 377 with the winding cup periphery pad 391 shown in FIG. 14C. The vias pass through the top substrate 372 and the second substrate 312 to the respective pad.

Referring again to FIGS. 18 and 19, the first conductive pattern 308 on the base substrate 302 and the second conductive pattern 316 on the second substrate 312 are operable to electrically define a primary winding of a magnetic device 300 of FIG. 12. The second end vias 380 in the base substrate 302 and the top conductive pattern 376 on the top substrate 332 are operable to electrically define a secondary winding of the magnetic device 300.

As described previously for the embodiments of FIGS. 5A-10B, the physical characteristics of the interconnected circuit patterns for the magnetic device 301, determines the magnetic device's electrical characteristics; for example, whether the magnetic device is an inductor, transformer or other type of component having the functionality of a conventional wire-wound configuration.

As shown in FIG. 12, the second conductive pattern 316 and corresponding first conductive pattern 308 comprises a much denser winding than the top conductive pattern 376 and corresponding secondary winding pattern 366. The winding density ratio "n" of the primary and secondary windings, respectively, may vary suitable for a particular purpose. FIG. 12 illustrates an embodiment wherein there is a large winding density ratio between the primary and secondary windings. By way of examples, but not limited thereto, in power converter designs, step-down transformers are used, such as to convert from 120V to 24V or 48V to 12V. The voltage step-down is determined, in part, by the winding ratio between the primary and secondary windings. Step-up transformers are also useful. Step-up transformer functionality may be provided by embodiments presented herein.

It is noted that FIG. 12 only depicts a second substrate 312 and a top substrate 372 being disposed on and coupled to a base substrate 302. It is appreciated that more substrates may be provided, as warranted by the design suitable for a particular purpose.

As explained above, embodiments of magnetic devices in accordance with the claimed subject matter contain one or more winding-type electric circuits (windings); that is, the electrical interaction of the electrically interconnected conductive patterns form, in effect, one or more winding-type electric circuit structures surrounding the core. As provided above, electrical properties of the windings may be manipulated and predetermined by the physical characteristics of the conductive patterns. By way of example, the dimensions of thickness and width of the conductive patterns may be predetermined so as to provide a desired electrical characteristic. In addition, the resistance and/or AC impedance of the windings may be controlled by the preselected configuration of the vias, such as, but not limited to, the size, shape and number of the vias.

Figure 20:
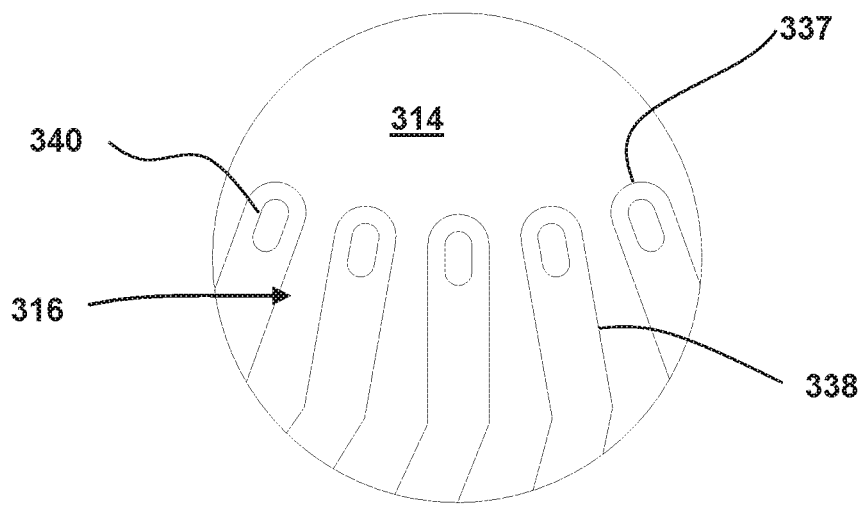
FIG. 20 is a top view of the second conductive trace second end of the second conductive pattern as a detailed view in FIG. 18, in accordance with an embodiment.

By way of example, FIG. 20 is a top view of the second conductive trace second end 339 of the second conductive pattern 316 as a detailed view 20 in FIG. 18, in accordance with an embodiment. Each of the second conductive trace second ends 339 is provided with a first via 340 having a predetermined shape, in this case an oval that is predetermined to provide a desired electrical resistance and/or impedance as described previously. The first via 340 provides an electrical interconnect between the second conductive trace first end 337 of the second conductive trace 338 and the trace hub end 327 of the first conductive trace 328 as shown in FIG. 13B.

Figure 21:
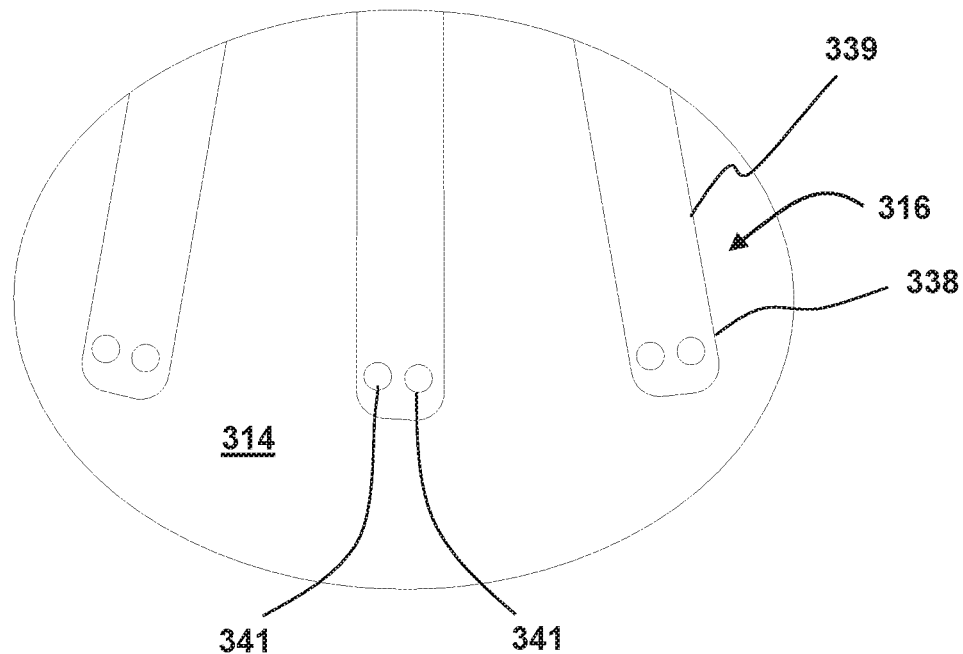
FIG. 21 is a top view of the second conductive trace second end of the second conductive pattern as a detailed view shown in FIG. 18, in accordance with an embodiment.

By way of another example, FIG. 21 is a top view of the second conductive trace second end 339 of the second conductive pattern 316 as a detailed view 21 shown in FIG. 18, in accordance with an embodiment. Each of the second conductive trace second ends 339 is provided with a plurality of vias 341, in this example there are two, the number and size of which are predetermined to provide a desired electrical resistance and/or impedance.

The plurality of vias 341 may be used to electrically interconnect the second conductive trace second end 339 of the second conductive trace 338 to the trace winding cup periphery end 325 on the base substrate 302 shown in FIG. 13B.

In accordance with other embodiments, the base substrate may comprise cavities, such as within the hub and adjacent the winding cup. These cavities may assist in the molding process if such is used for manufacturing the base substrate. In other embodiments, the cavities may be filled with various materials so as to affect performance characteristics. In accordance with an embodiment, by way of example, a material having a high thermal conductivity may be disposed in a cavity in the hub to provide passive thermal management so as to conduct heat from the windings under an electrical load away from the magnetic device.

Embodiments of the embedded magnetic device support vertical integration. Voids and cavities may be provided in the base substrate to receive passive and active components that may be used in the application circuit. For example, holes may be molded into the base substrate operable to receive electrolytic capacitors packaged in a "can"-style package known in the art. Similarly, cavities may be provided and selectively plated with an electrically conductive material and operable to receive active and passive surface-mount components.

Figure 22:
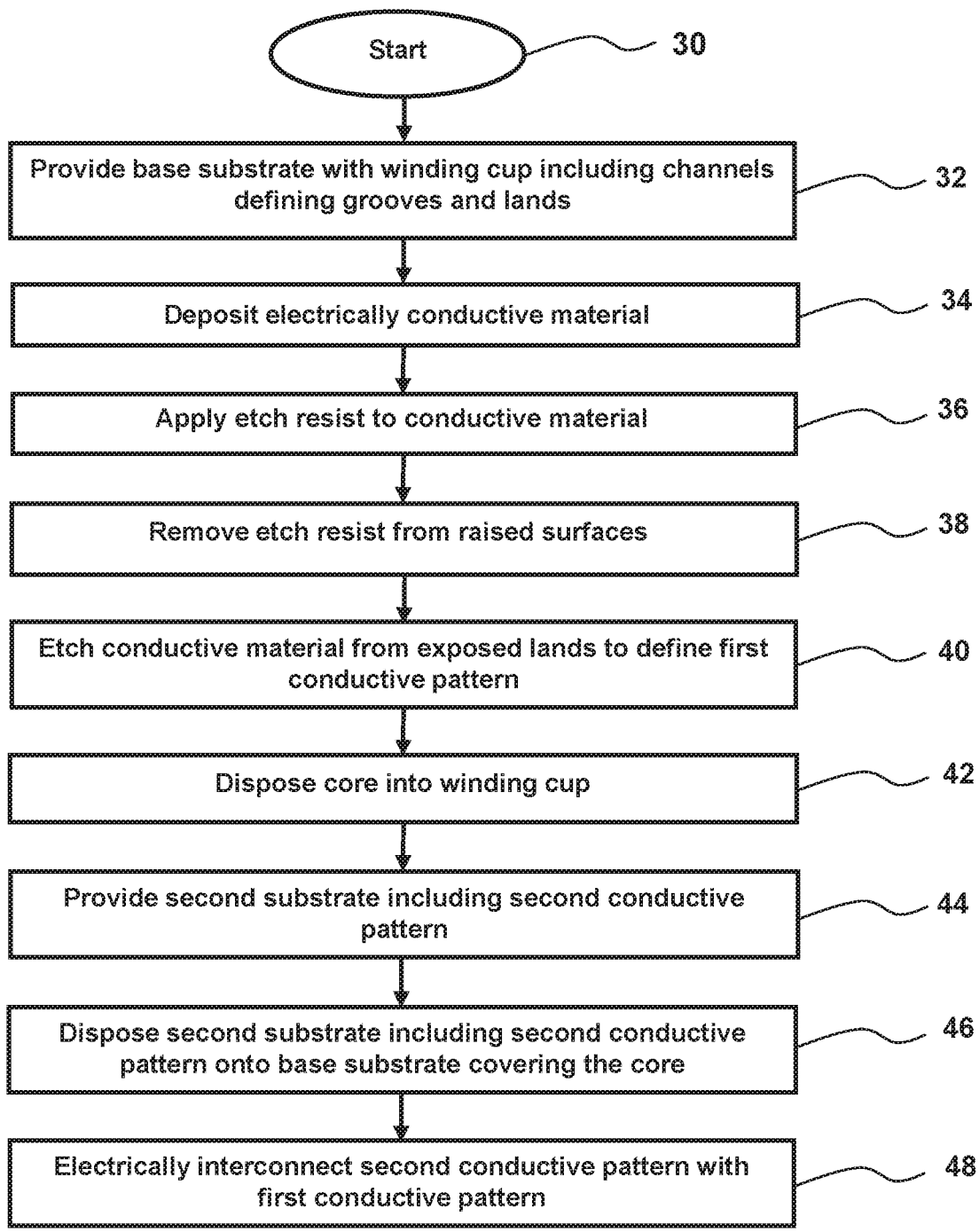
FIG. 22 is a flow diagram of an embodiment of a method of making a magnetic device, in this embodiment, an inductive device.

FIG. 22 is a flow diagram of an embodiment of a method 30 of making a magnetic device, in this embodiment, an inductive device. It is understood that the particular embodiment may be used to make a variety of magnetic devices having a wire-wound characteristic. The method comprises providing a base substrate having a first surface defining a winding cup including a hub, the winding cup including grooves and lands 32; depositing an electrically conductive layer within and about the winding cup and hub 34; applying an etch resist material to the conductive layer 36; removing the etch resist material from the lands using mechanical means exposing the conductive layer from the lands 38; removing the exposed conductive layer from the lands, the remaining conductive layer defining a first conductive pattern 40; disposing a core in the winding cup 42; providing a second substrate having a second conductive pattern 44; disposing the second substrate onto the first surface of the base substrate covering the core 46; and providing means for electrically interconnecting the first conductive pattern with the second conductive pattern 48.

It is appreciated that the fabrication process is scalable allowing the process to serve a variety of core sizes. A molding process for fabricating the winding cup may be used to produce relatively deep winding cup structures which may be very challenging or impossible to produce when using imaging, printing, sputtering, laser structuring and other techniques for producing three-dimensional circuits.

In accordance with embodiments of methods of the claimed subject matter, a batch process may be used for manufacturing winding toroidal core structures. These methods provide a distinct advantage over hand or machine wire-wound electrical components. Prior-art processes for producing transformers and inductors, for example, provide wire that is wound on larger and costlier E and C core structures due to the fabrication process of winding a bobbin with wire and clamping a core around it. Embodiments in accordance with the claimed subject matter provide methods for fabricating toroidal-shaped components that have a relatively smaller form-factor using relatively low cost and simple processes. In many electrical applications, toroidal-shaped components may be more efficient than E and C clamped cores. Additionally, toroidal-based devices may have less secondary parasitic parameters, such as, but not limited to, leakage inductance and inter-winding capacitance. In accordance with embodiments of the claimed subject matter, the embedded magnetic devices and fabrication process allows for these secondary effects to me minimized. In addition, the structure easily supports the inclusion of electromagnetic shielding and thermal heat sinks.

Embodiments of methods of the claimed subject matter provide processes that may produce conductive patterns that are used to produce winding-type electrical circuits (windings) that are very repeatable to high electrical tolerances, assisting in the production of devices having consistent performance characteristics.

In an embodiment, a multi-layer structure that supports conductors of different geometries and provides high voltage isolation between primary and secondary windings is provided.

In an embodiment, milling tools are provided that have a specific profile that is the converse of a predefined winding cup and can efficiently remove etch resistance material from the raised surfaces, such as the winding channel lands.

Methods in accordance with embodiments provide a process that is useful for producing inductors and transformers for sensors, communications and power applications, but not limited thereto.

As previously discussed, embodiments of the magnetic device include a ferromagnetic core disposed in the winding cup. Embodiments of the claimed subject matter include methods for producing ferromagnetic cores operable for disposition in winding cups.

Figure 23:
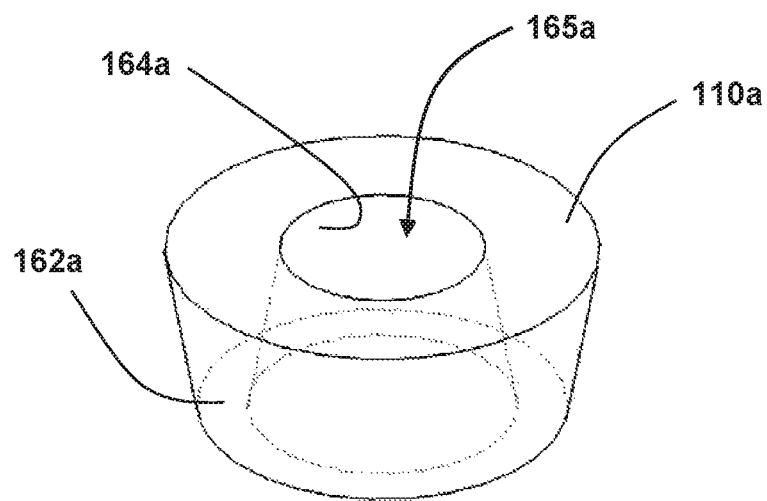
FIG. 23 is a top perspective view of a circular toroidal core comprising a bore, core inner sidewall and core outer sidewall that are complementary to the feature wall surface of the embodiment of FIG. 1B, in accordance with an embodiment.

FIG. 23 is a top perspective view of a circular toroidal core 110a comprising a circular bore 165a, core inner sidewall 164a and core outer sidewall 162a that are complementary to the feature wall surface 109 of the embodiment of FIG. 1B, in accordance with an embodiment. The core inner sidewall 164a being complimentary to the feature inner wall 119 and the core outer sidewall 162a being complimentary to the feature outer wall 129 provide, when assembled, a close proximity between the first conductive pattern 108 and the core 110a. The close proximity between the first conductive pattern 108 and the core 110a is important, for example, for optimizing inductive coupling and affecting a magnetic flux within the core 110a during operation. Referring to FIG. 1C, the core inner sidewall 164a and core outer sidewall 162a of the core 110a are tapered to assist in self-alignment of the core 110a within the feature 106.

In accordance with embodiments, the core 110a is fixed in place within the feature 106a with an electrically insulative potting material, such as, but not limited to, an electrically insulative epoxy material. The electrically insulative material should have a thermal expansion coefficient complementary with that of the base substrate and the core 110a such that minimal movement of the core 110a when the magnetic device is subjected to operational and environmental thermal conditions.

In accordance with embodiments, the core inner sidewall 164a and core outer sidewall 162a are substantially complementary to the feature inner wall 119 and the feature outer wall 129 so as to minimize the gap 142 there between. Wherein the gap 142 is minimized, a minimum amount of electrically insulative material may be used within the gap 142. A gap 142 of minimal dimensions and a minimal amount of electrically insulative material is advantageous for a number of reasons, one of which may be to minimize the effects of thermal expansion mismatch between the base substrate, electrically insulative material, and the core 110a.

Figure 24:
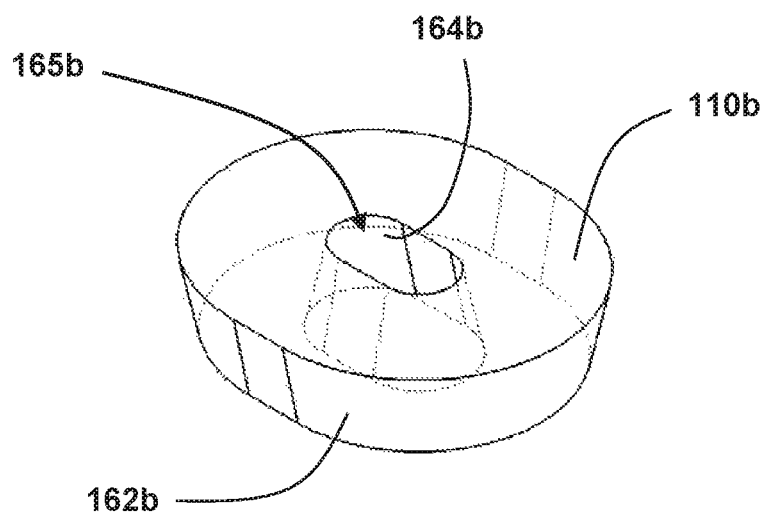
FIG. 24 is a top perspective view of an oval-shaped core with an oval bore, a core inner sidewall and a core outer sidewall that are tapered, in accordance with an embodiment.

FIG. 24 is a top perspective view of an oval-shaped core 110b with an oval bore 165b, a core inner sidewall 164b and a core outer sidewall 162b that are tapered, in accordance with an embodiment. Advantages of an oval shape for the oval-shaped core 110b will be discussed further below.

Figure 25:
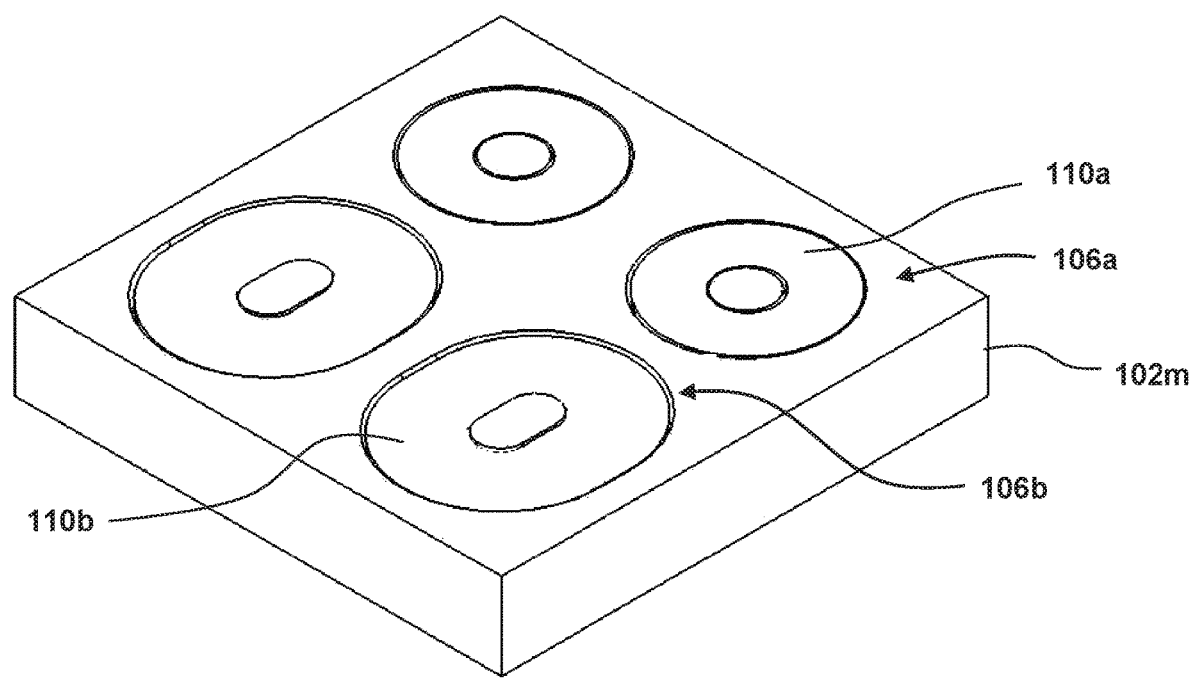
FIG. 25 is a top perspective view of a plurality of circular toroidal cores and oval-shaped cores disposed within respective feature and oval-shaped features, respectively, of a base substrate, in accordance with an embodiment.

FIG. 25 is a top perspective view of a plurality of circular toroidal cores 110a and oval-shaped cores 110b disposed within respective feature 106a and oval-shaped features 106b, respectively, of a base substrate 102m, in accordance with an embodiment. Once the plurality of circular toroidal cores 110a and oval-shaped cores 110b are seated within the respective features 106a and oval-shaped features 106b, a second substrate comprising a conductive layer is disposed upon the base substrate 102m substantially as discussed above.

It is appreciated that the shape of the ferromagnetic core imparts specific electrical characteristics to the magnetic device. The modularity of the embodiments of the claimed subject matter provides that ability to produce ferromagnetic cores of various geometries. For example, but not limited thereto, an oval, binocular or rectangular-shaped cores.

Figure 26:
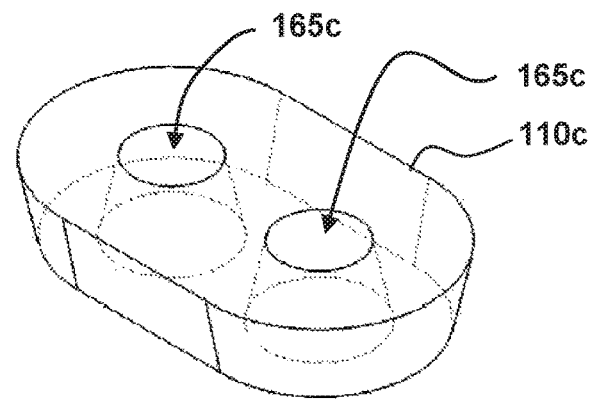
FIG. 26 is a top perspective view of a core that has an oval shape and includes two bores, referred to as a binocular core, in accordance with an embodiment.

FIG. 26 is a top perspective view of a core 110c that has an oval shape and includes two bores 165c, referred to as a binocular core, in accordance with an embodiment. This core would be complimentary with a feature having a complimentary shape with two hubs.

Figure 27:
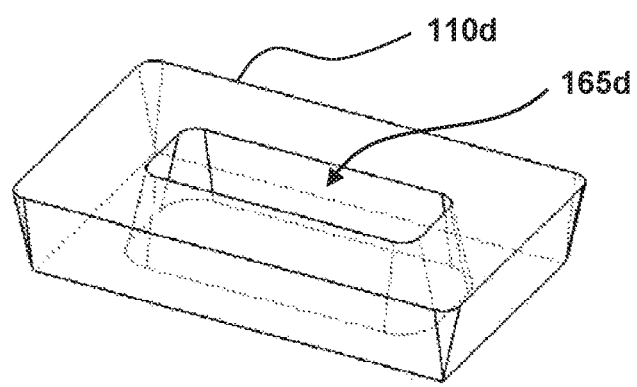
FIG. 27 is a top perspective view of a core that has a rectangular shape and includes one square bore, in accordance with an embodiment.

FIG. 27 is a top perspective view of a core 110d that has a rectangular shape and includes a rectangular bore 165d. This core 110d would be complimentary with a feature having a complimentary rectangular shape with a rectangular hub.

Figure 28:
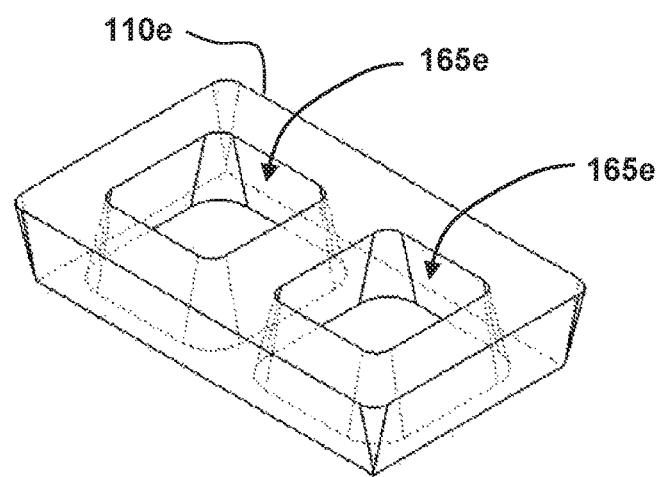
FIG. 28 is a top perspective view of a core that has a rectangular shape and includes two square bores, in accordance with an embodiment.

FIG. 28 is a top perspective view of a core 110e that has a rectangular shape and includes two square bores 165e, in accordance with an embodiment. This core 110e would be complimentary with a feature having a complimentary rectangular shape with two hubs. Embodiments of the claimed subject matter provide a means to provide simple or complex magnetic devices having winding features.

Referring again to FIG. 24, the oval bore 165b may be useful to increase the bore as compared with the circular bore 165a shown in FIG. 23, and correspondingly allow for an increase in the number of windings (which is dependent on the pattern spacing allowed by the hub, such as might be beneficial in a transformer or inductor device. Increasing the number of conductive pattern windings provided on the hub effectively increases the effective winding count, referring to an equivalent number of windings of a wire in wire-wound components.

The larger bore opening also allows the use of larger conductor pattern geometries for the windings. The oval shape can also have a larger magnetic path length versus a circular shape, which is a parameter that may be used to manage the magnetic flux within the core.

The oval or rectangular shaped core with a larger path length in one of the length or width may reduce the core's susceptibility to magnetic saturation due to magnetic flux. Ferromagnetic materials have specific saturation points dependent on their specific material composition. Wherein there is too much induced magnetic flux, the material may magnetically saturate and its ability to store and transfer electromagnetic energy may be diminished. Magnetic saturation may also be exacerbated by thermal stress and mechanical stress. In general, the longer magnetic path length of an oval shaped core increases the magnetic flux that may be contained in the core and reduce the core's susceptibility to magnetic saturation. This longer path length, larger core volume and reduced susceptibility to magnetic saturation also stabilizes the core's performance under mechanical and thermal stress environments.

Powered applications of wire-wound type devices often require a mix of wire gauges, different winding segments and different winding ratios. They also often require that taps, also referred to as conductive take-offs, that are pulled, a term in the art for coupled, from the winding to provide electrical connections intermediate to the winding. Embodiments of claimed subject matter, providing the "winding" in the form of conductive pattern, may facilitate methods for, such as, but not limited to, applying conductive patterns to a toroidal core device, controlling the resistance of the conductive patterns, allowing for large conductive pattern ratios, and pulling intermediate taps.

In accordance with embodiments of the disclosed subject matter, the conductive patterns may have varying or different effective gauge values suitable for a particular purpose. Effective gage, used herein, refers to a wire gage equivalent. Where one circuit including a conductive pattern requires a larger current carrying capacity indicative of a larger gauge wire, the conductive pattern may be predetermined to provide that capability by predetermining the physical dimensions of the traces for a specific conductive material. The methods of producing magnetic devices in accordance with embodiments facilitate multiple circuits including a conductive pattern of a magnetic device wherein the effective gauge of one circuit including a conductive pattern may not be dependent on the effective gauge of another circuit including another conductive pattern. By way of example, referring to FIGS. 6A and 6B, the circuit comprising W1A and W1B many have a different effective gauge or current carrying capacity than the circuit comprising W2A and W2B.

Another advantage, by way of example but not limited thereto, of the claimed subject matter is that, for particular electromagnetic devices, the more preferred toroidal core geometry may be used. For example, the toroidal shape may be a more efficient geometry to transfer electromagnetic energy between windings. In wire-wound device production, the toroidal core geometry is difficult to wind with wire. In some cases, the less effective C and E core geometry may be used as being more conducive to bobbin winding production incorporating different gauge wires, winding taps and large winding ratios, for example. Embodiments of the disclosed subject matter provide an efficient and effective means for producing the desired electromagnetic devices without some of the design-limiting production limitations of a wire-winding process.

Although magnetic devices such as provided by apparatus and methods presented herein may be used in a vast number of electronic components and devices, by way of example, they are particularly advantageous in the construction of wideband data communication transformers and power electronics. The apparatus presented herein allows for optimization of performance by keeping the circuit windings and core in close proximity to one another.

In the embodiments of FIGS. 1-21, windings, such as the primary and secondary windings of a transformer, are affected by the use, at least in part, of metalized traces either on a surface of a feature or within channels defined by the feature, also referred to as a winding cup. The metalized traces are electrically interconnected with traces on surfaces of various substrates by use of vias so as to define one or more windings.

In accordance with the following embodiments, described as embodiments of FIGS. 29-43b, apparatus and methods are provided herein for providing and assembling magnetic devices and magnetic components, wherein windings, such as the primary and secondary windings of a transformer, are defined by the use, at least in part, of plated through hole (PTH) vias adjacent to the feature. The vias are electrically interconnected with traces on surfaces of various substrates so as to define one or more windings about one or more cores.

In accordance with embodiments, arrayed embedded magnetic components include magnetic devices that have a core that is embedded between two or more substrates and a winding pattern surrounding the core that is implemented on and through the two or more substrates. The winding pattern is operable to induce a magnetic flux within the core when energized by a time varying voltage potential. The winding pattern may be implemented by printed circuit layers, plated vias, other electrically conductive elements, and combinations thereof. Arrayed embedded magnetic components include two or more magnetic devices electrically connected in parallel or series or combinations thereof, and positioned side-by-side in a horizontal integration defining a horizontal array, positioned coaxially in a vertical integration defining a vertical array, or combinations thereof. The magnetic devices may have a magnetic functionality such as, but not limited to, a transformer, inductor, and filter. In accordance with embodiments, magnetic components and methods provide for low cost construction, consistent performance, and a low profile form, among other benefits.

The term core cavity is used herein to identify a feature that does not define conductive traces. The term core cavity is used to differentiate between a feature defining conductive traces such as the winding cup 306 of FIG. 13A-13B. The core cavity and winding cup are both operable to receive a core therein. The core cavity and winding cup are described in the following embodiments as defining a closed groove. The term closed groove is used herein as a groove that has no beginning or ending, such as having an axial projection in a form of a circle, oval, or square, as compared to an open groove having a distinct beginning and ending such as having an axial projection in the form of a line. It is understood that other shapes of core cavities are anticipated, such as a core cavity having a straight groove operable to receive a rod-shaped core.

It is appreciated that winding circuitry of magnetic components may also be affected by using a combination of metalized traces on the surface of a feature or within channels defined by the feature and PTH-type vias that are adjacent to the feature.

Vias, as used herein may be one of a number of types of vias. Blind vias (BV) are used to electrically connect an outer conductor trace or layer to an inner conductor trace or layer, such as shown in FIG. 1B, as interconnects 140. A plated through hole (PTH) via passes though the substrate as shown in FIGS. 13B, C, D, second end via 380 and hub via 383. A buried via electrically connects two internal adjacent conductor traces or layers; however, it may electrically connect more than two internal conductor traces or layers. Vias of various types are well known in the art.

Figure 29:
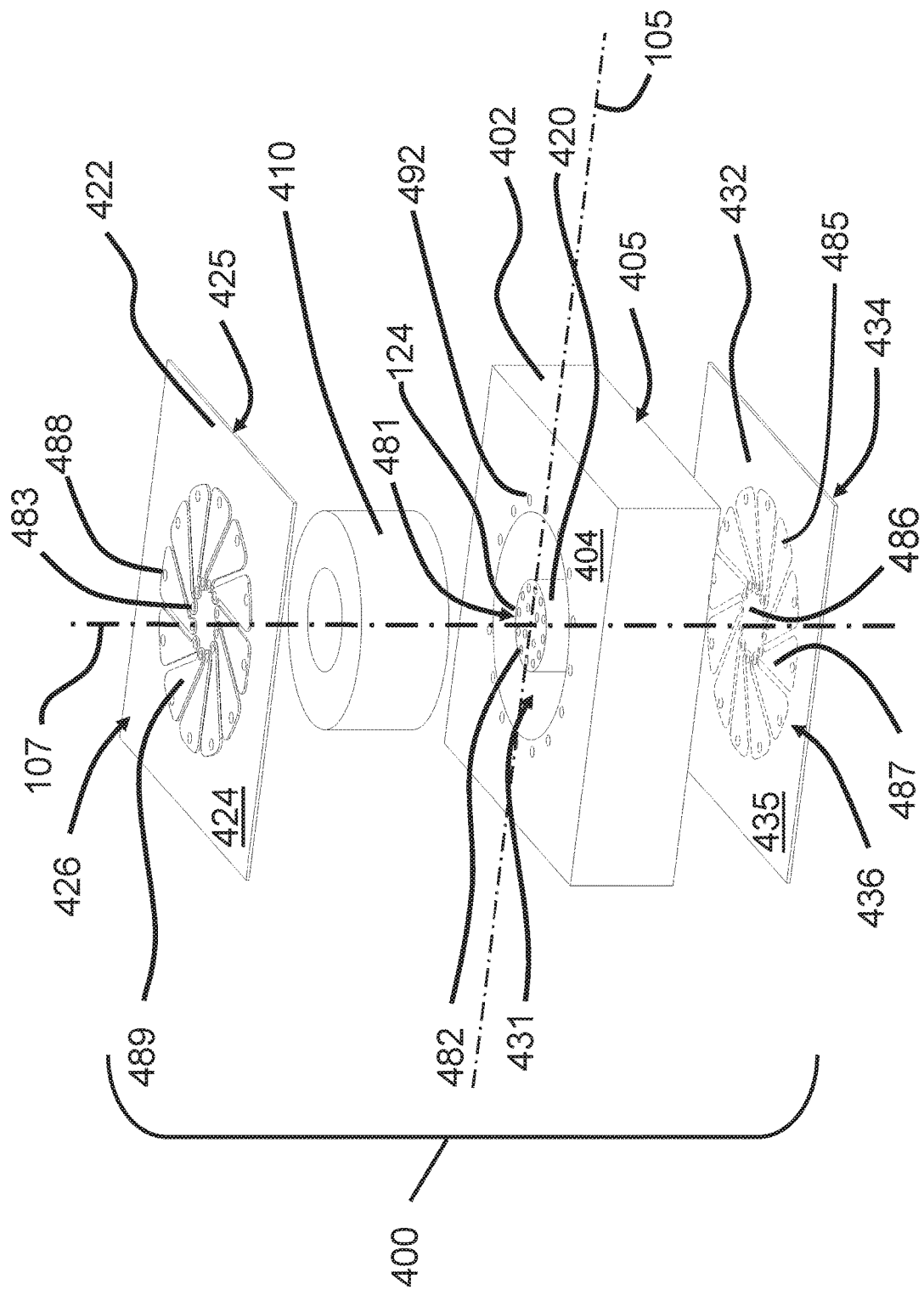
FIG. 29 is a perspective exploded view of a plated through hole (PTH) construction of an embedded magnetic device in accordance with an embodiment.

FIG. 29 is a perspective exploded view of a plated through hole (PTH) construction of an embedded magnetic device 400 in accordance with an embodiment. The embedded magnetic device 400 comprises a base substrate 402, a second substrate 422, a third substrate 432, and a core 410. The base substrate 402 defines a base substrate first surface 405 and a base substrate second surface 404 opposite the base substrate first surface 405. The base substrate second surface 404 comprises a core cavity 431 depending from the base substrate second surface 404 having a shape of a closed groove surrounding a hub 420, such as, but not limited to a groove of revolution. The hub 420 defines a hub top surface 124 that is substantially coplanar with the base substrate second surface 404. The core cavity 431 is operable to receive the core 410 therein, such as shown for the embodiment of FIG. 30. The base substrate 402 further comprises a plurality of first base vias 492 in the form of plated through holes (PTH) adjacent a perimeter of the core cavity 431 and extending from the base substrate second surface 404 to the base substrate first surface 405. The hub 420 further comprises a plurality of hub perimeter vias 482 in the form of plated through holes (PTH) adjacent a hub perimeter 481 of the hub 420 and extending from the hub top surface 124 to the base substrate first surface 405.

The second substrate 422 is substantially similar to the second substrate 112 of the embodiment of FIGS. 1A and 1B. The second substrate 422 comprises a second substrate first surface 425 and a second substrate second surface 424 opposite the second substrate first surface 425. A second conductive pattern 426 is disposed on the second substrate second surface 424. Second substrate first vias 488 and second substrate second vias 483 extend from the second conductive pattern 426 through the second substrate 422 to the second substrate first surface 425. The second substrate first surface 425 is disposed on and coupled to the base substrate second surface 404, with the second conductive pattern 426 in coaxial, about axis 107, and complimentary alignment with the core cavity 431. The second substrate first vias 488 are in complimentary alignment with the first base vias 492, and the second substrate second vias 483 are in complimentary alignment with the hub perimeter vias 482. Complimentary alignment as referred to herein means in a relationship that will affect electrical interconnection and/or magnetic properties.

The third substrate 432 is substantially similar to the second substrate 422. The third substrate 432 comprises a third substrate first surface 435 and a third substrate second surface 434 opposite the third substrate first surface 435. A third conductive pattern 436 is disposed on the third substrate second surface 434, shown in phantom in FIG. 29. Third substrate first vias 485 and third substrate second vias 486 extend from the third conductive pattern 436 through the third substrate 432 to the third substrate first surface 435. The third substrate first surface 435 is disposed on and coupled to the base substrate first surface 405, with the third conductive pattern 436 in coaxial, about axis 107, and complimentary alignment with the core cavity 431. The third substrate first vias 485 are in complimentary alignment with the first base vias 492, and the third substrate second vias 486 are in complimentary alignment with the hub perimeter vias 482.

The second conductive pattern 426, the third conductive pattern 436, the second substrate first vias 488, the second substrate second vias 483, the third substrate first vias 485, the third substrate second vias 486, the first base vias 492, and the hub perimeter vias 482 comprise an electrically conductive material. As will be further described below, the second conductive pattern 426 and the third conductive pattern 436 are electrically interconnected with the second substrate first vias 488, the second substrate second vias 483 the third substrate first vias 485, the third substrate second vias 486, the first base vias 492, and the hub perimeter vias 482 so as to electrically cooperate to be operable for facilitating magnetic properties of the core 410 when electrically energized, in accordance with various embodiments.

It should be appreciated that FIG. 29 illustrates an exploded view to describe an embodiment of the claimed subject matter, and accordingly, as will be described in further detail, the magnetic device 400 will have the core 410 enclosed within the core cavity 431, with the second substrate 422 covering and enclosing the core 410.

The second conductive pattern 426, the third conductive pattern 436, the second substrate first vias 488, the second substrate second vias 483 the third substrate first vias 485, the third substrate second vias 486, the first base vias 492, and the hub perimeter vias 482 are electrically interconnected to define one or more electric circuits that surround the core 410, thereby forming a winding-type relationship. The winding-type relationship is such as associated with a winding-type electric circuit that cooperates so as to induce a magnetic flux within the core 410 when the one or more electric circuits are energized by a voltage source. This type of relationship may be used to produce, by way of example, a transformer or inductor winding pattern. Such winding-type relationship is similar in function to known electrical devices in the art that comprise a wire-wrapped core configuration. Embodiments of different winding-type relationships will be discussed below, but are not limited thereto.

It is appreciated that, contrary to the core cavity 118 of the embodiment of FIG. 1B that requires tapered sides so as to allow deposition of a conductive pattern on the tapered sides using imaging techniques, the embodiment of the core cavity 431 of FIG. 29 may have straight sides since plated through hole vias are used instead of a deposition of a conductive pattern on the sides of the core cavity 431. It is appreciated that embodiments presented herein may alternatively use a conductive pattern on the sides of the core cavity 431, as in FIGS. 1B and 12, instead of the plated through hole vias. It is also appreciated that embodiments having a combination of a conductive pattern on the sides of the core cavity, as in FIGS. 1B and 12, as well as plated through hole vias that function as a winding, as in FIG. 29, may be used.

In accordance with an embodiment, and referring again to FIG. 29, the core cavity 431 in the form of a cavity is disposed into the base substrate first surface 405 of the base substrate 402, using such as, but not limited to, machining and milling techniques. The first base vias 492, and the hub perimeter vias 482 may be produced by drilling through holes in the base substrate 402 and depositing conductive material within the through holes. The core 410, comprising a ferromagnetic material, for example, but not limited thereto, is inserted into the core cavity 431 and encapsulated therein by an encapsulate material (not shown) that is electrically non-conductive, such as, but not limited to, silicone and epoxy.

The second substrate first surface 425 of the second substrate 422 is disposed on and coupled to the base substrate second surface 404. The second conductive pattern 426 is disposed, such as by, but not limited to, imaging, on the second substrate second surface 424. The second conductive pattern 426 comprises a plurality of second conductive traces 489 that are discontinuous, that is, they don't touch each other. The second substrate first vias 488 and the second substrate second vias 483 are operable to electrically interconnect the second conductive traces 489 and the underlying the first base vias 492 and the hub perimeter vias 482, respectively. The second substrate first vias 488 and the second substrate second vias 483 may be produced by drilling through holes in the second substrate 422 and depositing conductive material within the through holes. The drilling may be done at a high rate reducing fabrication cost, among other benefits.

The third substrate first surface 435 of the third substrate 432 is disposed on and coupled to the base substrate first surface 104. The third conductive pattern 436 is disposed on the third substrate second surface 434. The third conductive pattern 436 comprises a plurality of third conductive traces 487 that are discontinuous, shown in phantom in FIG. 29. The third substrate first vias 485 and third substrate second vias 486 are operable to electrically interconnect the third conductive traces 487 and the underlying first base vias 492 and the hub perimeter vias 482, respectively. The third substrate first vias 485 and the third substrate second vias 486 may be produced by drilling through holes in the third substrate 432 and depositing conductive material within the through holes.

Figure 30:
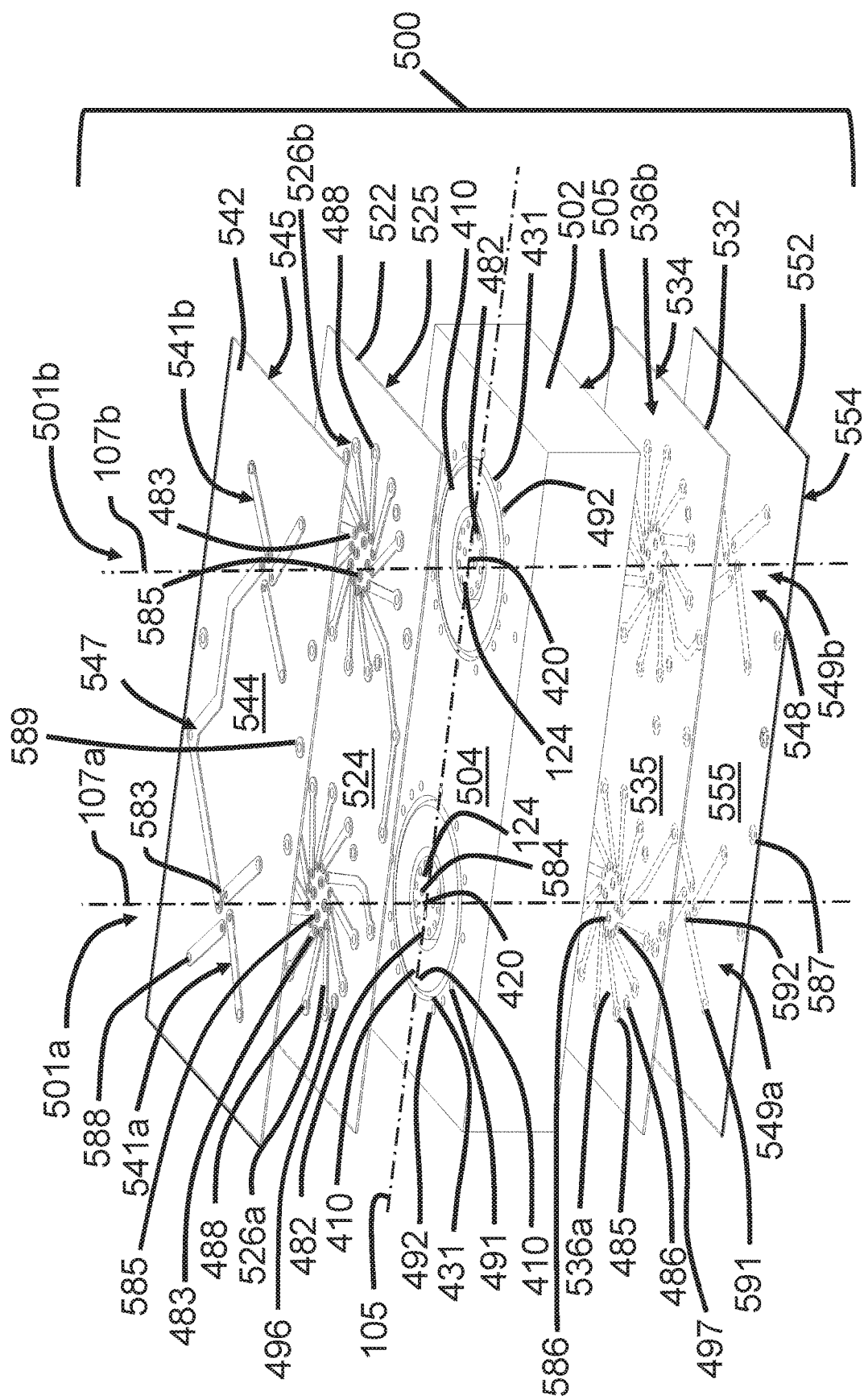
FIG. 30 is a perspective exploded view of a first magnetic device and a second magnetic device each in a transformer configuration that are arrayed horizontally in the same assembly sharing the same base substrate to define a horizontal multi-device magnetic component, in accordance with an embodiment.

In accordance with embodiments, winding inductance, impedance and power delivery may be managed by electrically interconnecting an array of two or more magnetic devices in series or parallel, or combination, to form a magnetic component. FIG. 30 is a perspective exploded view of a first magnetic device 501a and a second magnetic device 501b each in a transformer configuration that are arrayed horizontally in the same assembly sharing the same base substrate 502 to define a horizontal multi-device embedded magnetic component 500, in accordance with an embodiment. In this implementation, two cores 410 are contained adjacent to each another in the same base substrate 502 in a horizontal integration defining a horizontal array. The transformer primary windings are implemented by the second substrate 522 and the third substrate 532. The transformer secondary windings are implemented by a fourth substrate 542 and a fifth substrate 552. The circuit design on the second substrate 522, the third substrate 532, the fourth substrate 542 and the fifth substrate 552 determines whether the windings are connected in either a series, parallel, or combination of series and parallel configuration.

Referring again to FIG. 30, the horizontal multi-device embedded magnetic component 500 comprises two embedded magnetic devices of the PTH type, a first magnetic device 501a and a second magnetic device 501b, each of which substantially correspond to the embedded magnetic device 400 of the embodiment of FIG. 29, in a side-by-side relationship, and sharing a same base substrate 502, sharing a same second substrate 522 and sharing a same third substrate 532, and with a core 410 disposed in each core cavity 431 defined by the base substrate 502. The horizontal multi-device embedded magnetic component 500 further comprises a fourth substrate 542, and a fifth substrate 552, each operable to interconnect the first magnetic device 501*a* and the second magnetic device 501*b* in electrical communication, defining a horizontal multi-device embedded magnetic component 500.

The base substrate 502 is substantially similar to the base substrate 402 of FIG. 29, but with multiple core cavities 431. The base substrate 502 defines a base substrate first surface 505 and a base substrate second surface 504 opposite the base substrate first surface 505. The base substrate second surface 504 defines two core cavities 431 that are adjacent to each other on a horizontal plane defined by the base substrate second surface 504. Each core cavity 431 defines a closed groove depending from the base substrate second surface 504 surrounding a hub 420, such as, but not limited to a groove of revolution.

The hub 420 defines a hub top surface 124 that is substantially coplanar with the base substrate second surface 504. The core cavity 431 is operable to receive the core 410 therein, as previously described for the embodiment of FIG. 29. The base substrate 502 further comprises a plurality of first base vias 492 in the form of plated through holes (PTH) adjacent a perimeter of the core cavity 431 and extending from the base substrate first surface 505 to the base substrate second surface 504. The hub 420 further comprises a plurality of hub perimeter vias 482 in the form of plated through holes (PTH) adjacent a hub perimeter 481 of the hub 420 and extending from the hub top surface 124 to the base substrate first surface 505. The hub 420 further comprises a plurality of hub second vias 584 of the plated through hole type inward from the hub perimeter vias 482 and extending from the hub top surface 124 to the base substrate first surface 505.

Base substrate fourth vias 491 are located in predetermined locations on the base substrate 502 so as to provide a pass-through connection through the base substrate 502. The base substrate fourth vias 491 extend from the base substrate second surface 504 through the base substrate 502 to the base substrate first surface 505.

It is appreciated that, contrary to the core cavity 431 of the embodiment of FIG. 1B that requires tapered sides so as to allow deposition of a first conductive pattern 108 on the tapered sides, the embodiment of the core cavity 431 of FIG. 30 may have straight sides since there is no deposition of a conductive pattern on the sides of the core cavity 431. It is appreciated that embodiments having a conductive pattern on the sides of the core cavity 431, as in FIG. 1B, may be used. It is also appreciated that embodiments having a combination of a conductive pattern on the sides of the core cavity 431, as in FIG. 1B, as well as vias that function as a winding, as in FIG. 30, may be used.

The second substrate 522 is substantially similar to the second substrate 422 of the embodiment of FIG. 29 but comprising two conductive patterns instead of one. The second substrate 522 comprises a second substrate first surface 525 and a second substrate second surface 524. A second substrate first conductive pattern 526*a* and the second substrate second conductive pattern 526*b* are disposed on the second substrate second surface 524.

Second substrate first vias 488 and second substrate second vias 483 extend from the second substrate first conductive pattern 526*a* and second substrate second conductive pattern 526*b* through the second substrate 522 to the second substrate first surface 525. Second substrate third vias 585 are located inwardly from the second substrate second vias 483 and are operable to align with the hub second vias 584. The second substrate third vias 585 extend from the second substrate second surface 524 through the second substrate 522 to the second substrate first surface 525.

Second substrate fourth vias 496 are located in predetermined locations on the second substrate 522 so as to provide a pass-through connection through the second substrate 522 and are not associated with the conductive patterns on the second substrate. The second substrate fourth vias 496 extend from the second substrate second surface 524 through the second substrate 522 to the second substrate first surface 525.

The second substrate first surface 525 is disposed on and coupled to the base substrate first surface 505 with the second substrate first conductive pattern 526*a* and the second substrate second conductive pattern 526*b* in coaxial, about axis 107*a* and axis 107*b*, respectfully, complimentary alignment with respective core cavities 431 and respective cores 410 of the base substrate 502. The second substrate first vias 488 are in complimentary alignment with the first base vias 492, the second substrate second vias 483 are in complimentary alignment with the hub perimeter vias 482, and the second substrate third vias 585 are in complimentary alignment with the hub second vias 584. Complimentary alignment as referred to herein means in a relationship that will affect electrical interconnection and/or magnetic properties.

The third substrate 532 is substantially similar to the third substrate 432 of the embodiment of FIG. 29, but comprising two conductive patterns instead of one. The third substrate 532 comprises a third substrate first surface 535 and a third substrate second surface 534. A third substrate first conductive pattern 536*a* and a third substrate second conductive pattern 536*b*, shown in phantom, are disposed on the third substrate second surface 534.

Third substrate first vias 485 and third substrate second vias 486 extend from the third substrate first conductive pattern 536*a* and a third substrate second conductive pattern 536*b* through the third substrate 532 to the third substrate first surface 535. Third substrate third vias 586 are located inwardly from the third substrate second vias 486 and are operable to align with the hub second vias 584. The third substrate third vias 586 extend from the third substrate second surface 534 through the third substrate 532 to the third substrate first surface 535. Third substrate fourth vias 497 are located in predetermined locations on the third substrate 532 so as to provide a pass-through connection through the third substrate 532 and are not associated with the conductive patterns on the third substrate. The third substrate fourth vias 497 extend from the third substrate second surface 534 through the third substrate 532 to the third substrate first surface 535.

The third substrate first surface 535 is disposed on and coupled to the base substrate first surface 505, with the third substrate first conductive pattern 536*a* and a third substrate second conductive pattern 536*b* in coaxial, about axis 107*a* and axis 107*b*, respectfully, complimentary alignment with respective core cavities 431 and respective cores 410 of the base substrate 502. The third substrate first vias 485 are in complimentary alignment with the first base vias 492, the third substrate second vias 486 are in complimentary alignment with the hub perimeter vias 482, and the second substrate third vias 585 are in complimentary alignment with the hub second vias 584. Complimentary alignment as referred to herein means in a relationship that will affect electrical interconnection and/or magnetic properties.

The fourth substrate 542 comprises a fourth substrate first surface 545 and a fourth substrate second surface 544. A fourth conductive pattern 547 is disposed on the fourth substrate second surface 544. The fourth conductive pattern 547 comprises a fourth substrate first conductive sub-pattern 541a and a fourth substrate second conductive sub-pattern 541b that are electrically interconnected.

Fourth substrate first vias 588 and fourth substrate second vias 583 extend from the fourth substrate first conductive sub-pattern 541a and fourth substrate second conductive sub-pattern 541b through the second substrate 522 to the fourth substrate first surface 545. Fourth substrate third vias 589 are located on the fourth substrate 542 to be operable to interconnect with underlying circuitry, such as, by way of example, to provide an electrical interface from the fourth substrate second surface 544 to the second substrate second conductive pattern 526b, as shown in FIG. 30, to allow connection with external electronics, for example. The fourth substrate third vias 589 extend from the fourth substrate second surface 544 through the fourth substrate 542 to the fourth substrate first surface 545.

The fourth substrate first surface 545 is disposed on and coupled to the second substrate second surface 524 with the fourth substrate first conductive sub-pattern 541a and the fourth substrate second conductive sub-pattern 541b in coaxial complimentary alignment with the second substrate first conductive pattern 526a and the second substrate second conductive pattern 526b respectively, about axis 107a and axis 107b, respectfully.

The fourth substrate first vias 588 are in complimentary alignment with the second substrate fourth vias 496, the base substrate fourth vias 491, and the third substrate fourth vias 497. The fourth substrate second vias 583 are in complimentary alignment with the second substrate third vias 585, the hub second vias 584, and the third substrate third vias 586. Complimentary alignment as referred to herein means in a relationship that will affect electrical interconnection and/or magnetic properties.

The fifth substrate 552 comprises a fifth substrate first surface 555 and a fifth substrate second surface 554. A fifth conductive pattern 548 is disposed on the fifth substrate second surface 554, shown in phantom. The fifth conductive pattern 548 comprises a fifth substrate first conductive sub-pattern 549a and a fifth substrate second conductive sub-pattern 549b that are electrically interconnected.

Fifth substrate first vias 591 and fifth substrate second vias 592 extend from the fifth substrate first conductive sub-pattern 549a and fifth substrate second conductive sub-pattern 549b through the fifth substrate 552 to the fifth substrate first surface 555. Fifth substrate third vias 587 are located on the fifth substrate 552 to be operable to interconnect with underlying circuitry, such as, by way of example, to provide an electrical interface from the fifth substrate second surface 554 to the third substrate first conductive pattern 536a, as shown in FIG. 30, to allow connection with external electronics, for example. The fifth substrate third vias 587 extend from the fifth substrate second surface 554 through the fifth substrate 552 to the fifth substrate first surface 555.

The fifth substrate first surface 555 is disposed on and coupled to the third substrate second surface 534 with the fifth substrate first conductive sub-pattern 549a and the fifth substrate second conductive sub-pattern 549b in coaxial complimentary alignment with the third substrate first conductive pattern 536a and the third substrate second conductive pattern 536b, respectively, about axis 107a and axis 107b, respectfully.

The fifth substrate first vias 591 are in complimentary alignment with the third substrate fourth vias 497, the base substrate fourth vias 491, the second substrate fourth vias 496, and the fourth substrate first vias 588. The fifth substrate second vias 592 are in complimentary alignment with the third substrate third vias 586, the hub second vias 584, the second substrate third vias 585, and the fourth substrate second vias 583. Complimentary alignment as referred to herein means in a relationship that will affect electrical interconnection and/or magnetic properties.

It is understood that, in accordance with another embodiment of making a horizontal array of two or more magnetic devices, the base substrate 502 of FIG. 30 may comprise two base substrates 402 of FIG. 29 coupled together in side-by-side relationship.

In accordance with the embodiment of FIG. 30, the plated through holes in the base substrate 502, the second substrate first conductive pattern 526a, the second substrate second conductive pattern 526b, the third substrate first conductive pattern 536a, the third substrate second conductive pattern 536b, the fourth conductive pattern 547, the fifth conductive pattern 548, and the various vias are electrically interconnected to define one or more electric circuits that surround the cores 410, thereby forming a winding-type relationship such as associated with a winding-type electric circuit that cooperates so as to induce a magnetic flux within the cores 410 when the one or more electric circuits are energized by a voltage source, to produce, by way of example a transformer configuration. Embodiments of different winding-type relationships will be discussed below.

Figure 31:
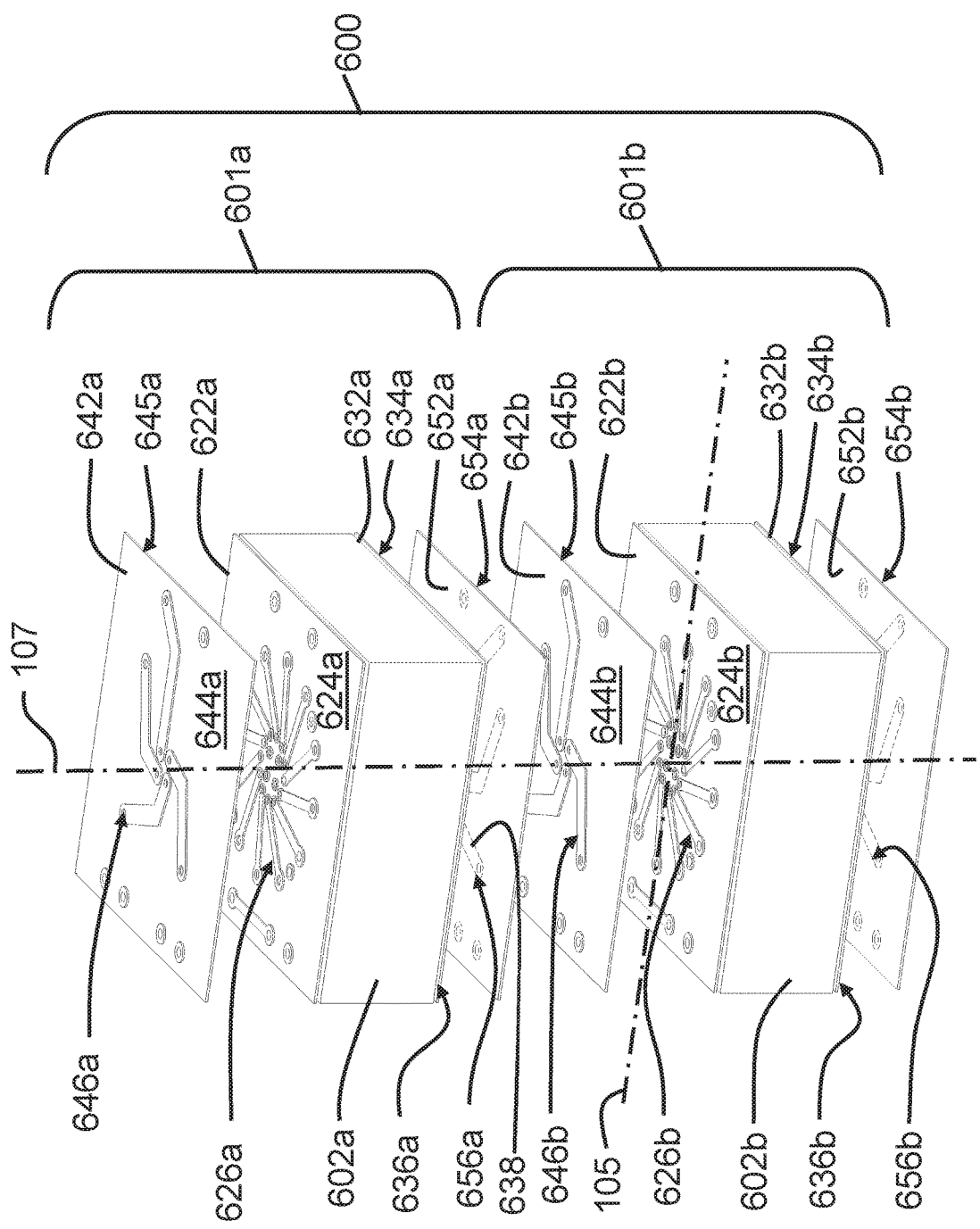
FIG. 31 is a perspective exploded view of a first magnetic device and a second magnetic device each in a transformer configuration that are arrayed vertically in the same assembly along the same axis to define a vertical multi-device magnetic component, in accordance with an embodiment.

FIG. 31 is a perspective exploded view of a first magnetic device 601a and a second magnetic device 601b each in a transformer configuration that are arrayed vertically in the same assembly along the same axis 107 to define a vertical multi-device magnetic component 600 as a vertical multi-transformer device, in accordance with an embodiment. The first magnetic device 601a and the second magnetic device 601b are substantially the same as the first magnetic device 501a and the second magnetic device 501b, respectively, of FIG. 30. In this implementation, two cores (not shown), one in the first base substrate 602a and a second in the second base substrate 602b, are in vertical alignment to each another, in a vertical integration defining a vertical array. The transformer primary windings are implemented by each of a first second substrate 622a and a first third substrate 632a, and a second second substrate 622b and a second third substrate 632b, respectively, with the respective plated through holes in the first base substrate 602a and second base substrate 602b, respectively. The transformer secondary windings are implemented by a first fourth substrate 642a and a first fifth substrate 652a, and a second fourth substrate 642b and a second fifth substrate 652b, respectively, with the respective plated through holes in the first base substrate 602a and second base substrate 602b, respectively.

The circuit design on the first second substrate 622a, second second substrate 622b, first third substrate 632a, second third substrate 632b, first fourth substrate 642a, second fourth substrate 642b, first fifth substrate 652a, and the second fifth substrate 652b, determines whether the windings are connected in either a series, parallel, or combination of series and parallel configuration.

Since the first magnetic device 601a and the second magnetic device 601b are substantially the same as the first magnetic device 501a and the second magnetic device 501b, respectively, of FIG. 30, specific details of the various components have already been presented with the embodiment of FIG. 30. The first magnetic device 601a comprises a first base substrate 602a, a first second substrate 622a, a first third substrate 632a, a first fourth substrate 642a, and a first fifth substrate 652a. The first base substrate 602a substantially corresponds to the base substrate 502 of FIG. 30, but having only one core cavity 431. The first second substrate 622a substantially corresponds to the second substrate 522 of FIG. 30, but having only the second substrate first conductive pattern 526a. The first third substrate 632a substantially corresponds to the third substrate 532 of FIG. 30, but having only the third substrate first conductive pattern 536a. The first fourth substrate 642a substantially corresponds to the fourth substrate 542 of FIG. 30, but having only the fourth substrate first conductive pattern 541a. The first fifth substrate 652a substantially corresponds to the fifth substrate 552 of FIG. 30, but having only the fifth substrate first conductive sub-pattern 549a.

The second magnetic device 601b comprises a second base substrate 602b, a second second substrate 622b, a second third substrate 632b, a second fourth substrate 642b, and a second fifth substrate 652b. The second base substrate 602b substantially corresponds to the base substrate 502 of FIG. 30, but having only one core cavity 431. The second second substrate 622b substantially corresponds to the second substrate 522 of FIG. 30, but having only the second substrate second conductive pattern 526b. The second third substrate 632b substantially corresponds to the third substrate 532 of FIG. 30, but having only the third substrate second conductive pattern 536b. The second fourth substrate 642b substantially corresponds to the fourth substrate 542 of FIG. 30, but having only the fourth substrate second conductive sub-pattern 541b. The second fifth substrate 652b substantially corresponds to the fifth substrate 552 of FIG. 30, but having only the fifth substrate second conductive sub-pattern 549b.

The various vias and plated through holes of the first magnetic device 601a and a second magnetic device 601b as substantially similar as those for the first magnetic device 501a and the second magnetic device 501b, respectively, of FIG. 30, so is not repeated here. It is understood that various vias and plated through holes may affect electrical communication within each of the first magnetic device 601a and the second magnetic device 601b and between the first magnetic device 601a and the second magnetic device 601b.

The first base substrate 602a, the first second substrate 622a, and the first third substrate 632a is shown in FIG. 31 as assembled. The second base substrate 602b, the second second substrate 622b, and the second third substrate 632b is also shown in FIG. 31 as assembled. The first fourth substrate 642a, second fourth substrate 642b, first fifth substrate 652a, and the second fifth substrate 652b are shown in an exploded view.

The first second substrate 622a comprises a first second substrate second surface 624a including a first second substrate conductive pattern 626a disposed thereon. The first fourth substrate 642a comprises a first fourth substrate second surface 644a including a first fourth substrate conductive pattern 646a disposed thereon, and a first fourth substrate first surface 645a. The first third substrate 632a comprises a first third substrate second surface 634a including a first third substrate conductive pattern 636a disposed thereon. The first fifth substrate 652a comprises a first fifth substrate second surface 654a including a first fifth substrate conductive pattern 656a disposed thereon.

The second second substrate 622b comprises a second second substrate second surface 624b including a second second substrate conductive pattern 626b disposed thereon. The second fourth substrate 642b comprises a second fourth substrate second surface 644b including a second fourth substrate conductive pattern 646b disposed thereon, and a second fourth substrate first surface 645b. The second third substrate 632b comprises a second third substrate second surface 634b including a second third substrate conductive pattern 636b disposed thereon. The second fifth substrate 652b comprises a second fifth substrate second surface 654b including a second fifth substrate conductive pattern 656b disposed thereon.

Respective electrical traces are operable to interconnect the first transformer embedded magnetic device 601a and the second transformer embedded magnetic device 601b in electrical communication defining an embedded magnetic component 600 as a vertical multi-transformer device. Via interconnects at respective input/output pads connect the primary and secondary windings of the first magnetic device 601a and the second magnetic device 601b in either a series or parallel configuration, suitable for a particular purpose.

To manage parameters like winding inductance, impedance, resistance and power dissipation, it is useful to array two or more transformers or inductors in either a series or parallel configuration. The embodiments presented herein may be used to manage such parameters, among others.

Figure 32:
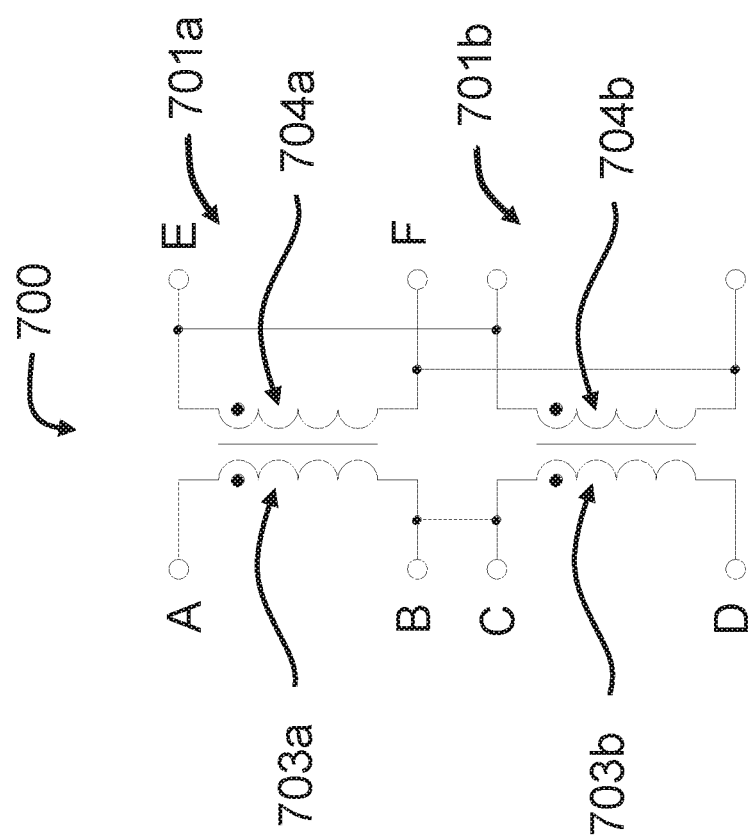
FIG. 32 depicts a schematic diagram of a magnetic component including a first transformer and a second transformer that are vertically arrayed, in accordance with an embodiment.

FIG. 32 depicts a schematic diagram of a multi-device embedded magnetic component 700 including a first transformer 701a and a second transformer 701b that are vertically arrayed, in accordance with an embodiment. The first primary winding 703a and the second primary winding 703b are electrically connected in series and the first secondary winding 704a and the second secondary winding 704b are electrically connected in parallel.

This embodiment may be useful for switch mode power converters (SMPC), where the voltage is stepped-down from primary to secondary windings and the current is stepped-up from the primary to secondary windings. For SMPC applications, the primary inductance is large enough to support the input switching voltage, according to the relation V=L di/dt. Also, the number of windings on the primary side is large enough to prevent the ferromagnetic core from reaching saturation. In conventional wire-wound devices and embedded magnetics, the core structure limits the number of windings. In accordance with embodiments herein, the primary winding of two or more transformers may be connected in series to achieve a required number of windings and inductance. In conventional wire-wound devices, the secondary side of the transformer delivers current to the load. In accordance with embodiments herein, the secondary windings are connected in parallel to minimize power dissipation in the windings due to the AC impedance and winding.

In connecting the windings of two transformers in series and parallel, the designer must scale the winding ratios accordingly. The winding ratio N, is defined as the ratio of the number of turns in the primary winding Np divided by the windings on the secondary winding, Ns. Windings in series are added to get the aggregate number of turns in the winding. The aggregate number of turns for parallel windings is determined by adding the inverse of each winding and then taking the inverse of the sum. For example, the winding ratio of M number of transformers connected in a series and parallel configuration, one can use the relationship:

$$N = N_p/N_s = (N_{p1} + N_{p2} + \ldots N_{pM})/(1/N_{s1} + 1/N_{s2} + 1/N_{sM})^{-1}$$

Similarly, the aggregate winding inductance can be determined by summing the inductance of devices connected in series and taking the inverse of the inverse sum of devices connected in parallel.

FIGS. 33A-33D depicts printed circuit board artwork for a multi-device embedded magnetic component 700 as a device substantially similar to the embedded magnetic component 600 of FIG. 31 comprising two stacked, in vertical alignment, embedded magnetic transformers in the form of a first transformer 701a and a second transformer 701b which are connected in a series and parallel configuration, in accordance with the schematic of FIG. 32. Each embedded magnetic device is implemented on a separate base substrate: first base substrate 602a and second base substrate 602b, respectively, of FIG. 31. Each embedded magnetic device is implemented with 4 circuit layers, with the primary winding on inner layers, first layer and second layer, and the secondary winding on outer layers, third layer and fourth layer.

FIG. 33A illustrates printed circuit board artwork of a first layer first primary winding superimposed on a second layer first primary winding of the first transformer 701a, such as shown for first magnetic device 601a of FIG. 31. The first layer first primary winding is in the form of the first second substrate conductive pattern 726a which is disposed on the first second substrate 722a defining the first layer. The second layer first primary winding is in the form of a first third substrate conductive pattern 736a which is disposed on the first third substrate 732a defining the second layer. The first primary winding of the first transformer 701a, which surrounds core 410, comprises substantially of the first second substrate conductive pattern 726a and the first third substrate conductive pattern 736a.

FIG. 33B illustrates printed circuit board artwork of a first layer second primary winding superimposed on a second layer second primary winding of the second transformer 701b, such as shown for second magnetic device 601b of FIG. 31. The first layer second primary winding is in the form of the second second substrate conductive pattern 726b which is disposed on the second second substrate 722b defining the first layer. The second layer second primary winding is in the form of the second third substrate conductive pattern 736b which is disposed on the second third substrate 732b defining the second layer. The second primary winding of the second transformer 701b, which surrounds core 410, comprises substantially of the second second substrate conductive pattern 726b and the second third substrate conductive pattern 736b.

FIG. 33C illustrates printed circuit board artwork of a third layer first secondary winding superimposed on a fourth layer first secondary winding of the first transformer 701a, such as shown for first magnetic device 601a of FIG. 31. The third layer first secondary winding is in the form of the first fourth conductive pattern 746a which is disposed on the first fourth substrate 742a defining the third layer. The fourth layer first secondary winding is in the form of the first fifth substrate conductive pattern 756a which is disposed on the first fifth substrate 752a defining the fourth layer. The first secondary winding of the first transformer 701a comprises substantially of the first fourth conductive pattern 746a and the first fifth substrate conductive pattern 756a.

FIG. 33D illustrates printed circuit board artwork of a third layer second secondary winding superimposed on a fourth layer second secondary winding of the second transformer 701b. The third layer second secondary winding is in the form of the second fourth conductive pattern 746b which is disposed on the second fourth substrate 742b defining the third layer. The fourth layer second secondary winding is in the form of the second fifth substrate conductive pattern 756b which is disposed on the second fifth substrate 752b defining the fourth layer. The second secondary winding of the second transformer 701b comprises substantially of the second fourth conductive pattern 746b and the second fifth substrate conductive pattern 756b.

Connection nodes are identified with the letters A through F. In FIGS. 33A-33D, the primary winding starts is at node A and its polarity is noted by the dot in the schematic symbol. Nodes C and B connect in series and the primary winding finishes at node D. The secondary winding starts at node E and finishes is at node F. Although the embodiment of FIGS. 33A-33D comprises two arrayed transformers, it is appreciated that a larger number of transformers may be vertically stacked and arrayed, as required by the application or purpose of the device.

Figure 34:
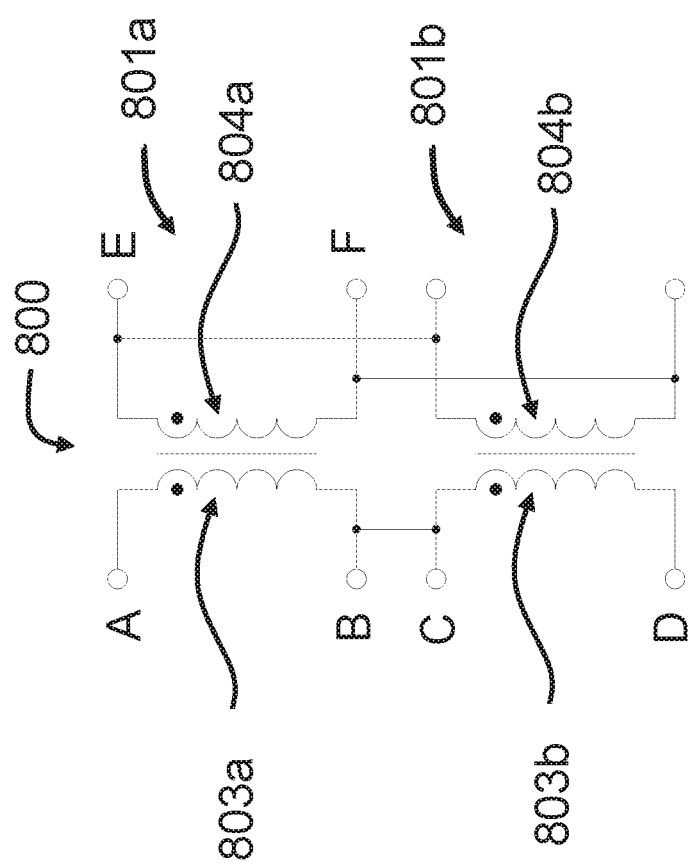
FIG. 34 depicts a schematic diagram of a magnetic component, in the form of a power transformer, including a first transformer and a second transformer that are horizontally arrayed, in accordance with an embodiment.

FIG. 34 depicts a schematic diagram of a magnetic component 800, in the form of a power transformer, including a first transformer 801a and a second transformer 801b that are horizontally arrayed, in accordance with an embodiment. The first primary winding 803a and the second primary winding 803b are electrically connected in series and the first secondary winding 804a and the second secondary winding 804b are electrically connected in parallel.

Figure 35B:
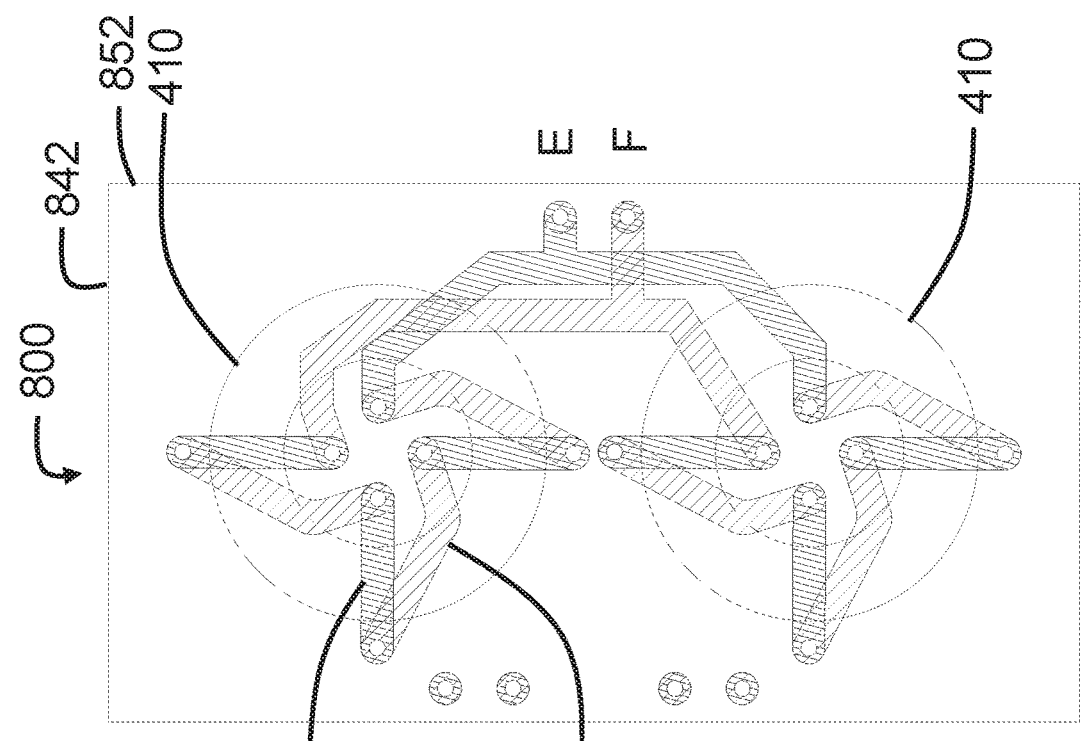
FIGS. 35A-35B depicts printed circuit board artwork for a magnetic component substantially similar to the horizontal multi-transformer embedded magnetic component of FIG. 30 comprising two embedded magnetic transformers in the form of a first magnetic device and a second magnetic device, which are connected in a series and parallel configuration, in accordance with the schematic of FIG. 34.
Figure 35A:
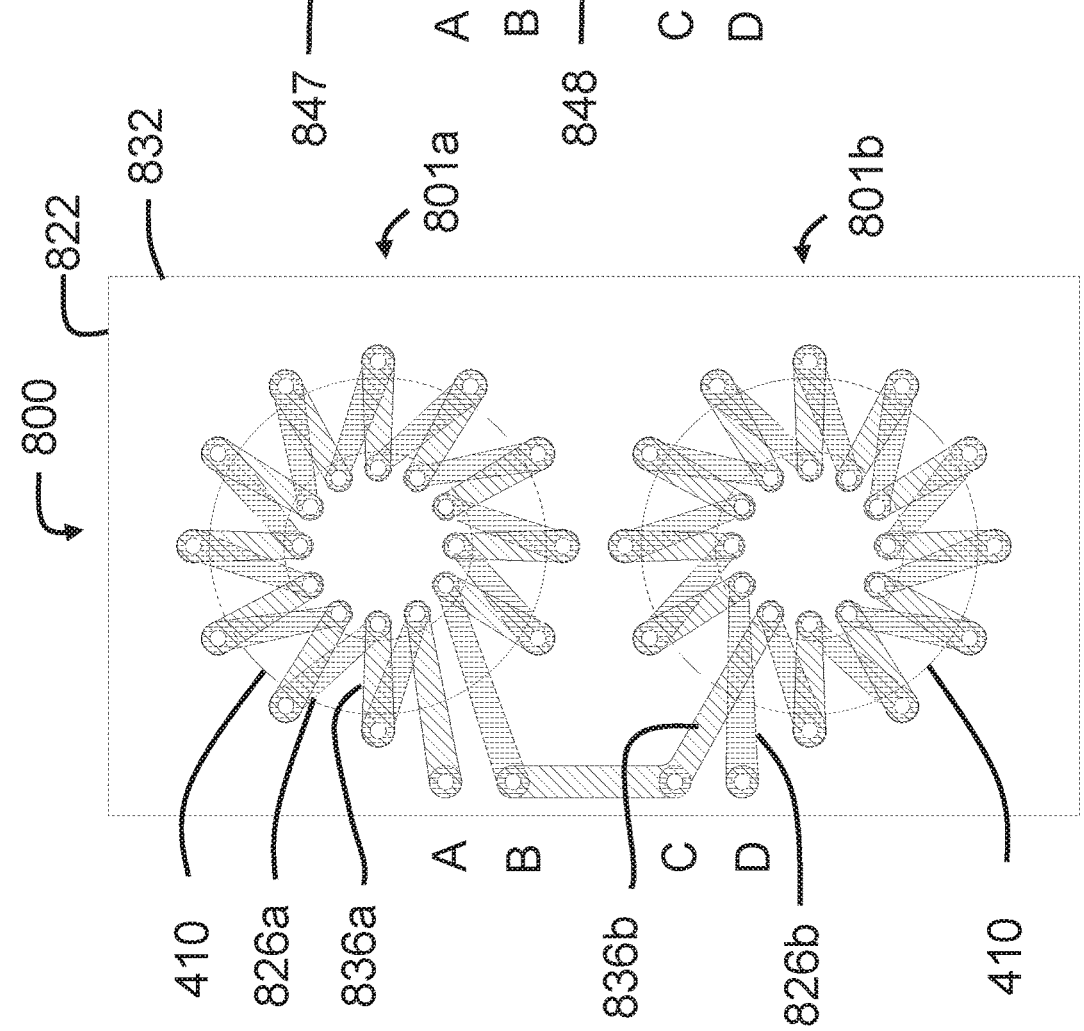
Figure 36:
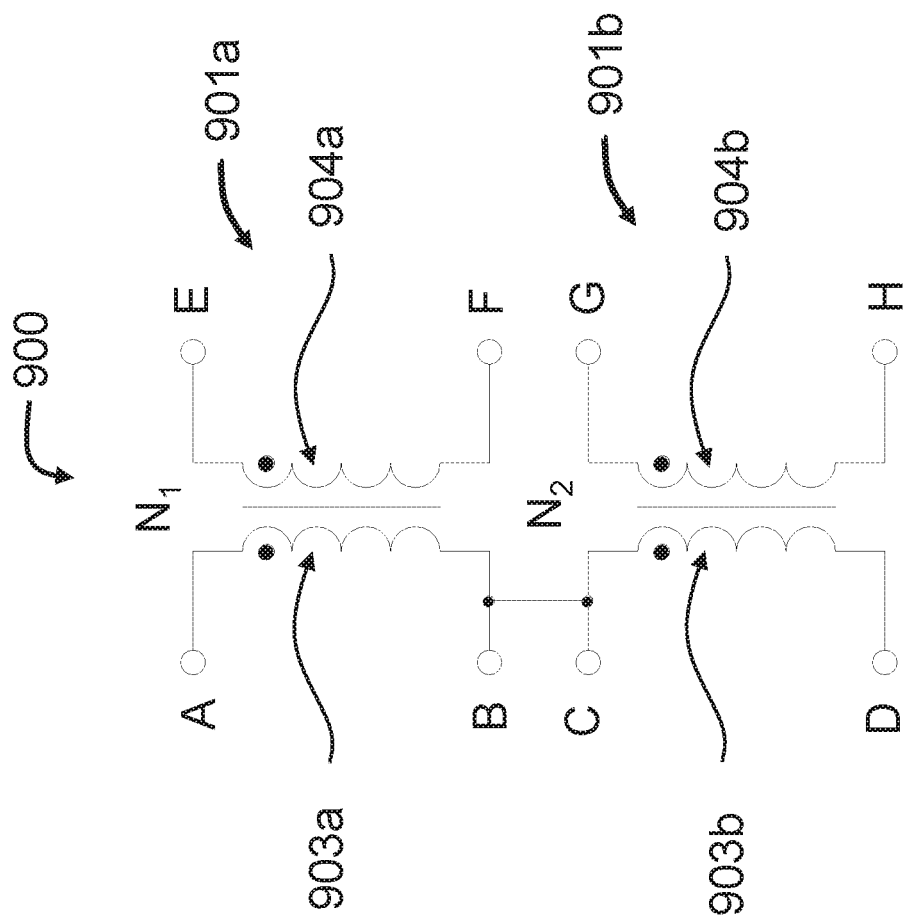
FIG. 36 is a schematic diagram of a magnetic component that is useful for power converter applications, in accordance with an embodiment.

FIGS. 35A-35B depicts printed circuit board artwork for a magnetic component substantially similar to the horizontal multi-device embedded magnetic component 500 of FIG. 30 comprising two embedded magnetic transformers in the form of a first transformer 801a and a second transformer 801b, which are connected in a series and parallel configuration, in accordance with the schematic of FIG. 34. The first transformer 801a and the second transformer 801b are in a side-by-side relationship, sharing a same base substrate 502 of FIG. 30, sharing a same second substrate 822 and sharing a same third substrate 832, and with a core 410 disposed in each core cavity 431 defined by the base substrate 502 of FIG. 30. The horizontal multi-transformer embedded magnetic component 800 further comprises a fourth substrate 842, and a fifth substrate 852, each operable to interconnect the first transformer 801a and the second transformer 801b in electrical communication, defining a horizontal multi-transformer embedded magnetic component 800.

The transformer first layer primary windings are implemented by the second substrate 822 and the second layer primary windings are implemented by the third substrate 832. The transformer first layer secondary windings are implemented by a fourth substrate 842 and the second layer secondary windings are implemented by a fifth substrate 852. The circuit design on the second substrate 822 and the third substrate 832 and the fourth substrate 842 and the fifth substrate 852 determines whether the windings are connected in either a series, parallel, or combination of series and parallel configuration.

FIG. 35A illustrates printed circuit board artwork of a first layer primary winding superimposed on a second layer primary winding of the first transformer 801a and the second transformer 801b. The first layer primary winding is in the form of the second substrate first conductive pattern 826a and the second substrate second conductive pattern 826b which are disposed on the second substrate 822 defining the first layer. The second layer primary winding is in the form of the second substrate first conductive pattern 836a and the second substrate second conductive pattern 836b which are disposed on the third substrate 832 defining the second layer.

FIG. 35B illustrates printed circuit board artwork of a third layer secondary winding superimposed on a fourth layer secondary winding of the first transformer 801a and the second transformer 801b. The third layer secondary winding is in the form of the fourth conductive pattern 847 which is disposed on the fourth substrate 842 defining the third layer. The fourth layer secondary winding is in the form of the fifth conductive pattern 848 which is disposed on the fifth substrate 852 defining the fourth layer.

Referring to FIGS. 34 and 35A, 35B, the transformer primary windings are connected in series, with the start at node A and the finish at node B. The secondary windings are connected in parallel to minimize the winding impedance. The start begins at node E and the winding finish is at node F. The embodiment shown in FIGS. 35A and 35B depicts two transformers in the array. It is appreciated that a larger number of transformers may be arrayed in the horizontal configuration, as required by the application and purpose.

FIGS. 36 and 37A-37D shows a configuration that is useful for power converter applications, in accordance with an embodiment. It is often useful to have multiple voltage outputs in a circuit. In the schematic diagram of FIG. 36, a magnetic component 900 comprising two transformers, a first transformer 901a and a second transformer 901b, are arrayed with the primary windings 903a, 903b connected in series. The secondary windings 904a, 904b are separate. The turns ratio, N, between the primary and secondary windings can be different, as indicated by N1 and N2. FIGS. 37A-37D provides an embodiment of the winding artwork for a stacked configuration of the schematic of FIG. 36.

The artwork in FIGS. 37A-37D is substantially similar to the embodiment of FIGS. 33A-33C. However, in this configuration the secondary windings are split and not connected in parallel. FIG. 37D also depicts a different number of secondary windings for the first transformer 901a and second transformer embedded magnetic device 901b as compared with the embodiment of FIG. 33D.

FIG. 37A illustrates printed circuit board artwork of a first layer first primary winding superimposed on a second layer first primary winding of the first transformer 901a, such as shown for first magnetic device 601a of FIG. 31. The first layer first primary winding is in the form of the first second substrate conductive pattern 926a which is disposed on the first second substrate 922a defining the first layer. The second layer first primary winding is in the form of a first third substrate conductive pattern 936a which is disposed on the first third substrate 932a defining the second layer. The first primary winding of the first embedded magnetic device as a first transformer 901a, which surrounds core 410, comprises substantially of the first second substrate conductive pattern 726a and the first third substrate conductive pattern 936a.

FIG. 37B illustrates printed circuit board artwork of a first layer second primary winding superimposed on a second layer second primary winding of the second transformer 901b, such as shown for second magnetic device 601b of FIG. 31. The first layer second primary winding is in the form of the second second substrate conductive pattern 926b which is disposed on the second second substrate 922b defining the first layer. The second layer second primary winding is in the form of the second third substrate conductive pattern 936b which is disposed on the second third substrate 932b defining the second layer. The second primary winding of the second embedded magnetic device as a second transformer 901b, which surrounds core 410, comprises substantially of the second second substrate conductive pattern 926b and the second third substrate conductive pattern 936b.

FIG. 37C illustrates printed circuit board artwork of a third layer first secondary winding superimposed on a fourth layer first secondary winding of the first embedded magnetic device as a first transformer 901a, such as shown for first magnetic device 601a of FIG. 31. The third layer first secondary winding is in the form of the first fourth conductive pattern 946a which is disposed on the first fourth substrate 942a defining the third layer. The fourth layer first secondary winding is in the form of the first fifth substrate conductive pattern 956a which is disposed on the first fifth substrate 954a defining the fourth layer. The first secondary winding of the first embedded magnetic device as a first transformer 901a comprises substantially of the first fourth conductive pattern 946a and the first fifth substrate conductive pattern 956a.

FIG. 37D illustrates printed circuit board artwork of a third layer second secondary winding superimposed on a fourth layer second secondary winding of the second transformer 901b, such as shown for second magnetic device 601b of FIG. 31. The third layer second secondary winding is in the form of the second fourth conductive pattern 946b which is disposed on the second fourth substrate 942b defining the third layer. The fourth layer second secondary winding is in the form of the second fifth substrate conductive pattern 956b which is disposed on the second fifth substrate 954b defining the fourth layer. The second secondary winding of the second embedded magnetic device as a second transformer 901b comprises substantially of the second fourth conductive pattern 946b and the second fifth substrate conductive pattern 956b.

The artwork in FIG. 37C depicts that the first secondary winding has four winding turns for the first transformer 901a and that the second secondary winding has six winding turns for the second transformer 901b in FIG. 37D. It is appreciated that a different number of turns and winding ratios may be implement on each transformer embedded magnetic device in accordance with design needs. Also, it is appreciated to array more transformer embedded magnetic devices in the vertical stack, as required by the application. Transformers can also be arrayed in a combination of horizontal and vertical configurations to meet the performance goals of the application.

In both power and communication circuits, for example, it is often useful to have a transformer connected in series with either a filter inductor or a common mode inductor. A common mode inductor consists of two or more conductive windings on a ferromagnetic core. The common mode inductor is commonly referred to as a common mode "choke" and is used for filtering common mode signals. The common mode inductor provides a high impedance to common mode signals and low impedance to differential mode signals.

Figure 38:
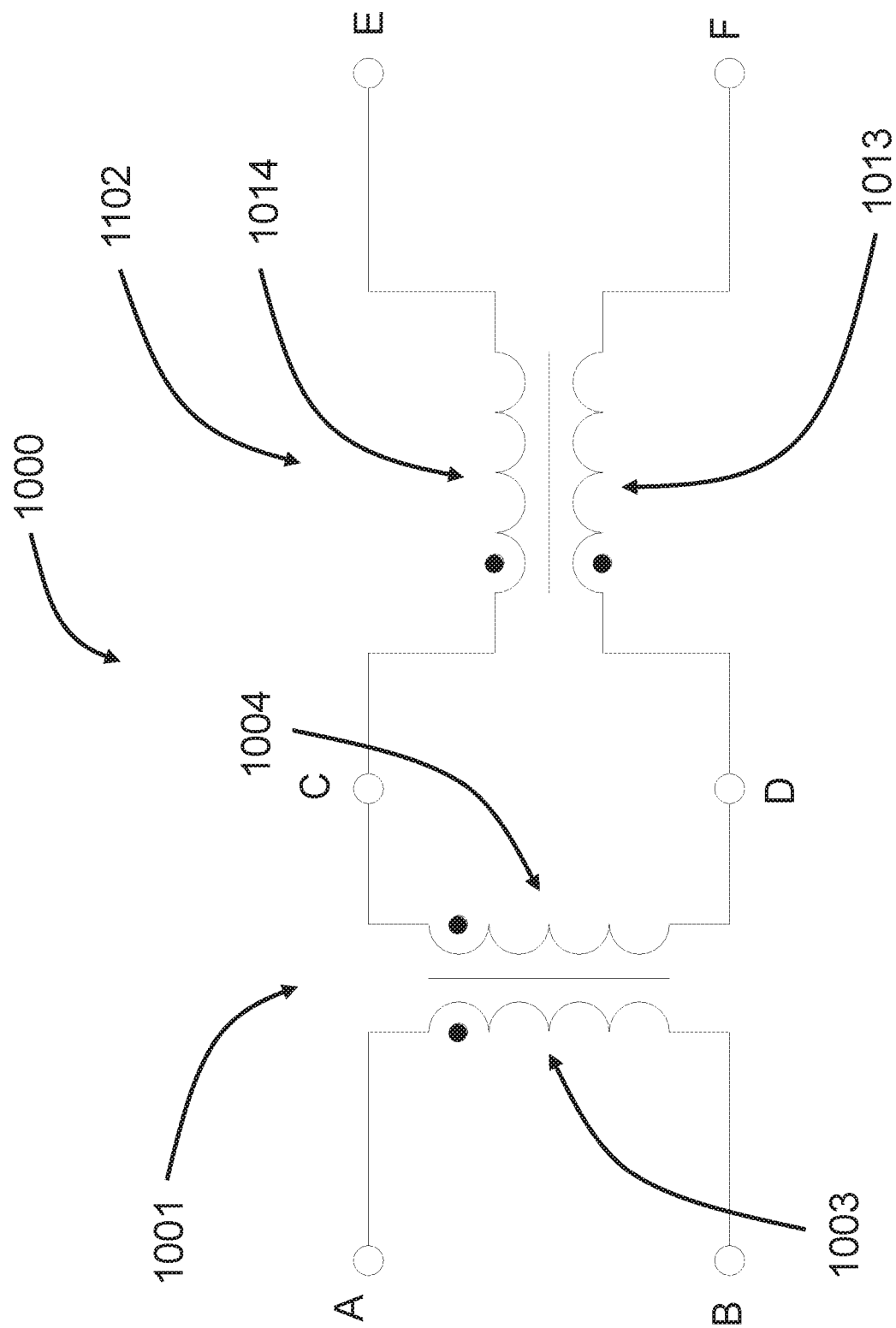
FIG. 38 depicts a schematic diagram of a transformer-choke magnetic component 1000, in the form of a series connection of a transformer embedded magnetic device and a common mode inductor, in accordance with an embodiment.

FIG. 38 depicts a schematic diagram of a transformer-choke magnetic component 1000, in the form of a series connection of a transformer embedded magnetic device 1001 and a common mode inductor 1105, in accordance with an embodiment.

FIGS. 39A-39D depicts printed circuit board artwork for the transformer-choke magnetic component 1000 of FIG. 38 comprising a transformer embedded magnetic device 1001 and the common mode inductor 1005 connected in a stacked, vertical alignment, in accordance with the schematic of FIG. 38, in accordance with an embodiment. Each embedded magnetic device is implemented on a separate base substrate: first base substrate 1022a and second base substrate 1022b, respectively. Each embedded magnetic device is implemented with 4 circuit layers, with the primary windings 1003, 1004 on inner layers, first layer and second layer, and the secondary windings 1013, 1014 on outer layers, third layer and fourth layer, of the respective devices. Only the primary windings will be further discussed as the implementation of the secondary windings will be understood from the previous embodiments.

Figures 39A, 39B:
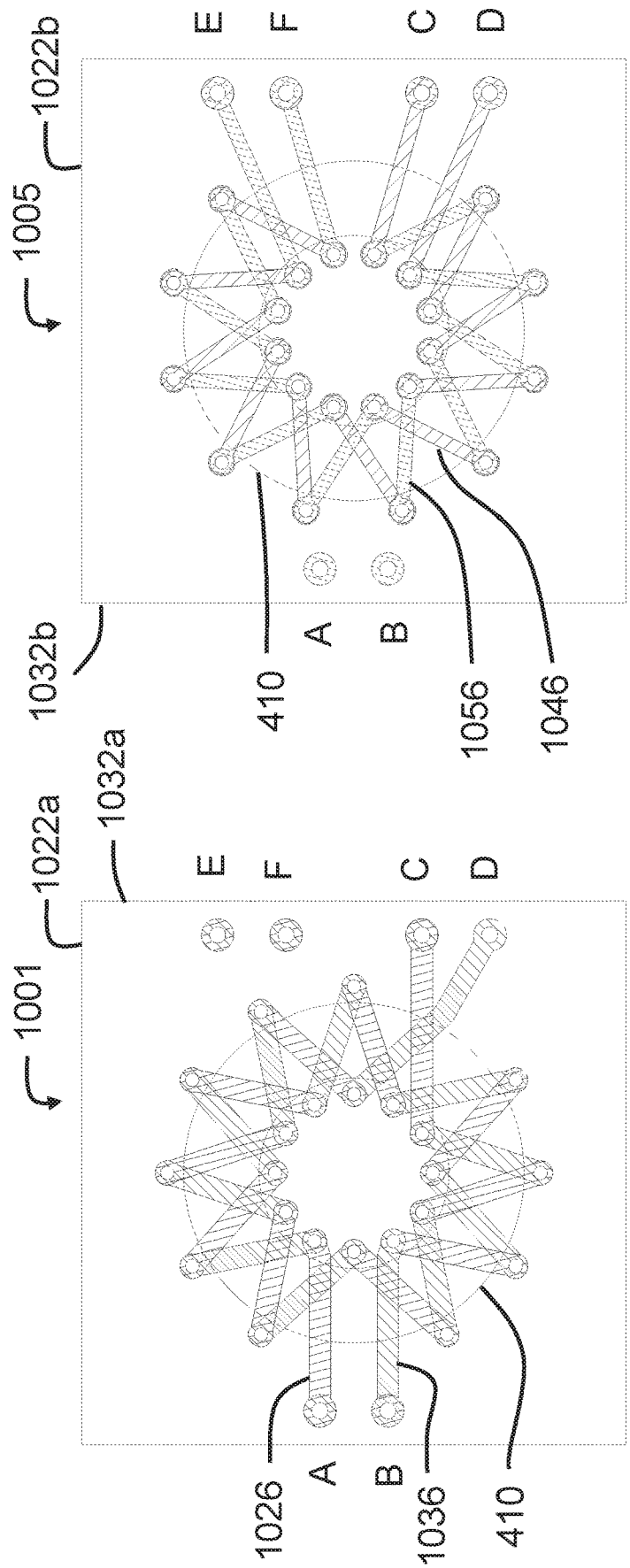
FIG. 39A illustrates printed circuit board artwork of a first layer first primary winding superimposed on a second layer first primary winding of the transformer embedded magnetic device, such as shown for first magnetic device 601a of FIG. 31, in accordance with the schematic of FIG. 38, in accordance with an embodiment.
FIG. 39B illustrates printed circuit board artwork of a first layer second primary winding superimposed on a second layer second primary winding of the common mode inductor, in accordance with an embodiment.

FIG. 39A illustrates printed circuit board artwork of a first layer first primary winding superimposed on a second layer first primary winding of the transformer embedded magnetic device 1001, such as shown for first magnetic device 601a of FIG. 31. The first layer first primary winding is in the form of the first second substrate conductive pattern 1026 which is disposed on the first second substrate 1022a defining the first layer. The second layer first primary winding is in the form of a first third substrate conductive pattern 1036 which is disposed on the first third substrate 1032a defining the second layer. The first primary winding of the transformer embedded magnetic device 1001, which surrounds core 410, comprises substantially of the first second substrate conductive pattern 1026 and the first third substrate conductive pattern 1036.

FIG. 39B illustrates printed circuit board artwork of a first layer second primary winding superimposed on a second layer second primary winding of the common mode inductor 1105, in accordance with an embodiment. The first layer second primary winding is in the form of the second second substrate conductive pattern 1046 which is disposed on the second second substrate 1022b defining the first layer. The second layer second primary winding is in the form of the second third substrate conductive pattern 1056 which is disposed on the second third substrate 1032b defining the second layer. The second primary winding of the common mode inductor 1105, which surrounds core 410, comprises substantially of the second second substrate conductive pattern 1046 and the second third substrate conductive pattern 1056.

Node A is the start of the first primary windings of the transformer embedded magnetic device 1001 and node B is the finish. On the secondary side, nodes C and D join the transformer embedded magnetic device 1001 and the common mode inductor 1005. Node C has the same polarity as node A, and node D has the same polarity as Node B. On the common mode inductor 1005, the windings at node C and D both start on the same first layer and finish on the same second layer. The output at node E is the same polarity as node A and the output at node F is the same polarity as node B.

FIG. 40 depicts a schematic diagram of a two-choke magnetic component 1100, in the form of a series connection of a first common mode inductor 1101 and a second common mode inductor 1105, in accordance with an embodiment. This configuration is useful to implement a higher number of windings and consequently a higher common mode inductance.

FIGS. 41A-41D depicts printed circuit board artwork for the two-choke magnetic component 1100 of FIG. 40 comprising a first common mode inductor 1101 and the second common mode inductor 1105 connected in a stacked, vertical alignment, in accordance with the schematic of FIG. 40, in accordance with an embodiment. Each embedded magnetic device is implemented on a separate base substrate: first base substrate 1122a and second base substrate 1122b, respectively. Each embedded magnetic device is implemented with 4 circuit layers, with a first primary winding 1103 and a second primary winding 1112 on inner layers, first layer and second layer, and the first secondary winding 1114 and second secondary winding 1113 on outer layers, third layer and fourth layer, of the respective devices. Only the primary windings will be further discussed as the implementation of the secondary windings will be understood from the previous embodiments.

FIG. 41A illustrates printed circuit board artwork of a first layer first primary winding 1103 superimposed on a second layer first primary winding 1112 of the first common mode inductor 1101. The first layer first primary winding 1103 is in the form of the first second substrate conductive pattern 1126 which is disposed on the first second substrate 1122 defining the first layer. The second layer first primary winding is in the form of a first third substrate conductive pattern 1136 which is disposed on the first third substrate 1132a defining the second layer. The first primary winding of the first common mode inductor 1101, which surrounds the core 410, comprises substantially of the first second substrate conductive pattern 1126 and the first third substrate conductive pattern 1136.

FIG. 41B illustrates printed circuit board artwork of a first layer second primary winding superimposed on a second layer second primary winding of the common mode inductor 1105, in accordance with an embodiment. The first layer second primary winding is in the form of the second second substrate conductive pattern 1146 which is disposed on the second second substrate 1122b defining the first layer. The second layer second primary winding is in the form of the second third substrate conductive pattern 1156 which is disposed on the second third substrate 1132b defining the second layer. The second primary winding of the common mode inductor 1105, which surrounds the core 410, comprises substantially of the second second substrate conductive pattern 1146 and the second third substrate conductive pattern 1156.

Implementing two embedded magnetic inductors or common mode inductors in series in the horizontal configuration may use the methods presented for earlier embodiments. In the vertical configuration, the designer must take care to on which layers the windings start and finish, assuring the right polarity on the inductors. Referring again to FIGS. 41Aa and 41B, for the first common mode inductor 1101, the start windings (nodes A and D) are implemented on the first layer and the finish windings are implemented on the second layer. On the second common mode inductor 1105, the start windings (B and E) are implemented on the first layer and the finish windings (C and F) are implemented on the second layer. While the embodiment shows two devices in series, it is appreciated that a larger number of devices may be arrayed as required by the application.

There are a variety of ferromagnetic materials that can be used for the cores of the embedded magnetic devices. Each has different permeability, frequency response and loss characteristics. It is appreciated that inductors comprising different magnetic materials may be used, for example, but not limited to, to extend the frequency of operation and to emphasize impedance (attenuation) within a specific frequency band. Also, the inductors may be implemented with shunt or parallel capacitors to implement filter circuits. Having access to the intermediate nodes, B and E in FIG. 40, provides a connection point for adding shunt and parallel capacitors and enhancing the filtering properties of the circuit, in accordance with embodiments.

In another embodiments common mode inductors are implemented in series with differential mode inductors. FIG. 42 depicts a schematic diagram of a magnetic component 1200 comprising a 2-wire common mode inductor 1201 in series with a 2-wire differential mode inductor 1204, in accordance with an embodiment. The dots in the schematic identify the winding polarity. In this embodiment, the polarity of the second winding in the differential mode inductor 1204 opposes the polarity in the winding of the common mode inductor 1201. Each embedded magnetic device is implemented with 4 circuit layers, with a first primary winding 1203 and a second primary winding 1212 on inner layers, first layer and second layer, and the first secondary winding 1214 and second secondary winding 1213 on outer layers, third layer and fourth layer, of the respective devices. Only the primary windings will be further discussed as the implementation of the secondary windings will be understood from the previous embodiments.

Implementing a common mode inductor 1201 and differential mode inductor 1204 in series in a horizontal configuration may use the methods presented for earlier embodiments. In the vertical stacked configuration, the designer must take care on which layers the windings start and finish.

FIGS. 43A and 43B is artwork for a stacked common mode inductor 1201 and differential mode inductor 1204 in accordance with an embodiment. On the common mode inductor 1201 the start windings (nodes A and D) are implemented on the first layer and the finish windings are implemented on the second layer. On the differential mode inductor 1204 the start winding at node B is implemented on the first layer and the finish winding at node E is implemented on the second layer. The corresponding finish winding at node E is implemented on the second layer and the start winding at node F is implemented on first layer. While the embodiment shows two devices in series, it is appreciated that more devices can be arrayed as required by the application.

FIGS. 43A and 43B depicts printed circuit board artwork for the 2-wire common mode inductor 1201 and a 2-wire differential mode inductor 1204 connected in a stacked, vertical alignment, in accordance with the schematic of FIG. 42, in accordance with an embodiment. Each embedded magnetic device is implemented on a separate base substrate: first base substrate 1222*a* and second base substrate 1222*b*, respectively. Each embedded magnetic device is implemented with 4 circuit layers, with the primary winding on inner layers, first layer and second layer, and the secondary windings on outer layers, third layer and fourth layer, of the respective devices. Only the primary windings will be further discussed as the implementation of the secondary windings will be understood from the previous embodiments.

FIG. 43A illustrates printed circuit board artwork of a first layer first primary winding superimposed on a second layer first primary winding of the 2-wire common mode inductor 1201. The first layer first primary winding is in the form of the first second substrate conductive pattern 1226 which is disposed on the first second substrate 1222*a* defining the first layer. The second layer first primary winding is in the form of a first third substrate conductive pattern 1236 which is disposed on the first third substrate 1232*a* defining the second layer. The first primary winding of the 2-wire common mode inductor 1201, which surrounds the core 410, comprises substantially of the first second substrate conductive pattern 1226 and the first third substrate conductive pattern 1236.

FIG. 43B illustrates printed circuit board artwork of a first layer second primary winding superimposed on a second layer second primary winding of the 2-wire differential mode inductor 1204, in accordance with an embodiment. The first layer second primary winding is in the form of the second second substrate conductive pattern 1246 which is disposed on the second second substrate 1222*b* defining the first layer. The second layer second primary winding is in the form of the second third substrate conductive pattern 1257 which is disposed on the second third substrate 1232*b* defining the second layer. The second primary winding of the 2-wire differential mode inductor 1204, which surrounds the core 410, comprises substantially of the second second substrate conductive pattern 1246 and the second third substrate conductive pattern 1257.

Capacitive coupling between the conductors of the primary conduit may induce noise coupling. Electromagnetic energy can also emanate from the ferromagnetic core and stimulate other cores and windings in the array. In addition to coupling signal noise, capacitive coupling can also cause circuit imbalance and limit the device's useful frequency bandwidth. Ground shielding may be added around an embedded magnetic device to reduce coupled noise between the winding conductors, in accordance with embodiments.

In power circuits, shielding may be used to provide heat conduction and help spread heat away from the embedded magnetic device.

On a single base substrate, such as presented in FIG. 30, ground shielding can be implemented between two arrayed devices by filling the regions between the two devices with conductive copper, in accordance with an embodiment. Grounded vias can be arrayed between two devices to provide shielding singularly or in combination with the shielding presented above.

When two embedded magnetic devices are stacked, such as presented in FIG. 31, coupling may occur between the conductive windings on the various layers. Capacitive and inductive coupling diminishes with distance and can be managed to some degree by separating the stack arrayed devices with an insulation layer, such as one comprising polyimide, among others. There may be constraints on the device height, however, which may limit the thickness of the separation layer. Due to their close proximity, inner layer windings will exhibit the greatest amount of capacitive coupling. An insulation layer with low dielectric constant to minimize capacitive coupling may be added to the assembly.

In accordance with an embodiment, a conductive layer is placed between two stacked devices and connected to electrical ground during the device operation, to implement a ground shield there between. This will isolate the two substrates from coupled noise, and will also provide the greatest amount of capacitive loading and imbalance on the conductive windings.

In accordance with another embodiment, the ground shield comprises a cross-hatch screen pattern rather than a solid conductive layer. The cross-hatch screen can provide an effective shield while reducing the capacitance between the winding conductors. The cross-hatch screen will provide capacitive loading and create imbalance, yet to a lower degree than the solid conductive shield. To further minimize capacitive coupling and imbalance, conductive fingers on the ground shield layer can be arrayed either between the inner layer winding conductors or implemented as thin conductors positioned between the winding conductors on interfacing layers, among others, in accordance with embodiments.

Figure 44:
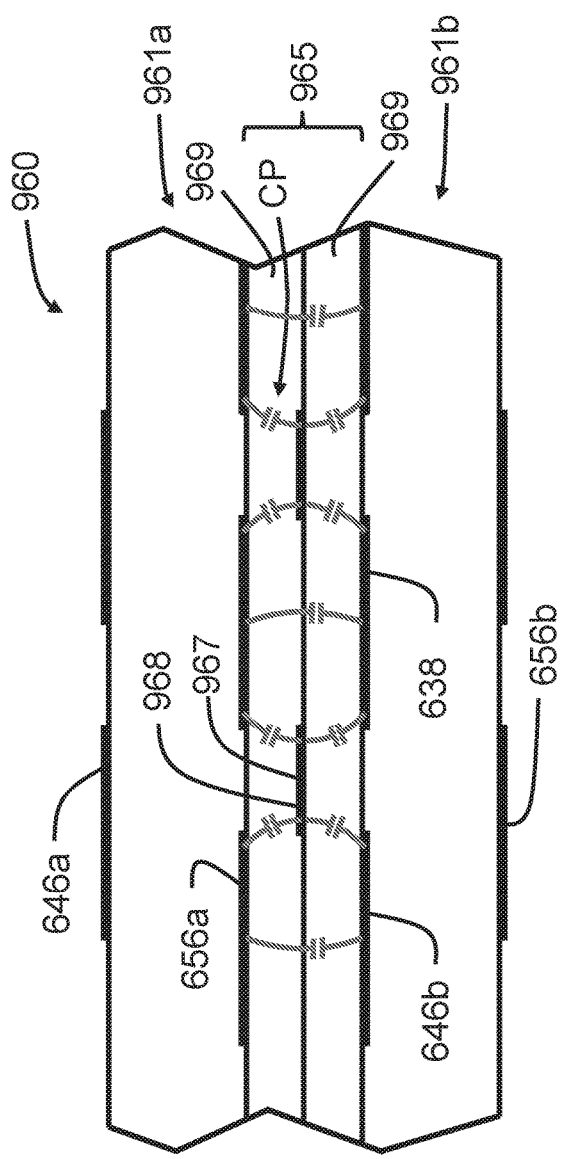
FIG. 44 is a cross sectional view of two stacked magnetic components, first embedded magnetic component and second embedded magnetic component, with a ground shielding layer there between, in accordance with an embodiment.

FIG. 44 is a cross sectional view of a magnetic component 960 comprising two stacked magnetic components, first embedded magnetic component 961*a* and second embedded magnetic component 961*b*, with a ground shielding layer 965 there between, in accordance with an embodiment. The first embedded magnetic component 961*a* and second embedded magnetic component 961*b* may be represented by the first magnetic device 601*a* and a second magnetic device 601b coupled in vertical alignment of FIG. 31. A ground shielding layer 965 is disposed between the first embedded magnetic component 961a and second embedded magnetic component 961b, placing the ground shielding layer 965 adjacent to the first fifth substrate conductive pattern 656a and second fourth substrate conductive pattern 646b, respectively.

The ground shielding layer 965 comprises a ground shield conductive pattern 967 and dielectric layer 969. Schematic symbols representing the coupling capacitance CP between the first fifth substrate conductive pattern 656a and second fourth substrate conductive pattern 646b and the ground shield conductive pattern 967 are shown in the cross sectional view. The ground shielding layer 965 can be implemented with a low dielectric material. PCB processes may use FR-4 fiberglass or polyimide material, but is not limited thereto. The cross section shows ground shield conductive pattern 967 placed substantially mid-way between the individual conductive traces of the first fifth substrate conductive pattern 656a and second fourth substrate conductive pattern 646b. In the horizontal direction, the ground shield conductive pattern 967 is staggered between the individual conductive traces of the first fifth substrate conductive pattern 656a and second fourth substrate conductive pattern 646b to minimize overlap and capacitive coupling.

Figure 45:
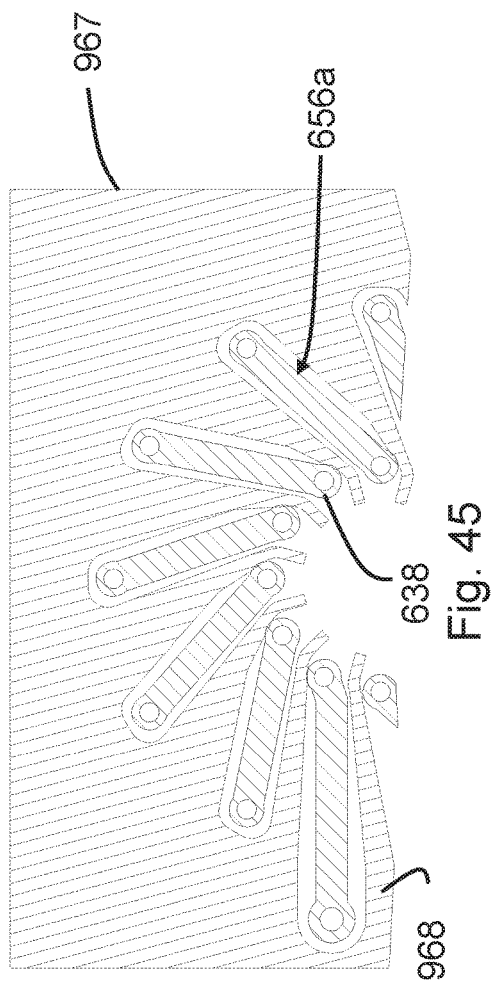
FIG. 45 depicts a section of the circuit artwork for the first fifth substrate conductive pattern showing the individual fifth conductive traces implemented on the first fifth substrate, as shown in FIG. 31, by way of example.

FIG. 45 depicts a section of the circuit artwork for the first fifth substrate conductive pattern 656a showing the individual fifth conductive traces 638 implemented on the first fifth substrate 652a, as shown in FIG. 31, by way of example. The first fifth substrate conductive pattern 656a is superimposed on the ground shield conductive pattern 967 implemented on another layer, in accordance with an embodiment. The ground shield conductive pattern 967 defines shield fingers 968 placed between the individual fifth conductive traces 638. The shield fingers 968 are not connected at the center of the first fifth substrate conductive pattern 656a to avoid creating ground-loops. It is understood that there is a trade-off between the amount of shielding and capacitive loading. The shield fingers 968 can be shaped to balance capacitive coupling and the amount of shielding.

Figure 46:
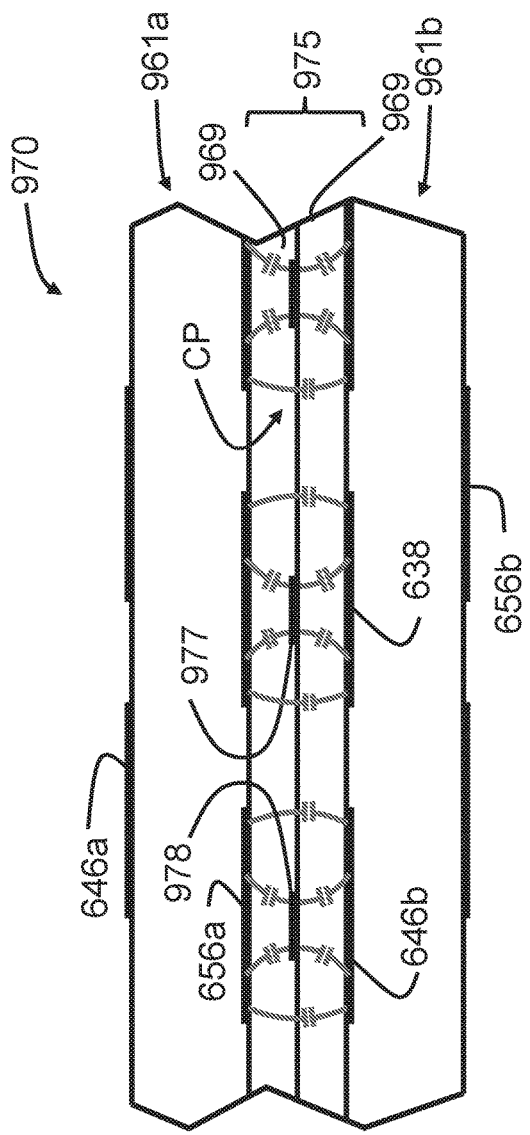
FIG. 46 is a cross sectional view of two stacked magnetic components, first embedded magnetic component and second embedded magnetic component, with a ground shielding layer there between, in accordance with an embodiment.

FIG. 46 is a cross sectional view of a magnetic component 970 comprising two stacked magnetic components, first embedded magnetic component 961a and second embedded magnetic component 961b, with a ground shielding layer 975 there between, in accordance with an embodiment. The first embedded magnetic component 961a and second embedded magnetic component 961b may be represented by the first magnetic device 601a and a second magnetic device 601b coupled in vertical alignment of FIG. 31. A ground shielding layer 975 is disposed between the first embedded magnetic component 961a and second embedded magnetic component 961b, placing the ground shielding layer 975 adjacent to the first fifth substrate conductive pattern 656a and second fourth substrate conductive pattern 646b, respectively.

The ground shielding layer 975 comprises a ground shield conductive pattern 977 and dielectric layer 969. Schematic symbols representing the coupling capacitance CP between the first fifth substrate conductive pattern 656a and second fourth substrate conductive pattern 646b and the ground shield conductive pattern 967 are shown in the cross sectional view. The ground shielding layer 975 can be implemented with a low dielectric material. PCB processes may use FR-4 fiberglass or polyimide material, but is not limited thereto. The cross section shows ground shield conductive pattern 977 placed substantially mid-way between the individual conductive traces of the first fifth substrate conductive pattern 656a and second fourth substrate conductive pattern 646b. In the horizontal direction, the ground shield conductive pattern 967 is directly between the individual fifth conductive traces 638 of the first fifth substrate conductive pattern 656a and second fourth substrate conductive pattern 646b to minimize overlap and capacitive coupling.

Figure 47:
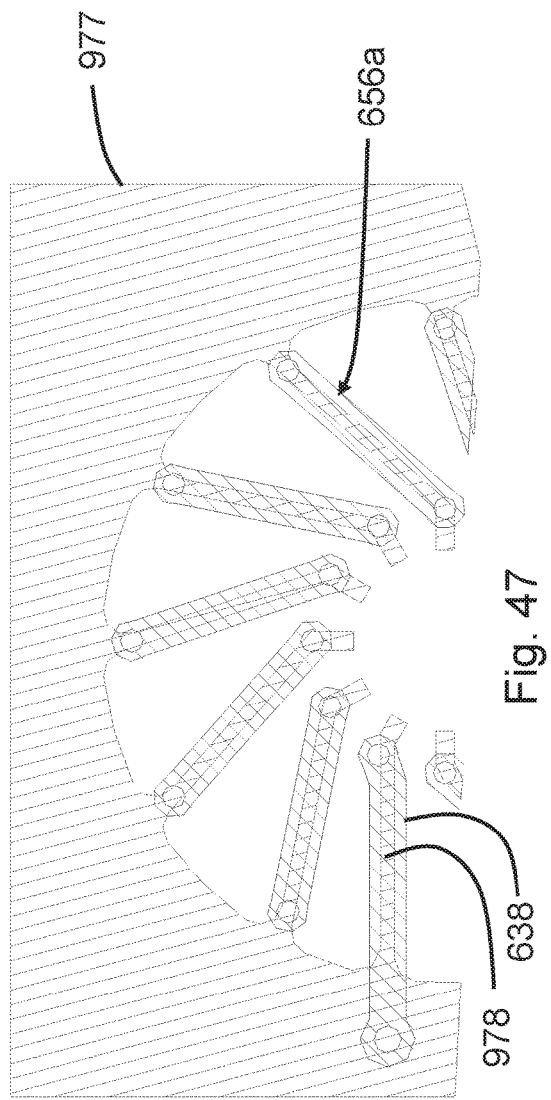
FIG. 47 depicts a section of the circuit artwork for the first fifth substrate conductive pattern showing the individual fifth conductive traces implemented on the first fifth substrate, as shown in FIG. 31.

FIG. 47 depicts a section of the circuit artwork for the first fifth substrate conductive pattern 656a showing the individual fifth conductive traces 638 implemented on the first fifth substrate 652a, as shown in FIG. 31, by way of example.

The first fifth substrate conductive pattern 656a is superimposed on the ground shield conductive pattern 967 implemented on another layer, in accordance with an embodiment. The ground shield conductive pattern 977 defines shield fingers 978 placed between the individual fifth conductive traces 638 and the second fourth substrate conductive pattern 646b, so as to at least partially overlap the individual fifth conductive traces 638. The shield fingers 978 are not connected at the center of the first fifth substrate conductive pattern 656a to avoid creating ground-loops. It is understood that there is a trade-off between the amount of shielding and capacitive loading. The shield fingers 978 can be shaped to balance capacitive coupling and the amount of shielding.

The shield fingers 978 are substantially thinner than the individual fifth conductive traces 638 of the first fifth substrate conductive pattern 656a and second fourth substrate conductive pattern 646b. The shield fingers 978 capture electromagnetic energy that may pass between the individual fifth conductive traces 638 of the first fifth substrate conductive pattern 656a and second fourth substrate conductive pattern 646b. The designer has to balance the coupling capacitance, circuit imbalance and the degree of shielding provided by the shield fingers 978. Keeping the shield fingers thin reduces imbalance as compared with a wider shield finger, yet allows some electromagnetic energy to pass between the individual fifth conductive traces 638 of the first fifth substrate conductive pattern 656a and second fourth substrate conductive pattern 646b.

Example Embodiments of Embedded High Voltage Transformer Components and Methods

Transformers are commonly used on electronics systems to provide voltage isolation. This is to protect humans and electrical equipment from voltage surges and spikes that may occur in and electronic system. Typically, consumer electronics and telecommunications systems require a voltage isolation of 1500 Vrms. The levels are dictated by regional safety standards. Medical and industrial equipment often uses very high voltages and require up to 5000 Vrms isolation between the equipment and user interface. The advent of wide band gap transistors is pushing voltage isolation requirements even higher. Integrated Gate Bipolar Transistors and (IGBT) and Silicon Carbide MOSFET (SIC) are able to operate with drain-source voltages exceeding 12 kV. Gate drive transformers are used to isolate the control circuitry from these high voltages while driving the transistor gate. These devices are pushing the voltage isolation requirements from 5 kV to 10 kV and higher.

The voltage isolation is established between the primary and secondary windings of a transformer and meeting these requirements challenges the design and construction. Most transformers are fabricated by winding wire around a ferromagnetic core. A transformer typically has one or more primary winding and one or more secondary windings. To achieve high voltage isolation with the conventional construction, the designer must use wire with heavy insulation and/or segment the windings with a high isolation barrier material. Polyimide tape and plastic partitions are typically are used to separate the primary and secondary windings in a power transformer. These add extra steps, complexity and size to the construction. Heavy insulation also increase the size of the device and can be difficult to wind due to its rigidity. It is also difficult to strip the insulation and expose the wire ends so that they may be soldered or fastened to the input and output (I/O) terminals on the device package.

Exposed conductors around the wire terminations can also be a problem. When under high voltage stress, the air around the exposed conductors will ionize. While the terminals may be spaced sufficiently apart for voltage isolation, the ionized air can bypass any plastic barriers or insulating tape and form a cloud around the insulated transformer windings. Breakdown will occur at weak spots in the wire insulation. It is important to have sufficient insulation around the windings as well as separation and barriers between the exposed terminals. Meeting voltage isolation requirements often requires that the whole transformer package be encapsulated in a potting epoxy, which further increases size and adds process cost and can limit heat dissipation.

There are a variety of materials that can be used to insulate wire. Common insulators are paper, lacquer, nylon, Polyvinyl Chloride (PVC) and a variety of other polymer materials. High voltage "reinforced" wire will one or more of these materials to meet isolation requirements. Polymer materials often provide voltage isolation exceeding 12 kV/mm (300 V/mil). Typical magnetic wire may have 0.025-0.05 mm (1 or 2 mils) of insulation whereas "reinforced" wire will have multiple layer coatings and/or much thicker coatings. This often makes the wire rigid and difficult to wind around the magnetic core.

The laminate materials used to fabricate printed circuit boards (PCBs) are generally based on polymers and provide high voltage isolation that matches or exceeds what is available on reinforced wire. Embedded magnetics (EM) and planar magnetics (PM) both provides alternative to the traditional construction of winding wire around a ferromagnetic core. Both use PCB construction and processes to produce transformers. In providing voltage isolation, both of these constructions have an advantage in that the conductor spacing is accurately defined by photolithography and the conductor separation and insulation thickness can be managed better than the wire wound construction. Some laminate materials are distinguished by high breakdown voltages and different laminate materials may be used within the PCB layer stack to achieve specific voltage isolation within a specific PCB thickness.

EM transformers are constructed by routing out a cavity in a substrate, embedding a ferromagnetic core into a substrate material and encapsulating the core to hold it in place. One or more copper layers are laminated to both the top and bottom of the substrate. Vias are drilled and plated to interconnect winding patterns that are imaged and etched on the top and bottom copper layers.

Similarly, planar magnetics can use PCB construction and processes to produce a transformer. In this case, layers of spiral windings are implemented on multiple layers within the printed circuit board and ferromagnetic elements are clamped to the top and bottom surface to realize the transformer function.

Three techniques are used to control the voltage isolation in PCB transformers; selection of laminate material, winding separation on each layer, and the winding separation between layers. From a materials standpoint, PCB laminates provide very good insulation. FR-4 is a widely used fiberglass laminate that typically provides voltage isolation in the range of 11.8 KV/mm to 19.8 kV/mm (300 to 500 V per mil). More refined version of FR-4 can provide 25 kV/mm (975V/mil) of isolation. Other laminates provide even higher levels of isolation, yet are less common and often cost much more than standard FR-4. Some of high voltage laminates that provide voltage isolation exceeding 45 kV/mm are: Arlon 33n (polyimide), Isola G200 (Bismaleimide/Triazine Epoxy, BT), Isola P96 (polyimide), Nelco 5000 (Bismaleimide/Triazine Epoxy, BT) and Dupont Pyralux (polyimidie film), among others. These materials typically have a cost exceeding 5× the cost of conventional FR-4 laminates and so it is beneficial mix them with FR-4 laminates and only apply them between conductor layers that are subject to high voltage stress. Mixing the laminate materials helps constrain the cost, rather than simply fabricating total PCB stack-up with the high cost insulators. Device size and thickness is often an issue for modern electronic systems and the discriminate use of high voltage laminates can also reduce the distance between conductor layers and help manage the overall device thickness.

Conductor spacing is another way to control voltage isolation. With both EM and PM construction, the transformers windings are accurately defined by imaging and etching. This allows for the conductors to be accurately and consistently separated by a specific distance. Required separation can be determined by the material and device voltage requirement. For instance, if one wants to achieve 5000 kV isolation using common FR-4 material, the conductors should be separated by >0.43 mm apart (0.43 mm×11.7 kV/mm=5 kV). The outer surface of PCBs are usually covered with either a polymer solder mask or polyimide cover-lay. Polymer liquid photo-imageable solder mask is widely used in the PCB industry and can provide about 19 kV/mm (500V/mil) of voltage isolation if applied evenly with no air bubbles. To assure even thickness over the PCB conductors and no air bubbles, it is necessary to apply, image, and cure two layers of liquid-imaged solder mask. Even though the underlying conductors may be spaced accurately for a specified voltage isolation, if they are near an exposed pad of high voltage potential, they may be susceptible to breakdown due to an ion cloud forming over the PCB during high voltage stress events. The ion cloud effectively shortens the distance between the exposed pad and the conductors under the solder mask. Rather than the horizontal distance between conductors, the isolation merely depends on the thickness of the solder mask between the cloud and the underlying conductors. Higher insulation resistance can be achieved by applying a polyimide film cover-lay over the conductors, instead of solder mask. Products like the Dupon Pyralux film, noted above, have breakdown voltages exceeding 117 kV/mm (3000 kV/mil). Two mils of polyimide cover-lay will provide isolation exceeding 5 kV. This illustrates how the circuit density can be improved by implementing high voltage laminates at the HV stress spots.

Figure 48A:
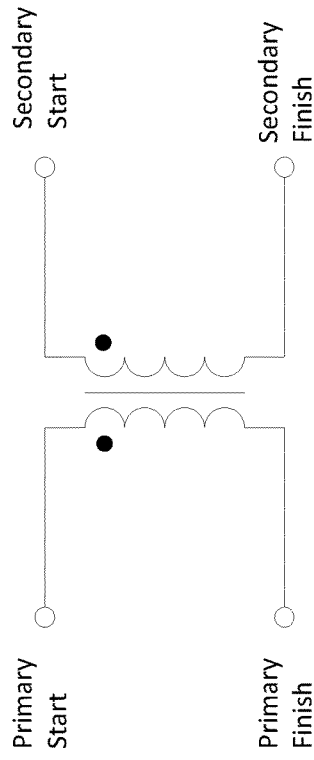
FIG. 48a is a schematic diagram of a transformer with a primary and secondary winding.
Figure 48B:
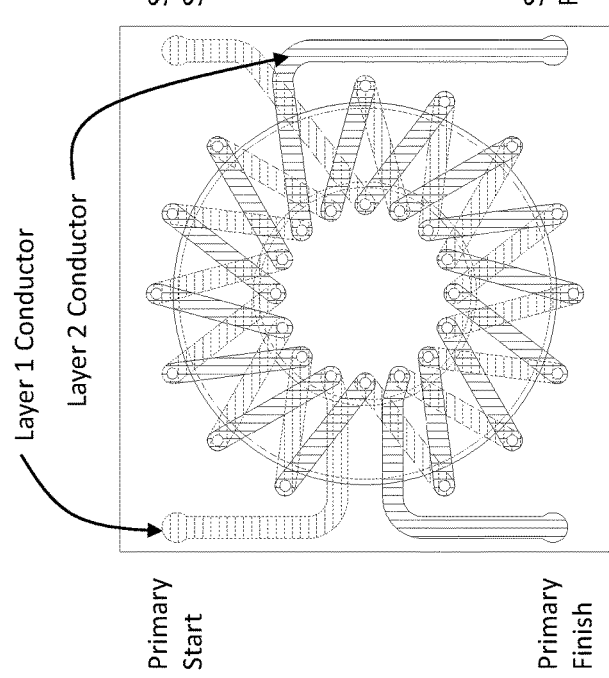
FIG. 48b is an EM transformer that is bifilar wound around a toroid shaped core with 2 conductive layers.
Figure 48C:
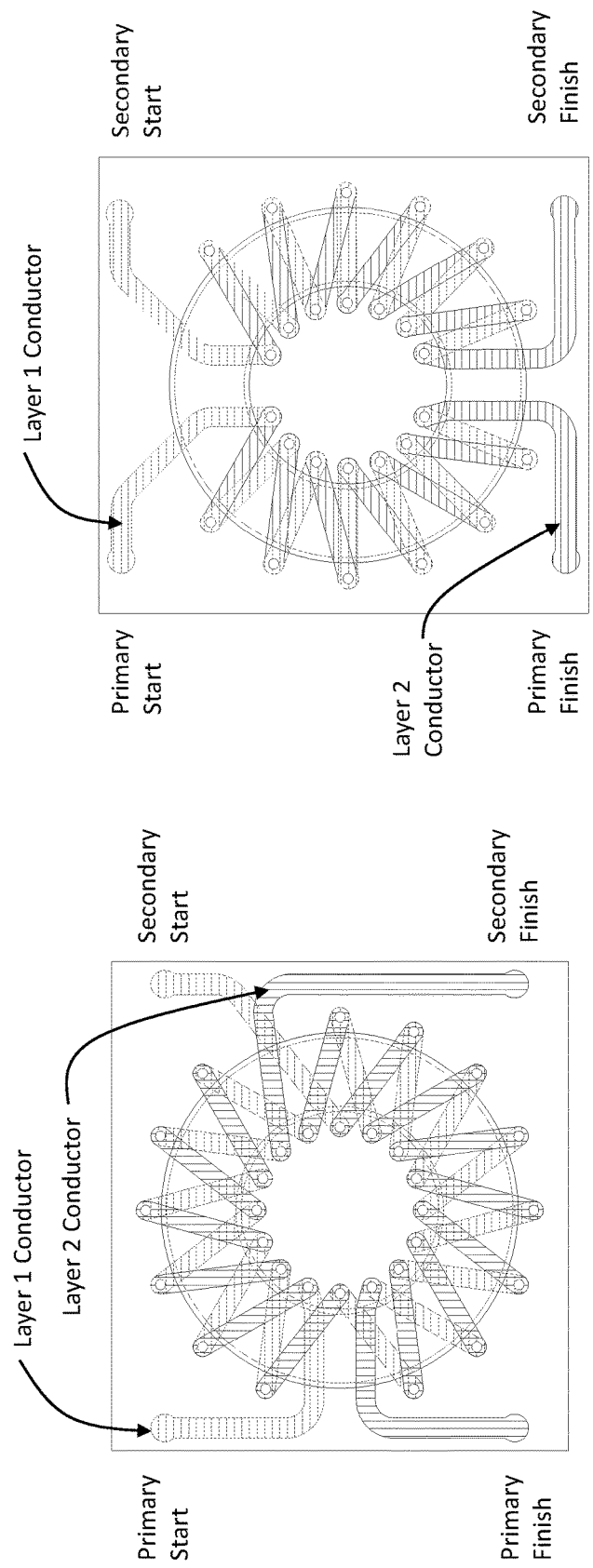
FIG. 48c is an EM transformer that is sector wound around a toroid shaped core with 2 conductive layers.

Transformers are used to provide voltage isolation in power conversion and communication systems. FIG. 48*a* is a schematic representation of a transformer and identifies a primary and secondary winding. Voltage isolation is a measure of the amount of voltage the transformer can handle before the insulation breaks down and arcing occurs between the primary and secondary windings. FIG. 48*b* shows a diagram of an embedded magnetic transformer that is bifilar wound around a toroid (ring) shaped core. This is a 2-layer PCB construction, where one winding pattern array is implemented on the bottom layer and a complementary pattern is implemented on the top layer. Plated-through-hole-vias (PTH) interconnect the top and bottom winding pattern. The primary and secondary windings are interleaved and in close proximity, particularly at the center via array. Voltage isolation is dependent on the conductor and via spacing and presents a limitation on the number of windings that can be implemented around the core. Higher voltage isolation requires more distance between the vias and conductors in the center of the toroid, so there is a trade-off between the number of windings that may be implemented and voltage isolation that can be achieved. The number of windings determines the inductance of the transformer, which is a key factor in the devices electrical performance. FIG. 48c shows a diagram of a sector wound EM transformer. Here the primary and secondary windings are separated on two halves of the core. The sector winding configuration can provide better isolation than the bifilar wound device, however, sector wound transformers typically exhibit higher leakage inductance. Leakage inductance is a secondary parameter that limits the transformer frequency bandwidth and contributes to switching loss in power conversion systems.

FIG. 49 is a cross section view of the EM transformer layer stack. Voltage isolation is determined by the selection of laminate materials, separation between the vias and the thickness of the laminates and substrate material between the conductors and the ferromagnetic core. As noted above, voltage isolation is primarily determined by the material properties of the substrate and laminate and the separation between the conductors and vias. A solder mask is typically applied to the top and bottom surfaces of a printed circuit board to provide environmental protection and voltage isolation between the conductors. Liquid-image-able solder mask is widely used in PCB fabrication and has voltage breakdown capabilities similar to FR-4 laminate. The designer has to take particular care where conductors run near exposed pads. If a high voltage stress is present between the exposed pad and the conductors under the solder-mask, the air above the underlying conductors can ionize and become highly conductive. The solder mask is only a few mils thick and may have micro-cracks and micro air-bubbles. So while the transformer windings on the PCB may have been designed with separation for a specific voltage isolation, the ionization of the air above the conductors may present a shorter breakdown path. A remedy is to use multiple layers of solder mask, however, additional process steps are required and there is a practical limitation to the number of layers and thickness that may be applied. An alternative is to apply a high voltage polyimide film on the top and bottom surfaces. Polyimide provides 10× more voltage isolation than a similar thickness of liquid imaged solder mask.

Another way to provide voltage isolation, and also accommodate more windings, is to implement the EM transformer with 4 or more layers. Again, FIG. 50a shows a schematic diagram of a transformer with a primary and secondary winding. FIG. 50b shows the primary windings implemented on layers 2 and 3. FIG. 50c shows the secondary windings on layers 1 and 4. FIG. 50d shows the composite of the windings. Note that the vias on the primary and secondary windings are interleaved. At the outer via array, they are spaced at sufficient distance to achieve the required voltage isolation. At the inner region there are actually two circular via arrays. The primary windings are interconnected on one circular via array and the secondary windings are interconnected on the second circular via array. The distance between the two concentric arrays is designed to achieve a specific voltage isolation.

FIG. 51 is a cross section view of a 4 layer EM transformer. The whole transformer could be fabricated with high voltage laminate materials, like BT and polyimide. However, these materials are relatively expensive compared to standard FR-4 laminates. On the other hand, a construction wholly built with FR-4 may require a relatively thick laminate layer between winding layers 1 and 2 and winding layers 3 and 4 to achieve a desired voltage isolation. The device height is often a factor in an electronics assembly and a design based only on FR-4 laminate may be prohibitively thick. By mixing FR-4 substrate with high voltage laminates, high voltage isolation can be achieved while managing the PCB thickness.

Figure 52A:
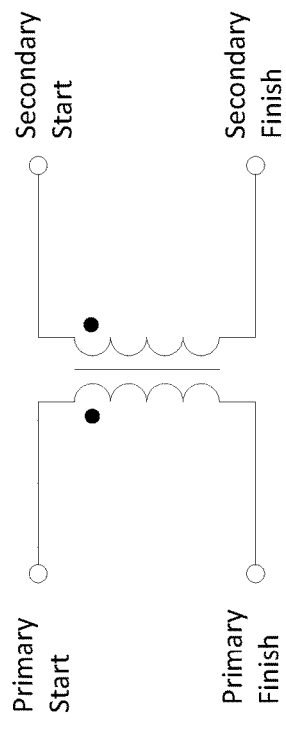
FIG. 52a is a schematic diagram of a transformer with a primary and secondary winding.
Figure 52C:
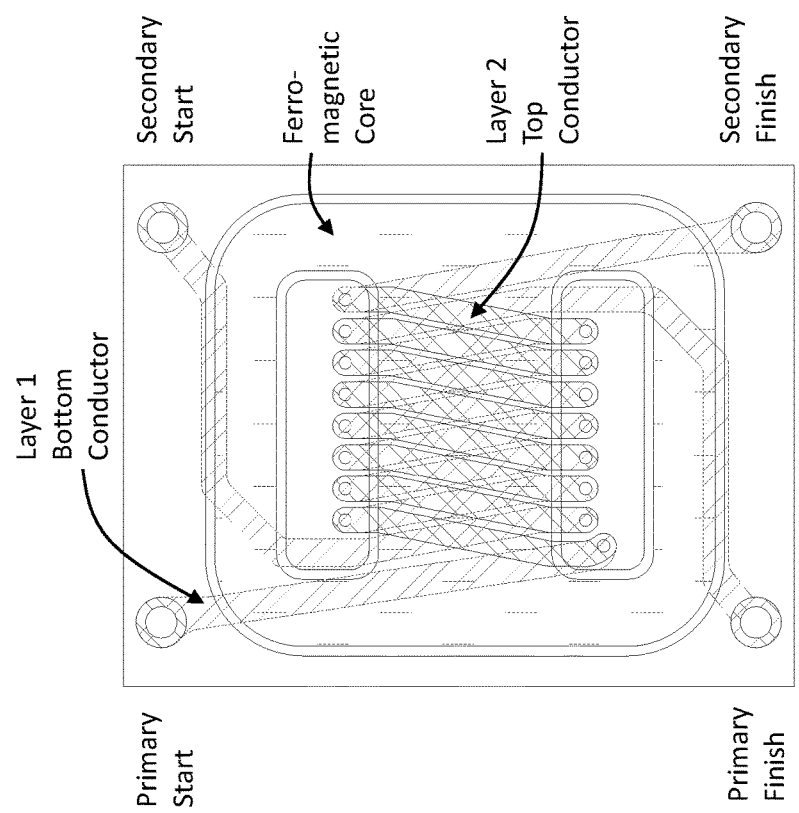
FIG. 52c is an EM transformer that is bifilar wound with 2 conductive layers and a square binocular shaped core.
Figure 52B:
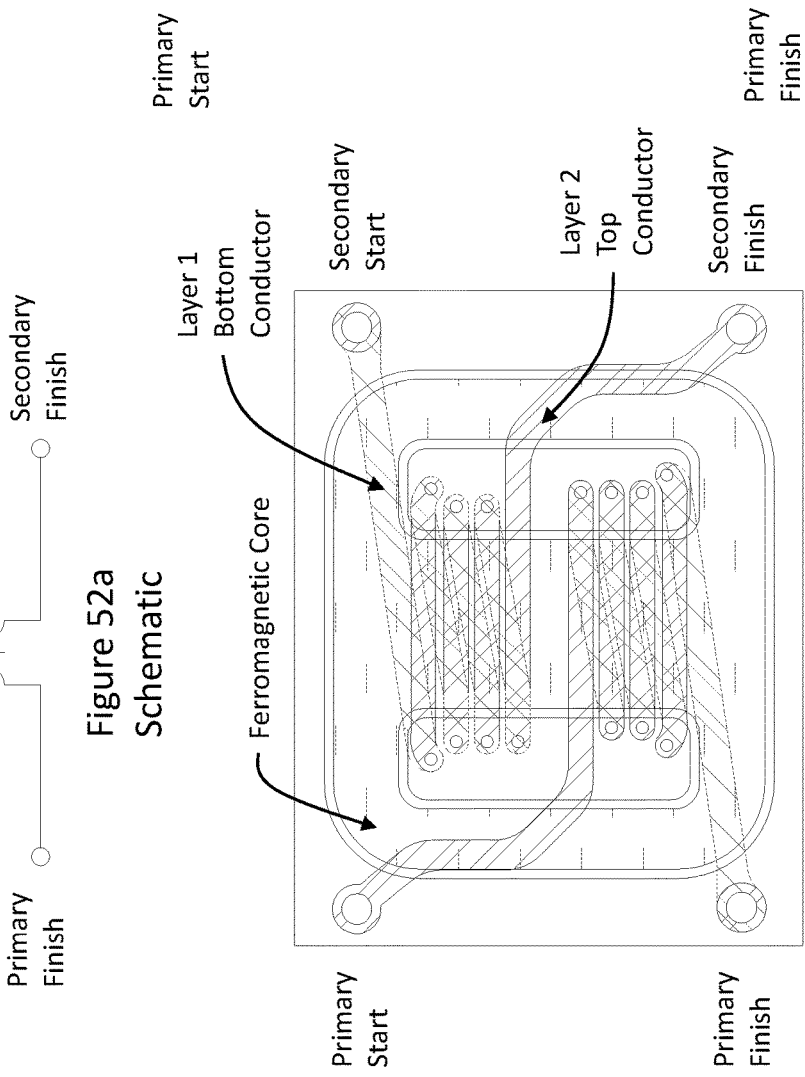
FIG. 52b is an EM transformer that is sector wound with 2 conductive layers and a square binocular shaped core.

Embedded magnetics often complement semiconductor packaging to produce functions like power conversion, digital isolation and isolation amplifiers. With semiconductor packaging, it is often beneficial to implement transformers and inductors on square shaped ferromagnetic cores with two window areas. This core shape is often referred to as a square binocular. This places the EM windings over a wide area of the core material and provides for higher inductance values within a confined area. FIG. 52a is a schematic diagram of a transformer with a primary and secondary winding. FIGS. 52b and 52c show sector and bifilar windings applied to the square binocular core. The PCB layer stack is similar to that depicted in FIG. 49. FIG. 53a is an EM transformer that has 4 conductive layers and a square binocular shaped core, showing layers 1 and 4, which form the primary winding. FIG. 53c shows the composite winding configuration for a 4 layer EM transformer on a square binocular core. This diagram depicts a 6:9 winding ratio. FIG. 53b shows the primary windings implemented on the inner layers 2 and 3. FIG. 53a shows the secondary windings implemented on layers 1 and 4. FIG. 54 shows the cross section view of the PCB layer stack for the 4 layer transformer implemented on the square binocular core. As was the case in FIG. 51, a high voltage laminate is used to provide voltage isolation between the primary and secondary winding layers.

Planar magnetics is another type of construction used to produce PCB transformers. With the planar construction, spiral conductor patterns are implemented on multiple PCB layers and two ferromagnetic core elements are clamped to the outer surface of the PCB. The spiral usually coils around a center window area, allowing the core to penetrate the PCB. It is critical that the PCB thickness be well controlled so that the two core elements can meet and touch. As with the EM transformers described above, a mix of standard FR-4 and high voltage laminate material may be used in the PM design to provide high voltage isolation within a specific PCB thickness.

FIG. 55a is a schematic diagram of a transformer and identifies a primary and secondary winding. FIG. 55b is an exploded view of a planar magnetic transformer and shows two ferromagnetic core elements that come together and clamp across a PCB that contains the transformer windings. The primary and secondary windings are implemented in two or more layers. Here, we will simply consider a 4 layer PCB design where two layers are allocated for the primary windings and two are for the secondary winding. FIG. 55c shows spiral conductor patterns on each of the 4 layers and then the primary and secondary windings overlapped in the bottom cells. As indicated above, more winding layers can be implemented to achieve a specific primary inductance and secondary inductance.

FIG. 56 is a cross section view of the PM transformer assembly where a high voltage laminate is applied at the interface between the primary and secondary windings. This diagram simply depicts four total winding layers. The number of winding layers implemented is determined by the desired electrical specifications. What's important is that the primary windings are layered on one half of the layer stack and the secondary winding are layered on the other half, with a high voltage insulating laminate material applied in between.

While there has been illustrated and/or described what are presently considered to be example embodiments of claimed subject matter, it will be understood by those skilled in the art that various other modifications may be made, and/or equivalents may be substituted, without departing from the true scope of claimed subject matter. Additionally, many modifications may be made to adapt to a particular situation to the teachings of claimed subject matter without departing from subject matter that is claimed. Therefore, it is intended that the patent not be limited to the particular embodiments disclosed, but that it covers all embodiments falling within the scope of the appended claims.

What is claimed is:

1. An embedded high voltage magnetic device comprising:
   a base substrate defining a first base surface and a second base surface opposite and coplanar with the first base surface, the base substrate capturing a magnetic core between the first base surface and the second base surface;
   a first conductive pattern disposed on at least a portion of the first base surface;
   a second conductive pattern disposed on at least a portion of the second base surface, the first conductive pattern being in operable alignment with the second conductive pattern, wherein the first conductive pattern and the second conductive pattern are coupled in electrical communication to define one or more winding-type electric circuits surrounding the magnetic core to induce a magnetic flux within the magnetic core when the first and second conductive patterns are energized by a voltage source; and
   the base substrate being at least partially covered with a laminate material having a higher breakdown voltage than the base substrate to prevent voltage breakdown between the first and second conductive patterns and the surrounding atmosphere.

2. The embedded high voltage magnetic device of claim 1 wherein the laminate material is formulated using both high voltage and low voltage laminate materials to achieve a specific voltage isolation.

3. The embedded high voltage magnetic device of claim 1 wherein the one or more winding-type electric circuits define a two layer embedded magnetic transformer that is bifilar wound.

4. The embedded high voltage magnetic device of claim 1 wherein the one or more winding-type electric circuits define a two layer embedded magnetic transformer that is sector wound.

5. The embedded high voltage magnetic device of claim 1 wherein the one or more winding-type electric circuits define a four layer embedded magnetic transformer that is bifilar wound.

6. The embedded high voltage magnetic device of claim 1 wherein the one or more winding-type electric circuits define a four layer embedded magnetic transformer that is sector wound.

7. The embedded high voltage magnetic device of claim 1 wherein the laminate material is of a type from the group consisting of: a polyimide cover-lay, a polymer solder mask, and FR-4 laminate.

8. The embedded high voltage magnetic device of claim 1 wherein the first conductive pattern and the second conductive pattern are coupled in electrical communication using via arrays spaced to achieve a specific voltage isolation.

9. The embedded high voltage magnetic device of claim 8 wherein the via arrays are separated by a specific distance to provide a pre-defined voltage isolation between the via arrays.

10. The embedded high voltage magnetic device of claim 1 wherein the first conductive pattern and the second conductive pattern are separated by a pre-defined distance to provide a specific voltage isolation.

11. The embedded high voltage magnetic device of claim 1 wherein the one or more winding-type electric circuits define a four layer embedded magnetic transformer wherein the first conductive pattern is on the first and fourth layer and the second conductive pattern is on the second and third layer.

12. The embedded high voltage magnetic device of claim 1 including a high voltage laminate material layer placed between the first and second conductive patterns to achieve a specific voltage isolation while minimizing the thickness of the embedded high voltage magnetic device.

13. The embedded high voltage magnetic device of claim 1 wherein the magnetic core is a square shaped ferromagnetic core with two window areas.

14. A planar embedded high voltage magnetic device comprising:
   a base substrate defining a first base surface and a second base surface opposite and coplanar with the first base surface, the base substrate being captured within a magnetic core;
   a first conductive pattern disposed on at least a portion of the first base surface;
   a second conductive pattern disposed on at least a portion of the second base surface, the first conductive pattern being in operable alignment with the second conductive pattern, wherein the first conductive pattern and the second conductive pattern are coupled in electrical communication to define one or more winding-type electric circuits to induce a magnetic flux within the magnetic core when the first and second conductive patterns are energized by a voltage source; and
   the first base surface and the second base surface being separated by a laminate material having a higher breakdown voltage than the base substrate to prevent voltage breakdown between the first and second conductive patterns.

15. The planar embedded high voltage magnetic device of claim 14 wherein the laminate material is formulated using both high voltage and low voltage laminate materials to achieve a specific voltage isolation.

16. The planar embedded high voltage magnetic device of claim 14 wherein the one or more winding-type electric circuits define a planer transformer having four or more layers.

17. The planar embedded high voltage magnetic device of claim 14 wherein the laminate material is of a type from the group consisting of: a polyimide cover-lay, a polymer solder mask, and FR-4 laminate.

* * * * *